(12) United States Patent
Valouch et al.

(10) Patent No.: US 10,890,491 B2
(45) Date of Patent: Jan. 12, 2021

(54) OPTICAL DETECTOR FOR AN OPTICAL DETECTION

(71) Applicant: trinamiX GmbH, Ludwigshafen am Rhein (DE)

(72) Inventors: Sebastian Valouch, Ludwigshafen am Rhein (DE); Robert Send, Ludwigshafen am Rhein (DE); Ingmar Bruder, Ludwigshafen am Rhein (DE); Wilfried Hermes, Ludwigshafen am Rhein (DE)

(73) Assignee: trinamiX GmbH, Ludwigshafen am Rhein (DE)

( * ) Notice: Subject to any disclaimer, the term of this patent is extended or adjusted under 35 U.S.C. 154(b) by 0 days.

(21) Appl. No.: 16/344,538

(22) PCT Filed: Oct. 24, 2017

(86) PCT No.: PCT/EP2017/077151
§ 371 (c)(1),
(2) Date: Apr. 24, 2019

(87) PCT Pub. No.: WO2018/077870
PCT Pub. Date: May 3, 2018

(65) Prior Publication Data
US 2019/0277703 A1    Sep. 12, 2019

(30) Foreign Application Priority Data

Oct. 25, 2016 (EP) .................................. 16195456

(51) Int. Cl.
*G01J 5/20* (2006.01)
*G01J 5/08* (2006.01)
(Continued)

(52) U.S. Cl.
CPC ............... *G01J 5/20* (2013.01); *G01J 5/04* (2013.01); *G01J 5/0812* (2013.01);
(Continued)

(58) Field of Classification Search
CPC .......... G01J 3/0291; G01J 3/2803; G01J 3/10; G01J 3/2823; G01J 3/0208; G01J 3/44;
(Continued)

(56) References Cited

U.S. PATENT DOCUMENTS 3,035,176 A    5/1962    Kis et al.
3,112,197 A    11/1963   Neugebauer et al.
(Continued)

FOREIGN PATENT DOCUMENTS

CA    2196563          12/1996
CN    1065054 A        10/1979
(Continued)

OTHER PUBLICATIONS

International Preliminary Report on Patentability and Written Opinion dated Aug. 22, 2019 in PCT/EP2018/053057.
(Continued)

*Primary Examiner* — Irakli Kiknadze
(74) *Attorney, Agent, or Firm* — Oblon, McClelland, Maier & Neustadt, L.L.P.

(57) ABSTRACT

The invention relates to an optical detector (110) for an optical detection, in particular, of radiation within the infrared spectral range, specifically, with regard to sensing at least one optically conceivable property of an object (112). More particular, the optical detector (110) may be used for determining transmissivity, absorption, emission, reflectance, and/or a position of at least one object (112). Further, the invention relates to a method for manufacturing the optical detector (110) and to various uses of the optical
(Continued)

detector (110). The optical detector (110) comprises —an optical filter (114) having at least a first surface (116) and a second surface (118), the second surface (118) being located oppositely with respect to the first surface (116), wherein the optical filter (114) is designed for allowing an incident light beam (120) received by the first surface (116) to pass through the optical filter (114) to the second surface (118), thereby generating a modified light beam (122) by modifying a spectral composition of the incident light beam (120); —a sensor layer (128) comprising a photosensitive material (130) being deposited on the second surface (118) of the optical filter (114), wherein the sensor layer (128) is designed to generate at least one sensor signal in a manner dependent on an illumination of the sensor layer (128) by the modified light beam (122); and —an evaluation device (140) designed to generate at least one item of information provided by the incident light beam (120) by evaluating the sensor signal. The optical detector (110) constitutes an improved simple, cost-efficient and, still, reliable detector for detecting optical radiation, especially within the infrared spectral range, specifically with regard to sensing at least one of transmissivity, absorption, emission and reflectance. Hereby, the optical detector (110) is capable of effectively removing stray light as far as possible.

18 Claims, 3 Drawing Sheets

(51) Int. Cl.
*H01L 31/0203* (2014.01)
*H01L 31/0216* (2014.01)
*H01L 31/0296* (2006.01)
*H01L 31/032* (2006.01)
*H01L 31/09* (2006.01)
*G01J 5/04* (2006.01)
*H01G 9/20* (2006.01)
*H01L 21/02* (2006.01)

(52) U.S. Cl.
CPC ............ *G01J 5/0825* (2013.01); *G01J 5/0831* (2013.01); *H01L 31/0203* (2013.01); *H01L 31/0216* (2013.01); *H01L 31/0296* (2013.01); *H01L 31/02161* (2013.01); *H01L 31/02162* (2013.01); *H01L 31/02165* (2013.01); *H01L 31/02966* (2013.01); *H01L 31/0322* (2013.01); *H01L 31/0324* (2013.01); *H01L 31/0326* (2013.01); *H01L 31/09* (2013.01); *H01G 9/20* (2013.01); *H01L 21/02568* (2013.01)

(58) Field of Classification Search
CPC .......... G01J 3/0264; G01J 3/0272; G01J 3/28; G01J 3/02; G01J 3/0216; G01J 3/0205; G01J 3/0256; G01J 3/36; G01J 2003/1213; G01J 5/10; G01J 3/0289; G01J 3/0275; G01J 3/027; G01J 5/04; G01J 5/08; G01J 1/0488; G01J 1/42; G01J 1/58; G01J 5/0812; G01J 5/0825; G01J 5/0831; G01J 5/20; G01J 1/0437; G01J 4/04; G01J 2003/2806; G01J 3/12; G01J 3/42; H01G 9/20; H01G 9/2059; H01L 21/02568; H01L 31/0203; H01L 31/0216; H01L 31/02162; H01L 31/02165; H01L 31/0296; H01L 31/02966; H01L 31/0322; H01L 31/0324; H01L 31/0326; H01L 27/14621; H01L 27/14649; H01L 27/148; H01L 31/103; H01L 31/1035; H01L 31/1037; H01L 31/18; H01L 31/09; H04N 5/33; A61B 5/0245; A61B 5/04525; A61B 5/117; A61B 5/681; A61B 5/742; G04G 21/08; G04G 9/0064; G01B 11/25; G01N 30/74; G01N 21/31; G01N 21/255; G01N 2201/0221; G01N 21/274; G01N 21/33; G01N 21/47; G01N 27/122; G01N 27/128; G01N 27/4146; G01N 27/4148; G01N 33/0034; G01N 2201/0627; G01N 2021/335; G01N 21/211; G01N 21/55; G01N 21/9501; G01N 21/359; G01N 21/35; G01N 2021/6417; G01N 21/65; G01N 33/02; G01N 15/0227; G01N 15/0612; G01N 15/1434; G01N 15/1463; G01N 15/1475; G01N 1/2273; G01N 2001/2276; G01N 2001/145; G06K 9/741; G06T 2207/10016; G06T 2207/10152; G06T 7/73
USPC .................................. 250/338.4, 343, 338.1
See application file for complete search history.

(56) References Cited

U.S. PATENT DOCUMENTS

| | | |
|---|---|---|
| 3,384,752 A | 5/1968 | Odone |
| 3,562,785 A | 2/1971 | Craig |
| 3,564,268 A | 2/1971 | Bayne et al. |
| 3,873,823 A | 3/1975 | Northrup et al. |
| 3,937,950 A | 2/1976 | Hosoe et al. |
| 3,954,340 A | 5/1976 | Blomqvist et al. |
| 4,023,033 A | 5/1977 | Bricot et al. |
| 4,053,240 A | 10/1977 | Aizawa et al. |
| 4,079,247 A | 3/1978 | Briscot et al. |
| 4,256,513 A | 3/1981 | Yoshida |
| 4,286,035 A | 8/1981 | Nishizima et al. |
| 4,346,293 A | 8/1982 | Fetzer |
| 4,469,945 A | 9/1984 | Hoeberechts et al. |
| 4,524,276 A | 6/1985 | Ohtombe |
| 4,565,761 A | 1/1986 | Katagiri et al. |
| 4,584,704 A | 4/1986 | Ferren |
| 4,593,187 A | 6/1986 | Grotts et al. |
| 4,602,158 A | 7/1986 | Barrett |
| 4,603,258 A | 7/1986 | Sher et al. |
| 4,647,193 A | 3/1987 | Rosenfeld |
| 4,675,535 A | 6/1987 | Tsunekawa et al. |
| 4,694,172 A | 9/1987 | Powell et al. |
| 4,760,004 A | 7/1988 | Rochat et al. |
| 4,760,151 A | 7/1988 | Rochat et al. |
| 4,767,211 A | 8/1988 | Munakata et al. |
| 4,773,751 A | 9/1988 | Matsuda et al. |
| 4,927,721 A | 5/1990 | Gratzel et al. |
| 4,952,472 A | 8/1990 | Baranyi et al. |
| 5,082,363 A | 1/1992 | Nakanishi et al. |
| 5,216,476 A | 6/1993 | Lanckton |
| 5,227,985 A | 7/1993 | Dementhon et al. |
| 5,235,377 A | 8/1993 | Ide et al. |
| 5,291,066 A | 3/1994 | Neugebauer et al. |
| 5,343,291 A | 8/1994 | Ohwada et al. |
| 5,350,644 A | 9/1994 | Graetzel et al. |
| 5,355,241 A | 10/1994 | Kelley |
| 5,375,008 A | 12/1994 | Guerreri |
| 5,512,997 A | 4/1996 | Ogawa |
| 5,576,975 A | 11/1996 | Sasaki et al. |
| 5,581,094 A | 12/1996 | Hara et al. |
| 5,589,928 A | 12/1996 | Babbitt |
| 5,856,844 A | 1/1999 | Batterman et al. |
| 6,061,122 A | 5/2000 | Hoshino et al. |
| 6,163,371 A | 12/2000 | Kato et al. |
| 6,191,881 B1 | 2/2001 | Tajima |
| 6,229,913 B1 | 5/2001 | Nayar et al. |
| 6,266,142 B1 | 7/2001 | Junkins et al. |

(56) References Cited

U.S. PATENT DOCUMENTS

| | | |
|---|---|---|
| 6,359,211 B1 | 3/2002 | Spitler et al. |
| 6,417,836 B1 | 7/2002 | Kumar et al. |
| 6,512,233 B1 | 1/2003 | Sato et al. |
| 6,785,028 B1 | 8/2004 | Atsuumi et al. |
| 6,930,297 B1 | 8/2005 | Nakamura |
| 6,947,459 B2 | 9/2005 | Kurtz et al. |
| 6,995,445 B2 | 2/2006 | Forrest et al. |
| 7,022,966 B2 | 4/2006 | Gonzo et al. |
| 7,049,601 B2 | 5/2006 | Agano |
| 7,196,317 B1 | 3/2007 | Meissner et al. |
| 7,247,851 B2 | 7/2007 | Okada et al. |
| 7,301,608 B1 | 11/2007 | Mendenhall et al. |
| 7,417,716 B2 | 8/2008 | Nagasaka et al. |
| 7,626,569 B2 | 12/2009 | Lanier |
| 7,677,742 B2 | 3/2010 | Hillmer et al. |
| 7,768,498 B2 | 8/2010 | Wey |
| 7,773,070 B2 | 8/2010 | Trisnadi et al. |
| 7,939,932 B2 | 5/2011 | Martin |
| 8,013,901 B2 | 9/2011 | Fukuhara et al. |
| 8,019,166 B2 | 9/2011 | Cheng et al. |
| 8,107,056 B1 | 1/2012 | Riza |
| 8,144,173 B2 | 3/2012 | Baba |
| 8,228,299 B1 | 7/2012 | Maloney et al. |
| 8,231,809 B2 | 7/2012 | Pschirer et al. |
| 8,345,003 B1 | 1/2013 | Trisnadi et al. |
| 8,363,526 B2 | 1/2013 | Hotta et al. |
| 8,390,793 B2 | 3/2013 | Yamaguchi et al. |
| 8,411,289 B2 | 4/2013 | Takahashi |
| 8,477,580 B2 | 7/2013 | Yamamoto et al. |
| 8,563,855 B2 | 10/2013 | Pschirer et al. |
| 8,593,565 B2 | 11/2013 | Shuster |
| 8,902,354 B2 | 12/2014 | Shuster |
| 8,908,157 B2 | 12/2014 | Eisele et al. |
| 9,104,910 B2 | 8/2015 | Huang |
| 9,385,326 B2 | 7/2016 | Wonneberger et al. |
| 9,389,315 B2 | 7/2016 | Bruder et al. |
| 9,428,518 B2 | 8/2016 | Wonneberger et al. |
| 9,557,856 B2 | 1/2017 | Send et al. |
| 9,646,365 B1 | 5/2017 | Hinkel et al. |
| 9,665,182 B2 | 5/2017 | Send et al. |
| 9,741,954 B2 | 8/2017 | Bruder et al. |
| 9,787,899 B1 | 10/2017 | Hinkel et al. |
| 9,829,564 B2 | 11/2017 | Bruder et al. |
| 9,919,999 B2 | 3/2018 | Koenemann et al. |
| 9,958,535 B2 | 5/2018 | Send et al. |
| 9,989,623 B2 | 6/2018 | Send et al. |
| 10,012,532 B2 | 7/2018 | Send et al. |
| 10,094,927 B2 | 10/2018 | Send et al. |
| 10,120,078 B2 | 11/2018 | Bruder et al. |
| 10,290,817 B2 | 5/2019 | Battagliarin et al. |
| 10,412,283 B2 | 9/2019 | Send et al. |
| 2001/0025938 A1 | 10/2001 | Imai |
| 2002/0011576 A1 | 1/2002 | Cho et al. |
| 2003/0017360 A1 | 1/2003 | Tai et al. |
| 2003/0094607 A1 | 5/2003 | Guenther et al. |
| 2003/0128351 A1 | 7/2003 | Schmidt |
| 2003/0132391 A1 | 7/2003 | Agano |
| 2003/0227635 A1 | 12/2003 | Muller |
| 2004/0178325 A1 | 9/2004 | Forrest et al. |
| 2004/0190117 A1 | 9/2004 | Kubaink |
| 2004/0216625 A1 | 11/2004 | Birnstock et al. |
| 2005/0052120 A1 | 3/2005 | Gupta et al. |
| 2005/0061957 A1 | 3/2005 | Kase |
| 2005/0122308 A1 | 6/2005 | Bell et al. |
| 2005/0184301 A1 | 8/2005 | Nagasaka et al. |
| 2005/0217720 A1 | 10/2005 | Rey-Mermet et al. |
| 2005/0227390 A1 | 10/2005 | Shtein et al. |
| 2005/0227406 A1 | 10/2005 | Shtein et al. |
| 2005/0268957 A1 | 12/2005 | Enomoto et al. |
| 2005/0269616 A1 | 12/2005 | Andriessen |
| 2006/0044546 A1 | 3/2006 | Lewin et al. |
| 2006/0049397 A1 | 3/2006 | Pfeiffer et al. |
| 2006/0065833 A1 | 3/2006 | Craig et al. |
| 2006/0075585 A1 | 4/2006 | Krieger et al. |
| 2006/0082546 A1 | 4/2006 | Wey |
| 2007/0008515 A1 | 1/2007 | Otani et al. |
| 2007/0010924 A1 | 1/2007 | Otani et al. |
| 2007/0046625 A1 | 3/2007 | Yee |
| 2007/0080925 A1 | 4/2007 | Radivojevic et al. |
| 2007/0109558 A1 | 5/2007 | Harding |
| 2007/0122927 A1 | 5/2007 | Li et al. |
| 2007/0176165 A1 | 8/2007 | Forrest et al. |
| 2007/0183047 A1 | 8/2007 | Phillips et al. |
| 2007/0206181 A1 | 9/2007 | Arenberg et al. |
| 2008/0013005 A1 | 1/2008 | Deane |
| 2008/0080789 A1 | 4/2008 | Marks |
| 2008/0157965 A1 | 7/2008 | Shahar |
| 2008/0170750 A1 | 7/2008 | Gordon |
| 2008/0259310 A1 | 10/2008 | Wada |
| 2008/0269482 A1 | 10/2008 | Pschirer et al. |
| 2008/0284925 A1 | 11/2008 | Han |
| 2008/0297487 A1 | 12/2008 | Hotelling et al. |
| 2009/0009747 A1 | 1/2009 | Wolf |
| 2009/0046543 A1 | 2/2009 | De Hoog et al. |
| 2009/0097010 A1 | 4/2009 | Yamaguchi |
| 2009/0153841 A1 | 6/2009 | Ophey et al. |
| 2009/0185158 A1 | 7/2009 | Wolf |
| 2009/0188547 A1 | 7/2009 | Hayashi et al. |
| 2009/0225319 A1 | 9/2009 | Lee |
| 2009/0231582 A1 | 9/2009 | Aebischer |
| 2009/0322677 A1 | 12/2009 | Lee et al. |
| 2010/0006761 A1* | 1/2010 | Johnson ............. G01J 5/02 250/343 |
| 2010/0073462 A1 | 3/2010 | Lee et al. |
| 2010/0091263 A1 | 4/2010 | Kumagai et al. |
| 2010/0141927 A1 | 6/2010 | Hashimoto et al. |
| 2010/0141964 A1 | 6/2010 | Horsch et al. |
| 2010/0194942 A1 | 8/2010 | Wada |
| 2010/0231513 A1 | 9/2010 | Deliwala |
| 2010/0258179 A1 | 10/2010 | Wieting |
| 2010/0279458 A1 | 11/2010 | Yeh |
| 2010/0282309 A1 | 11/2010 | Pschirer et al. |
| 2010/0283868 A1 | 11/2010 | Clark et al. |
| 2010/0297405 A1 | 11/2010 | Flores et al. |
| 2011/0032365 A1 | 2/2011 | Yett |
| 2011/0055846 A1 | 3/2011 | Perez et al. |
| 2011/0096319 A1 | 4/2011 | Otani et al. |
| 2011/0099105 A1 | 4/2011 | Mennie et al. |
| 2011/0103215 A1 | 5/2011 | Hotta et al. |
| 2011/0122287 A1 | 5/2011 | Kunishige et al. |
| 2011/0123188 A1 | 5/2011 | Cardwell et al. |
| 2011/0127788 A1 | 6/2011 | Nakanishi |
| 2011/0181553 A1 | 7/2011 | Brown et al. |
| 2011/0194097 A1 | 8/2011 | Yamaguchi et al. |
| 2011/0284756 A1 | 11/2011 | Miko et al. |
| 2011/0286661 A1 | 11/2011 | Lee et al. |
| 2011/0297235 A1 | 12/2011 | Bergmann |
| 2011/0306413 A1 | 12/2011 | Bickerstaff et al. |
| 2011/0317146 A1 | 12/2011 | Gu |
| 2012/0013885 A1 | 1/2012 | Yang et al. |
| 2012/0061587 A1 | 3/2012 | Wu |
| 2012/0062517 A1 | 3/2012 | Lai et al. |
| 2012/0063287 A1 | 3/2012 | Yamamoto et al. |
| 2012/0105690 A1 | 5/2012 | Waqas et al. |
| 2012/0146028 A1 | 6/2012 | Oda et al. |
| 2012/0160298 A1 | 6/2012 | Kanamoto et al. |
| 2012/0162410 A1 | 6/2012 | Vaillant |
| 2012/0206336 A1 | 8/2012 | Bruder |
| 2012/0242867 A1 | 9/2012 | Shuster |
| 2012/0249998 A1 | 10/2012 | Eisele et al. |
| 2012/0250137 A1 | 10/2012 | Maxik et al. |
| 2012/0262365 A1 | 10/2012 | Mallinson |
| 2012/0262696 A1 | 10/2012 | Eisele et al. |
| 2012/0289672 A1 | 11/2012 | Kastler et al. |
| 2012/0293651 A1 | 11/2012 | Kawamata et al. |
| 2012/0320160 A1 | 12/2012 | Drazic |
| 2012/0328906 A1 | 12/2012 | Kwon et al. |
| 2013/0033579 A1 | 2/2013 | Wajs |
| 2013/0076695 A1 | 3/2013 | Gomez et al. |
| 2013/0135604 A1 | 5/2013 | Gogolla et al. |
| 2013/0201492 A1 | 8/2013 | Takahashi |
| 2013/0222551 A1 | 8/2013 | Shamir et al. |
| 2013/0235390 A1 | 9/2013 | Holzapfel et al. |
| 2013/0242283 A1 | 9/2013 | Bailey et al. |

(56) References Cited

U.S. PATENT DOCUMENTS

| | | |
|---|---|---|
| 2013/0266210 A1 | 10/2013 | Morgan-Mar et al. |
| 2013/0271818 A1 | 10/2013 | Maxik et al. |
| 2013/0320302 A1 | 12/2013 | Park et al. |
| 2014/0015242 A1 | 1/2014 | Forrest |
| 2014/0043610 A1 | 2/2014 | Engel et al. |
| 2014/0066656 A1 | 3/2014 | Bruder et al. |
| 2014/0078376 A1 | 3/2014 | Shuster |
| 2014/0124782 A1 | 5/2014 | Jung et al. |
| 2014/0132724 A1 | 5/2014 | Choi et al. |
| 2014/0209789 A1 | 7/2014 | Hu |
| 2014/0211295 A1 | 7/2014 | Maxik et al. |
| 2014/0217329 A1 | 8/2014 | Hayoz et al. |
| 2014/0224989 A1* | 8/2014 | Long .............. G02F 1/0126 250/338.4 |
| 2014/0233028 A1 | 8/2014 | Englund |
| 2014/0291480 A1 | 10/2014 | Bruder et al. |
| 2014/0347442 A1 | 11/2014 | Wang et al. |
| 2014/0368726 A1 | 12/2014 | Gladnick |
| 2015/0029326 A1 | 1/2015 | Backman et al. |
| 2015/0085166 A1 | 3/2015 | Shuster |
| 2015/0111337 A1 | 4/2015 | Welker et al. |
| 2015/0124241 A1 | 5/2015 | Eisele et al. |
| 2015/0124268 A1 | 5/2015 | Bruder et al. |
| 2015/0132887 A1 | 5/2015 | Welker et al. |
| 2015/0170400 A1 | 6/2015 | Seitz et al. |
| 2015/0286340 A1 | 10/2015 | Send et al. |
| 2015/0346911 A1 | 12/2015 | Christiansson |
| 2015/0372046 A1 | 12/2015 | Kim et al. |
| 2016/0099429 A1 | 4/2016 | Bruder et al. |
| 2016/0124074 A1 | 5/2016 | Wonneberger et al. |
| 2016/0127664 A1 | 5/2016 | Bruder et al. |
| 2016/0139243 A1 | 5/2016 | Send et al. |
| 2016/0140786 A1 | 5/2016 | Wang |
| 2016/0155575 A1 | 6/2016 | Yamato et al. |
| 2016/0177177 A1 | 6/2016 | Koenemann et al. |
| 2016/0211464 A1 | 7/2016 | Tanabe et al. |
| 2016/0218302 A1 | 7/2016 | Hermes et al. |
| 2016/0224110 A1 | 8/2016 | Massonneau et al. |
| 2016/0248021 A1 | 8/2016 | Sundarraj et al. |
| 2016/0255323 A1 | 9/2016 | Wajs |
| 2016/0266257 A1 | 9/2016 | Bruder et al. |
| 2016/0286199 A1 | 9/2016 | Wajs et al. |
| 2016/0320489 A1 | 11/2016 | Send et al. |
| 2016/0364015 A1 | 12/2016 | Send et al. |
| 2017/0039793 A1 | 2/2017 | Send et al. |
| 2017/0074652 A1 | 3/2017 | Send et al. |
| 2017/0082426 A1 | 3/2017 | Bruder et al. |
| 2017/0082486 A1 | 3/2017 | Send et al. |
| 2017/0123593 A1 | 5/2017 | Send et al. |
| 2017/0183295 A1 | 6/2017 | Koenemann et al. |
| 2017/0205230 A1 | 7/2017 | Send et al. |
| 2017/0219694 A1 | 8/2017 | Send et al. |
| 2017/0219709 A1 | 8/2017 | Send et al. |
| 2017/0237926 A1 | 8/2017 | Bruder et al. |
| 2017/0250334 A1 | 8/2017 | Hermes et al. |
| 2017/0263868 A1 | 9/2017 | Tanabe et al. |
| 2017/0309828 A1 | 10/2017 | Tanabe et al. |
| 2017/0363465 A1 | 12/2017 | Send et al. |
| 2017/0363741 A1* | 12/2017 | Send .............. H04N 5/335 |
| 2018/0003993 A1 | 1/2018 | Send et al. |
| 2018/0007343 A1* | 1/2018 | Send .............. H04N 13/271 |
| 2018/0017679 A1 | 1/2018 | Valouch et al. |
| 2018/0031672 A1 | 2/2018 | Bruder et al. |
| 2018/0044357 A1 | 2/2018 | Spielmann et al. |
| 2018/0067213 A1 | 3/2018 | Send et al. |
| 2018/0136319 A1 | 5/2018 | Send et al. |
| 2018/0182980 A1 | 6/2018 | Lennartz et al. |
| 2018/0210064 A1 | 7/2018 | Send et al. |
| 2018/0231376 A1 | 8/2018 | Send et al. |
| 2018/0238993 A1 | 8/2018 | Send et al. |
| 2018/0243045 A1 | 8/2018 | Franjic et al. |
| 2018/0249051 A1 | 8/2018 | Send et al. |
| 2018/0276843 A1 | 9/2018 | Send et al. |
| 2018/0329024 A1 | 11/2018 | Send et al. |
| 2018/0356501 A1 | 12/2018 | Send et al. |
| 2019/0129035 A1 | 5/2019 | Valouch et al. |
| 2019/0129036 A1 | 5/2019 | Valouch et al. |
| 2019/0140129 A1 | 5/2019 | Valouch et al. |
| 2019/0157470 A1 | 5/2019 | Send et al. |
| 2019/0170849 A1 | 6/2019 | Hermes et al. |
| 2019/0172964 A1 | 6/2019 | Hermes et al. |
| 2019/0198206 A1 | 6/2019 | Ter Maat et al. |
| 2019/0277703 A1 | 9/2019 | Valouch et al. |
| 2020/0003899 A1 | 1/2020 | Lungenschmied et al. |

FOREIGN PATENT DOCUMENTS

| | | |
|---|---|---|
| CN | 1270706 | 10/2000 |
| CN | 1677053 A | 10/2005 |
| CN | 1723564 A | 1/2006 |
| CN | 1777859 | 5/2006 |
| CN | 1809801 A | 7/2006 |
| CN | 1894978 | 1/2007 |
| CN | 1896686 A | 1/2007 |
| CN | 101129074 | 2/2008 |
| CN | 101290348 A | 10/2008 |
| CN | 101449181 | 6/2009 |
| CN | 101650173 A | 2/2010 |
| CN | 101655350 | 2/2010 |
| CN | 101859439 A | 10/2010 |
| CN | 102096962 | 6/2011 |
| CN | 201897828 | 7/2011 |
| CN | 102435136 | 5/2012 |
| CN | 102506754 A | 6/2012 |
| CN | 102549380 | 7/2012 |
| CN | 102549381 A | 7/2012 |
| CN | 102737435 | 10/2012 |
| CN | 102833569 | 12/2012 |
| CN | 103106411 A | 5/2013 |
| CN | 103322910 A | 9/2013 |
| CN | 103403494 | 11/2013 |
| CN | 103492835 | 1/2014 |
| CN | 103649677 | 3/2014 |
| CN | 103650478 | 3/2014 |
| DE | 2 417 854 | 10/1974 |
| DE | 25 01 124 A1 | 8/1975 |
| DE | 32 25 372 A1 | 2/1983 |
| DE | 42 11 875 | 10/1993 |
| DE | 196 04 856 | 8/1997 |
| DE | 10146752 | 4/2002 |
| DE | 10 2005 043 627 A1 | 3/2007 |
| DE | 10 2005 053 995 | 5/2007 |
| DE | 10 2007 037 875 A1 | 2/2009 |
| DE | 10 2010 042 278 | 4/2012 |
| DE | 20 2612 009 070 | 1/2013 |
| DE | 10 2014 108 3 | 12/2014 |
| EP | 0 112 169 A2 | 6/1984 |
| EP | 0 185 450 A2 | 6/1986 |
| EP | 0 309 631 | 4/1989 |
| EP | 0 754 930 A2 | 1/1997 |
| EP | 1 176 646 A1 | 1/2002 |
| EP | 1 191 819 | 3/2002 |
| EP | 1 330 117 | 7/2003 |
| EP | 1 373 272 | 1/2004 |
| EP | 1 667 246 A1 | 6/2006 |
| EP | 1 832 910 | 9/2007 |
| EP | 1 947 477 | 7/2008 |
| EP | 2 205 657 A1 | 7/2010 |
| EP | 2 220 141 A1 | 8/2010 |
| EP | 2 507 286 A2 | 10/2012 |
| EP | 2 527 866 A1 | 11/2012 |
| EP | 2 725 617 A1 | 4/2014 |
| EP | 2 735 542 | 5/2014 |
| EP | 2 813 324 | 12/2014 |
| EP | 2 818 493 A1 | 12/2014 |
| EP | 15 153 215 | 1/2015 |
| EP | 2 831 180 | 2/2015 |
| EP | 15 157 363 | 3/2015 |
| EP | 15 164 653 | 4/2015 |
| EP | 2 884 303 A1 | 6/2015 |
| EP | 15 177 275 | 7/2015 |
| EP | 15 180 353 | 8/2015 |
| EP | 15 180 354 | 8/2015 |
| EP | 15 185 005 | 9/2015 |

(56) References Cited

FOREIGN PATENT DOCUMENTS

| | | |
|---|---|---|
| EP | 15 191 960 | 10/2015 |
| EP | 15 196 238 | 11/2015 |
| EP | 15 196 239 | 11/2015 |
| EP | 15 197 744 | 12/2015 |
| EP | 15 155 835 | 2/2016 |
| EP | 16 155 834 | 2/2016 |
| EP | 16 155 845 | 2/2016 |
| EP | 3 008 421 | 4/2016 |
| EP | 3 008 757 | 4/2016 |
| EP | 3 036 503 | 6/2016 |
| GB | 2 432 723 | 5/2007 |
| JP | S59-50579 | 3/1984 |
| JP | 59-79805 | 5/1984 |
| JP | 61-89501 | 5/1986 |
| JP | S61-135280 | 6/1986 |
| JP | 61-186804 | 8/1986 |
| JP | 61-245579 | 10/1986 |
| JP | 64-17485 | 1/1989 |
| JP | H02-170004 | 6/1990 |
| JP | 04-240817 | 8/1992 |
| JP | 5-48833 A | 2/1993 |
| JP | 05-240640 | 9/1993 |
| JP | 6-133321 | 5/1994 |
| JP | 7-146113 | 6/1995 |
| JP | 7-318630 | 12/1995 |
| JP | 8-159714 | 6/1996 |
| JP | 8-292586 A | 11/1996 |
| JP | 10-26513 A | 1/1998 |
| JP | 10-221064 | 8/1998 |
| JP | H11-230860 | 8/1999 |
| JP | 11-257917 | 9/1999 |
| JP | 11-325825 | 11/1999 |
| JP | 3110095 | 11/2000 |
| JP | 2001-516150 | 9/2001 |
| JP | 2002-176191 | 6/2002 |
| JP | 2003-307407 | 10/2003 |
| JP | 2004-508691 | 3/2004 |
| JP | 2005-509909 | 4/2005 |
| JP | 2005-189087 | 7/2005 |
| JP | 2005-241340 A | 9/2005 |
| JP | 2005-296268 | 10/2005 |
| JP | 2006-514366 | 4/2006 |
| JP | 2006-337254 | 12/2006 |
| JP | 2007-521559 | 8/2007 |
| JP | 2007-530978 | 11/2007 |
| JP | 2008-522418 | 6/2008 |
| JP | 2008-164538 | 7/2008 |
| JP | 2009-257890 | 11/2009 |
| JP | 2010-081002 | 4/2010 |
| JP | 2010-218770 | 9/2010 |
| JP | 2010-531520 | 9/2010 |
| JP | 2011-503673 | 1/2011 |
| JP | 2011-027707 | 2/2011 |
| JP | 2012-519584 | 8/2012 |
| JP | 2012-522248 | 9/2012 |
| JP | 2012-229964 | 11/2012 |
| JP | 2012-231154 | 11/2012 |
| JP | 2013-051674 | 3/2013 |
| TN | 2011-40111 A | 11/2011 |
| WO | 99-09603 | 2/1999 |
| WO | WO 01/29576 A1 | 4/2001 |
| WO | WO 02/076988 | 10/2002 |
| WO | WO 02/101838 A1 | 12/2002 |
| WO | 03/012371 A1 | 2/2003 |
| WO | WO 03/098617 | 11/2003 |
| WO | WO 2004/072909 | 8/2004 |
| WO | WO 2004/114112 A1 | 12/2004 |
| WO | WO 2005/106965 A1 | 11/2005 |
| WO | WO 2007/006717 | 1/2007 |
| WO | WO 2007/054470 A1 | 5/2007 |
| WO | WO 2008/122531 | 10/2008 |
| WO | WO 2008/145172 | 12/2008 |
| WO | WO 2009/013282 A1 | 1/2009 |
| WO | WO 2009/021859 | 2/2009 |
| WO | WO 2009/053291 A1 | 4/2009 |
| WO | WO 2009/058115 A1 | 5/2009 |
| WO | WO 2009/105801 | 9/2009 |
| WO | WO 2010/088032 A2 | 8/2010 |
| WO | WO 2010/094636 A1 | 8/2010 |
| WO | WO 2010/118409 | 10/2010 |
| WO | WO 2010/118450 | 10/2010 |
| WO | WO 2011/067192 A2 | 6/2011 |
| WO | WO 2011/083722 | 7/2011 |
| WO | WO 2011/091967 A2 | 8/2011 |
| WO | WO 2012/001628 A1 | 1/2012 |
| WO | WO 2012/046181 A1 | 4/2012 |
| WO | WO 2012/049038 A1 | 4/2012 |
| WO | WO 2012/085803 A1 | 6/2012 |
| WO | WO 2012/091814 | 7/2012 |
| WO | WO 2012/110924 A1 | 8/2012 |
| WO | WO 2012/115593 | 8/2012 |
| WO | WO 2012/139354 | 10/2012 |
| WO | 2012/152812 A1 | 11/2012 |
| WO | 2012/168395 A1 | 12/2012 |
| WO | WO 2006/134370 | 12/2012 |
| WO | WO 2013/009676 | 1/2013 |
| WO | WO 2013/090960 | 6/2013 |
| WO | WO 2013/091016 A1 | 6/2013 |
| WO | 2013/118037 A1 | 8/2013 |
| WO | WO 2013/116883 | 8/2013 |
| WO | WO 2013/144177 A1 | 10/2013 |
| WO | WO 2013/156101 A1 | 10/2013 |
| WO | 2013/170982 A1 | 11/2013 |
| WO | 2014/086722 A1 | 6/2014 |
| WO | 2014/097489 A1 | 6/2014 |
| WO | WO 2014/097181 A1 | 6/2014 |
| WO | WO 2014/123522 | 8/2014 |
| WO | 2014/178923 A2 | 11/2014 |
| WO | 2014/198623 A1 | 12/2014 |
| WO | 2014/198625 A1 | 12/2014 |
| WO | 2014/198626 A1 | 12/2014 |
| WO | 2014/198629 A1 | 12/2014 |
| WO | 2015/024871 A1 | 2/2015 |
| WO | WO 2015/081362 | 6/2015 |
| WO | WO 2015/091607 | 6/2015 |
| WO | WO 2015/150989 | 10/2015 |
| WO | WO 2015/159192 | 10/2015 |
| WO | WO 2015/161989 | 10/2015 |
| WO | WO 2015/162528 | 10/2015 |
| WO | WO 2015/176981 | 11/2015 |
| WO | WO 2015/177784 A2 | 11/2015 |
| WO | 2015/193804 A2 | 12/2015 |
| WO | 2016/005893 A1 | 1/2016 |
| WO | WO 2016/012274 | 1/2016 |
| WO | 2016/051323 A1 | 4/2016 |
| WO | WO 2016/066494 | 5/2016 |
| WO | 2016/092449 A1 | 6/2016 |
| WO | 2016/092454 A1 | 6/2016 |
| WO | WO 2016/083914 | 6/2016 |
| WO | WO 2016/120392 | 8/2016 |
| WO | WO 2016/146725 | 9/2016 |
| WO | WO 2017/089553 | 6/2017 |
| WO | WO 2017/144401 | 8/2017 |
| WO | WO 2018/096083 | 5/2018 |
| WO | WO 2018/115073 | 6/2018 |
| WO | WO 2018/146138 | 8/2018 |
| WO | WO 2018/146146 | 8/2018 |
| WO | WO 2018/167215 | 9/2018 |
| WO | WO 2018/193045 | 10/2018 |
| WO | WO 2019/002199 | 1/2019 |
| WO | WO 2019/011803 | 1/2019 |
| WO | WO 2019/038354 | 2/2019 |
| WO | WO 2019/042956 | 3/2019 |
| WO | WO 2019/042959 | 3/2019 |

OTHER PUBLICATIONS

U.S. Appl. No. 16/344,538, filed Apr. 24, 2019, Valouch, et al.
U.S. Appl. No. 16/461,670, filed May 16, 2019, Eberspach, et al.
Ikeoka, et al., "Real-Time Depth Estimation with Wide Detectable Range Using Horizontal Planes of Sharp Focus Proceedings", ACIVS 2011: Advanced Concepts for Intelligent Vision Systems, pp. 669-680 (with English Abstract) (https://link.springer.com/chapter/10.1007/978-3-642-23687-7_60).

(56) References Cited

OTHER PUBLICATIONS

Kurt Konolige et al., "A Low-Cost Laser Distance Sensor", *2008 IEEE International Conference on Robotics and Automation*, Pasadena, CA, May 19-23, 2008.
X. Jiang et al., Dreidimensionales Computersehen, Chapter 2, Springer, Berlin Heidelberg (1997).
U.S. Appl. No. 16/484,369, filed Aug. 7, 2019, Lungenschmied, et al.
U.S. Appl. No. 16/478,907, filed Jul. 18, 2019, Valouch, et al.
U.S. Appl. No. 16/483,231, filed Aug. 2, 2019, Send, et al.
Japanese Office Action dated Nov. 5, 2019, in corresponding Japanese Patent Application No. 2017-558775 w/English translation.
Wikipedia—Printed Circuit Board: https://en.wikipedia.org/wiki/Printed_circuit_board ( 25 pages).
ISO 21348 Definitions of Solar Irradiance Spectral Categories, http://SpaceWx.com.
J. Robertson, "High Dielectric Constant Oxides", *European Physical Journal Applied Physics*, vol. 28, No. 3, pp. 265-291, 2004.
J.A. Kittl et al., "High-k Dielectrics for Future Generation Memory Devices", *Microelectronic Engineering*, Vo. 86 (2009) 1789-1795.
Serap Gilles, et al., "Hybrid Solar Cells", *Inorganica Chimica Acta 361*, (2008), p. 581-588.
Jchn E. Anthony, et al., "n-Type Organic Semiconductors in Organic Electronics", *Adv. Mater.* 2010, 22, pp. 3876-3892.
Tian-yi Li, et al., "Small Molecule Near-Infrared Boron Dipyrromethene Donors for Organic Tandem Solar Cells", *J. Am. Chem. Soc.* 2017, 139, 13636-13639.
Christian Ulrich et al., "Organic Thin-Film Photovoltaic Cells Based on Oligothlophenes with Reduced Bandgap", *Adv. Funct. Mater.* 2007, 17, pp. 2991-2999.
Ronald Gresser, et al., "Synthesis and Characterization of Near-Infrared Absorbing Benzannulated Aza-BODIPY Dyes", *Chem. Eur. J.* 2011, 17, pp. 2939- 2947.
Amaresh Mishra, et al., "Small Molecule Organic Semiconductors on the Move: Promises for Future Solar Energy Technology", *Angew. Chem. Int. Ed.* 2012, 51, 2020-2067.
Huifeng Yao, et al., "Molecular Design of Benzodithiophene-Based Organic Photovoltaic Materials", *Chem. Rev.* 2016, 116, 7397-7457.
Moritz Riede, et al., "Efficient Organic Tandem Solar Cells based on Small Molecules", *Adv. Funct. Mater.* 2011, 21, pp. 3019-3028.
Rico Schueppel, et al., "Controlled Current Matching in Small Molecule Organic Tandem Solar Cells Using Doped Spacer Layers", *J. Appl. Phys.* 107, 044503, 2010.
Jan Meiss et al., "Fluorinated Zinc Phthalocyanine as Donor for Efficient Vacuum-Deposited Organic Solar Cells," *Adv. Funct. Mater.* 2012, 22, pp. 405-414.
Extended Search Report dated Aug. 23, 2011 in Europe Application No. 11154531.5 (With English Translation of Category of Cited Documents).
Erwin Bacher, et al., "Synthesis and Characterization of Photo-Cross-Linkable Hole-Conducting Polymers", Macromolecules, vol. 38, 2005, pp. 1640-1647.
H. Bruce Goodbrand, et al., "Ligand-Accelerated Catalysis of the Ullmann Condensation: Application to Hole Conducting Triarylamines", J. Org. Chem., vol. 64, 1999, pp. 670-674.
Felix E. Goodson, et al., "Palladium-Catalyzed Synthesis of Pure, Regiodefined Polymeric Triarylamines", J. Am. Chem. Soc., vol. 121, 1999, pp. 7527-7539.
John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.
Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.
Ping-Hsin Huang, et al., "Synthesis and Characterization of new fluorescent two-photon absorption chromophores", J. Mater. Chem., vol. 16, 2006, pp. 850-857.

Qinglan Huang, et al., "Molecularly 'Engineered' Anode Adsorbates for Probing OLED Interfacial Structure-Charge Injection/Luminance Relationships: Large, Structure-Dependent Effects", J. Am. Chem. Soc., vol. 125, 2003, pp. 14704-14705.
A. Balionyte, et al., "Carbazolyl-substituted triphenyldiamine derivatives as novel photoconductive amorphous molecular materials", Journal of Photochemistry and Photobiology A: Chemistry, vol. 162, 2004, pp. 249-252.
G. R. A. Kumara, et al., "Fabrication of Dye-Sensitized Solar Cells Using Triethylamine Hydrothiocyanate as a CuI Crystal Growth Inhibitor", Langmuir, vol. 18, 2002, pp. 10493-10495.
Lukas Schmidt-Mende, et al., "Organic Dye for Highly Efficient Solid-State Dye-Sensitized Solar Cells", Adv. Mater., vol. 17, No. 7, 2005, pp. 813-815.
James Lindley, "Copper Assisted Nucleophilic Substitution of Aryl Halogen", Tetrahedron, vol. 40, No. 9, 1984, pp. 1433-1456.
Yunqi Liu, et al., "Synthesis and characterization of a novel bipolar polymer for light-emitting diodes", Chem. Commun., vol. 24, 1998, pp. 2747-2748.
Narukuni Hirata, et al., "Interface engineering for solid-state dye-sensitised nanocrystalline solar cells: the use of an organic redox cascade", Chem. Commun., vol. 5, 2006, pp. 535-537.
Qingjiang Yu, et al., "High-Efficiency Dye-Sensitized Solar Cells: The Influence of Lithium Ions on Exciton Dissociation, Charge Recombination, and Surface States", ACS Nano, vol. 4, No. 10, 2010, pp. 6032-6038.
Bin Peng, et al., "Systematic investigation of the role of compact $TiO_2$ solar cells", Coordination Chemistry Reviews, vol. 248, 2004, pp. 1479-1489.
Jiun Yi Shen, et al., "High $T_g$ blue emitting materials for electroluminescent devices", J. Mater. Chem., vol. 15, 2005, pp. 2455-2463.
Tobat P. I. Saragi, et al., "Comparison of Charge-Carrier Transport in Thin Films of Spiro-Linked Compounds and Their Corresponding Parent Compounds", Adv. Funct, Mater., vol. 16, 2006, pp. 966-974.
V. P. S. Perera, et al., "Dye-Sensitized Solid-State Photovoltaic Cells Based on Dye Multilayer-Semiconductor Nanostructures", J. Phys. Chem. B, vol. 107, 2003, pp. 13758-13761.
U. Bach, et al., "Solid-state dye-sensitized mesoporous $TiO_2$ solar cells with high photon-to-electron conversion efficiencies", Nature, vol. 395, 1998, pp. 583-585.
John P. Wolfe, et al., "Rational Development of Practical Catalysts for Aromatic Carbon-Nitrogen Bond Formation", Acc. Chem. Res. vol. 31, 1998, pp. 805-818.
Bryant H. Yang, et al., "Palladium-Catalyzed amination of aryl halides and sulfonates", Journal of Organometallic Chemistry, vol. 576, 1999, pp. 125-146.
Zhong Hui Li, et al., "Synthesis and Functional Properties of Strongly Luminescent Diphenylamino End-Capped Oligophenylenes", J. Org. Chem., vol. 69, 2004, pp. 921-927.
Brian O'Regan, et al., "A low-cost, high-efficiency solar cell based on dye-sensitized colloidal $TiO_2$ films", Letters to Nature, vol. 353, 1991, pp. 737-740.
International Search Report dated Sep. 24, 2014 in PCT/EP2014/061682.
International Preliminary Report on Patentability and Written Opinion dated Dec. 15, 2015 in PCT/EP2014/061682.
International Preliminary Report on Patentability and Written Opinion dated Dec. 23, 2015 in PCT/EP2014/061695.
International Search Report and Written Opinion dated May 31, 2012 in PCT/IB2012/050592 filed on Feb. 9, 2012.
Supplementary European Search Report dated Nov. 19, 2014, issued in corresponding European Patent Application No. EP 12 74 6808.
Volker Viereck, et al., Large-area applications of optical MEMS: micromirror arrays guide daylight, optimize indoor illumination, Optical Components, Photonik International 2, 2009, pp. 48-49.
C.U. Murade, et al., "High speed adaptive liquid microlens array", Optics Express, vol. 20, No. 16, Jul. 30, 2012, pp. 18180-18187.
Jason Heikenfeld, et al., "Recent Progress in Arrayed Electrowetting Optics", Optics & Photonics News, vol. 20, No. 1, Jan. 1, 2009, pp. 20-26.
Tao Peng, "Algorithms and models for 3-D shape measurement using digital fringe projections", Dissertation, University of Mary-

(56) References Cited

OTHER PUBLICATIONS land (College Park, Md.), Jan. 16, 2007, 268 pages (http://drum.lib.umd.edu//handle/1903/6654; http://en.wikipedia.org/wiki/Gray_code; http://en.wikipedia.org/wiki/Structured-light_3D_scanner).
Jie-Ci Yang et al., "An Intelligent Automated Door Control System Based on a Smart", Sensors, 2013, 13(5), pp. 5923-5936; doi: 10.3390/s130505923 www.mdpi.com/journal/sensors.
Tomas Leijtens, et al., "Hole Transport Materials with Low Glass Transition Temperatures and High Solubility for Application in Solid-State Dye-Sensitized Solar Cells", ACS Nano, vol. 6, No. 2, 2012, pp. 1455-1462 www.acsnano.org.
International Search Report and Written Opinion dated Oct. 31, 2014 in PCT/EP2014/067466 filed Aug. 15, 2014.
Paul Pargas, "Phenomena of Image Sharpness Recognition of CdS and CdSe Photoconductors" Journal of the Optical Society of America, vol. 54, No. 4, Apr. 1964, pp. 516-519.
Paul Pargas, "A Lens Measuring Method Using Photoconductive Cells" Journal of the SMPTE, vol. 74, Jun. 1965, pp. 501-504.
Jack T. Billings, "An Improved Method for Critical Focus of Motion-Picture Optical Printers" Journal of the SMPTE, vol. 80, Aug. 1971, pp. 624-628.
International Search Report dated Sep. 9, 2014 in PCT/EP2014/061688 filed Jun. 5, 2014.
Written Opinion of the International Searching Authority dated Sep. 9, 2014 in PCT/EP2014/061688 filed Jun. 5, 2014.
International Search Report and Written Opinion of the International Searching Authority dated Mar. 12, 2015 in PCT/EP2014/078155 Filed Dec. 17, 2014.
International Search Report and Written Opinion of the International Searching Authority dated May 16, 2014 in PCT/IB2013/061095.
Seigo Ito, et al., "High-Efficiency Organic-Dye-Sensitized Solar Cells Controlled by Nanocrystalline-$TiO_2$ Electrode Thickness", Adv. Mater., vol. 18, 2006, pp. 1202-1205.
Atte Haapalinna, et al., "Measurement of the Absolute Linearity of Photodetectors with a Diode Laser," Meas. Sci. Technol., 10, (1999) 1075-1078.
M. R. Andersen, et al., "Kinect Depth Sensor Evaluation for Computer Vision Applications",Electrical and Computer Engineering, Technical Report ECE-Tr-6, Aarhus University, 2012, 39 pages.
Takumi Kinoshita, et al., "Wideband dye-sensitized solar cells employing a phosphine-coordinated ruthenium sensitizer", Nature Photonics, vol. 7, 2013, pp. 535-239.
Office Action dated Apr. 22, 2015 in Chinese Patent Application No. 201280018328.5 (submitting English translation only).
International Search Report and Written Opinion dated Sep. 3, 2014 in PCT/EP2014/061691.
International Preliminary Report on Patentability dated Sep. 25, 2015 in PCT/EP2014/061691.
Kuthirumal, S., et al., "Flexible Depth of Field Photography," IEEE Transactions on Pattern Analysis and Machine Intelligence, vol. 33, No. 1 (2011), pp. 58-71.
Hiura Shinsaku et al., "Depth Measurement by the Multi-Focus Camera," Computer Vision and Pattern Recognition, 1998. Proceedings. 1998 IEEE Computer Society Conference on Santa Barbara, CA, USA, Jun. 23-25, 1998, pp. 953-959.
International Preliminary Report on Patentability and Written Opinion dated Dec. 23, 2015 in PCT/EP2014/061688.
Denis Klimentjew, et al., "Multi Sensor Fusion of Camera and 3D Laser Range Finder for Object Recognition" 2010 IEEE International Conference on Multisensor Fusion and Integration for Intelligent Systems, 2010, pp. 236-241.
International Search Report and Written Opinion dated Nov. 21, 2014 in PCT/EP2014/067465.
"So funktioniert die DLP-Technologie" DLP-Technologie—www.dlp.com/de/technology/how-dlp-works, 2014, 2 Pages.
"NEW—Ultra-Compact Pockels Cells with Brewster Polarizer and Waveplate for Laser Q-Switching" Leysop Ltd, Manfacturers and Suppliers of Electro-Optic Components—http://www.leysop.com/integrated_pockels_cell.htm, Aug. 4, 2013, 2 Pages.

D. Scaramuzza, et al., "Extrinsic Self Calibration of a Camera and a 3D Laser Range Finder from Natural Scenes" 2007 IEEE/RSJ International Conference on Intelligent Robots and Systems, 2007, (4164-4169) 8 pages.
International Search Report dated Aug. 28, 2015, in PCT/IB2015/052769, filed Apr. 16, 2015.
International Search Report and Written Opinion dated Jun. 30, 2015 in PCT/IB15/052233 Filed Mar. 26, 2015.
International Search Report dated Sep. 22, 2015, in Application No. PCT/IB2015/052785, filed on Apr. 16, 2015.
International Search Report dated Nov. 27, 2015, in PCT/IB2015/055121, filed Jul. 7, 2015.
International Search Report and Written Opinion dated Mar. 29, 2016, in PCT/IB2015/054536, filed Jun. 16, 2015.
International Search Report and Written Opinion dated Jan. 18, 2016 in PCT/IB2015/057412 filed Sep. 28, 2015.
Wang, Feng-Peng et al., "Distance Measurement using Digital Cameras Based on Laser Spot Detection", published on Jun. 30, 2011, School of Physics and Electronic Information, Gannan Normal University, Ganzhou 341000, China (with English Abstract).
Bahaa E. A. Saleh, et al., "Fundamentals of Photonics" John Wiley & Sons, INC., Chapter 3, 1991, pp. 80-107 (with Cover Page).
International Search Report dated Mar. 21, 2016, in PCT/IB2015/059406.
International Search Report and Written Opinion in PCT/IB2015/059411 dated Mar. 16, 2016 filed Dec. 7, 2015.
Nam-Trung Nguyen, "Micro-optofluidic Lenses: A review", Biomicrofluidics, 2010, vol. 4, 031501-15.
Uriel Levy et al., "Tunable optofluidic devices", Microfluid Nanofluid, 2008, vol. 4, pp. 97-105.
International Search Report dated Mar. 22, 2016 in PCT/IB2015/059408 filed Dec. 7, 2015.
International Search Report dated Mar. 15, 2016 in PCT/IB2015/059404 filed Dec. 7, 2015.
International Search Report and Written Opinion dated Mar. 21, 2016, in PCT/IB2015/059403, filed Dec. 7, 2015.
International Preliminary Report and Written Opinion dated Mar. 10, 2016, in PCT/IB2015/059404.
International Search Report and Written Opinion dated May 27, 2016, in PCT/EP2016/051817, filed Jan. 28, 2016.
International Search Report dated May 20, 2016, in PCT/EP2016/054532.
International Preliminary Report on Patentability dated Aug. 1, 2017, in PCT/EP2016/051817.
Linyi Bian, et al., "Recent Progress in the Design of Narrow Bandgap Conjugated Polymers for High-Efficiency Organic Solar Cells", Progress in Polymer Science, vol. 37, 2012, pp. 1292-1331.
Antonio Facchetti, "Polymer donor-polymer acceptor (all-polymer) solar Cells", Materials Today, vol. 16 No. 4, Apr. 2013, pp. 123-132.
Graham H. Carey, et al., "Colloidal Quantum Dot Solar Cells", Chemical Reviews, vol. 115 No. 23, 2015, pp. 12732-12763.
Jason P. Clifford, et al., "Fast, Sensitive and Spectrally Tunable Colloidal Quantum-Dot Photodetectors", Nature Nanotechnology, Jan. 2009, pp. 1-5.
Kotaro Fukushima, et al., "Crystal Structures and Photocarrier Generation of Thioindigo Derivatives", Journal of Physical Chemistry B, vol. 102 No. 31, 1998, pp. 5985-5990.
Serap Günes, et al., "Hybrid Solar Cells", Inorganica Chimica Acta, vol. 361, 2008, pp. 581-588.
R. S. Mane, et al., "Chemical Deposition Method for Metal Chalcogenide Thin Films", Materials Chemistry and Physics, vol. 65, 2000, pp. 1-31.
Wilfried Hermes, "Emerging Thin-Film Photovoltaic Technologies", Chemie Ingenieur Technik, 2015, vol. 87 No. 4, pp. 376-389.
Paul H. Keck, "Photoconductivity in Vacuum Coated Selenium Films", Journal Optical Society of America, vol. 42 No. 4, Apr. 1952, pp. 221-225, with cover page.
Frank H. Moser, et al., "Phthalocyanine Compounds", Reinhold Publishing Corporation, 1963, p. 69-76 with cover pages.
M. Popescu, "Disordered Chalcogenide Optoelectronic Materials: Phenomena and Applications", Journal of Optoelectronics and Advanced Materials, vol. 7 No. 4, Aug. 2005, pp. 2189-2210.

(56) References Cited

OTHER PUBLICATIONS

Friedrich Andreas Sperlich, "Electron Paramagnetic Resonance Spectroscopy of Conjugated Polymers and Fullerenes for Organic Photovoltaics", Julius-Maximilians-Universität Würzburg, 2013, pp. 1-127.

F. Stöckmann, "Superlinear Photoconductivity", Physica Status Solidi, vol. 34, 1969, pp. 751-757.

Evangelos Theocharous, "Absolute Linearity Measurements on a PbS Detector in the Infrared", Applied Optics, vol. 45 No. 11, Apr. 10, 2006, pp. 2381-2386.

Evangelos Theocharous, et al., "Absolute Linearity Measurements on HgCdTe Detectors in the Infrared Region", Applied Optics, vol. 43 No. 21, Jul. 20, 2004, pp. 4182-4188.

Arthur L.Thomas, "Phthalocyanine Research and Applications", CRC Press, 1990, pp. 253-271 with cover pages.

International Search Report and Written Opinion dated Jul. 19, 2016 in PCT/EP2016/058487 filed Apr. 18, 2016.

International Preliminary Report on Patentability and Written Opinion dated Feb. 1, 2018, in PCT/EP2016/066783.

http://www.plenoptic.info/pages/refocusing.html.

C. Hahne, A. Aggoun, S. Haxha, V. Velisavljevic, and J. Fernández, "Light field geometry of a standard plenoptic camera," Opt. Express 22, 26659-26673 (2014).

C. Hahne, A. Aggoun, S. Haxha, V. Velisavljevic, and J. Fernández, "Baseline of virtual cameras acquired by a standard plenoptic camera setup," in 3D-TV-Conference: The True Vision—Capture, Transmission and Display of 3D Video (3DTV-CON), Jul. 2-4, 2014.

C. Hahne, A. Aggoun, and V. Velisavljevic, "The refocusing distance of a standard plenoptic photograph," in 3D-TV-Conference: The True Vision—Capture, Transmission and Display of 3D Video (3DTV-CON), Jul. 8-10, 2015.

C. Hahne and A. Aggoun, "Embedded FIR filter design for real-time refocusing using a standard plenoptic video camera," Proc. SPIE 9023, in Digital Photography X, 902305 (Mar. 7, 2014).

Baeg et al., "Organic Light Detectors: Photodiodes and Phototransistors", *Advanced Materials*, vol. 25, No. 31, Mar. 11, 2013, pp. 4267-4295.

Office Action dated Jan. 3, 2018, in Chinese Patent Application No. 201610552144.7 parallel to U.S. Appl. No. 15/364,680.

International Preliminary Report on Patentability and Written Opinion dated Feb. 22, 2018 in PCT/EP2016/069049).

Office Action dated Mar. 5, 2018, in corresponding Chinese Patent Application No. 201480056299.0.

R. M. Schaffert, "A New High-Sensitivity Organic Photoconductor for Electrophotography", *IBM J. Res. Develop.*, 1971, p. 75-89.

P. Gregory, Ed., *Chemistry and Technology of printing and imaging systems*, Chapman & Hall, 1996, Chap. 4, R.S. Gairns, *Electrophotography*, p. 76-112.

International Search Report and Written Opinion dated Nov. 17, 2016, in PCT/EP2016/071628, filed Sep. 14, 2016.

"Telezentrisches Objektiv" Retrieved from the Internet: https://de.wikipedia.org/wiki/Telezentrisches_Objektiv. Date of retrieval: Sep. 11, 2015, 3 pages. (Cited on p. 53, line No. 40 in the Specification of related case U.S. Appl. No. 15/758,135).

Benjamin F. Grewe, et al., "Fast Two-Layer Two-Photon Imaging of Neuronal Cell Populations Using an Electrically Tunable Lens," *Biomedical Optics Express*, vol. 2, No. 7, Jul. 1, 2011 (pp. 2035-2046).

Petr Bartu et al, "Conformable Large-AreaPposition-Sensitive Photodetectors Based on Luminescence-Collecting Silicone Waveguides," *Journal of Applied Physics*, 107, 123101 (2010).

Roland Stolarski, "Fluorescent Naphthalimide Dyes for Polyester Fibres," *Fibres & Textiles* in Eastern Europe, vol. 17, No. 2 (73) pp. 91-95 (2009).

Ayse Aktas et al., "Synthesis, Characterization, Electrochemical and Spectroelectrochemical Properties of Peripherally Tetra-Substituted Metal-Free and Metallophthalocyanines," *Dyes and Pigments*, 99, (2013) 613-619.

Hairong Li, et al., "Syntheses and Properties of Octa-, Tetra-, and Di-Hydroxy-Substituted Phthalocyanines," *Tetrahedron*, 65 (2009) 3357-3363.

"Methine Dyes and Pigments," *Ullmann's Encyclopedia of Industrial Chemistry*, vol. 23 (2012).

Jing Liu, et al., "Sulfone-Rhodamines: A New Class of Near-Infrared Fluorescent Dyes for Bioimagin," *ACS Applied Materials& Interfaces*, 8, 22953-22962 (2016).

E. Noelting et al., "Berichte der deutschen chemischen Gesellschaft", *Band*, 38, S. 3516-3527 (1905).

T. Nedelcev et al., "Preparation and Characterization of a New Derivative of Rhodamine B with an Alkoxysilane Moiety," *Dyes and Pigments*, 76 (2008), 550-556.

Aurore Loudet et al., "BODIPY Dyes and Their Derivatives: Syntheses and Spectroscopic Properties," *Chem.Rev.*, 107 (2007) 4981-4932.

Weili Zhao, et al., "Conformationally Restricted Aza-Bodipy: A Highly fluorescent, Stable, Near-Infrared-Absorbing Dye", *Angew. Chem. Int. Ed.*, 44 (2005) 1677-1679.

Georg M. Fischer, et al., "Near-Infrared Dyes and Fluorophores Based on Diketopyrrolopyrroles," *Angew. Chem. Int. Ed.* 46 (2007) 3750-3753.

Amaresh Mishra et al., "Small Molecule Organic Semiconductors on the Move: Promises for Future Solar Energy Technology," *Angew. Chem, Int. Ed.*, 51, (2012), 2020-2067.

G. Seybold et al., "New Perylene and Violanthrone Dyestuffs for Fluorescent Collectors," *Dyes and Pigments*, 11 (1989) 303-317.

Nam-Trung Nguyen, "Micro-Optofluidic Lenses: A Review", *Biomicrofluidics*, 4, (2010) 031501.

Uriel Levy et al., "Tunable Optofluidic Devices," *Microfluid Nanofluid* (2008) 4: 97-105.

Robert Koeppe et al., "Video-Speed Detection of the Absolute Position of a Light Point on a Large-Area Photodetector Based on Luminescent Waveguides," *Optics Express*, vol. 18, No. 3, (Feb. 1, 2010), 2209.

Office Action dated Jul. 9, 2018, in Japanese Patent Application No. 2017-007544.

Xing Lin, et al., "Coded focal stack photography", Computational Photography (ICCP), 2013 IEEE International Conference on, Apr. 19, 2013, XP032424246, pp. 1-9.

Nabeel A. Riza, et al., "Noncontact distance sensor using spatial signal processing", Optics Letters, Optical Society of America, vol. 34, No. 4, Feb. 15, 2009, XP001522006, pp. 434-436.

Nabeel A. Riza, et al., "Smart agile lens remote optical sensor for three-dimensional object shape measurements", Applied Optics, Optical Society of America, vol. 49, No. 7, Mar. 1, 2010, XP001552714, pp. 1139-1150.

International Search Report dated Nov. 7, 2017, in corresponding PCT/EP2017/057867.

International Search Report dated Jul. 7, 2017, in corresponding PCT/EP2017/057825.

Street (Ed.): Technology and Applications of Amorphous Silicon, Springer-Verlag Heidelberg, 2010, pp. 346-349.

International Search Report dated Aug. 17, 2017, in corresponding PCT/EP2017/060057.

International Search Report dated Aug. 1, 2017, in corresponding PCT/EP2017/060058.

Walter Fuhs, "Hydrogenated Amorphous Silicon—Material Properties and Device Applications", in S. Baranovski, Charge Transport in Disordered Solids, Wiley, p. 97-147, 2006.

Office Action dated Dec. 18, 2018, in Japanese Patent Application No. 2016-518930.

A.G. Pattantyus-Abraham, I.J. Kramer, A.R. Barkhouse, X. Wang, G. Konstantatos, R. Debnath, L. Levine, I. Raabe, M.K. Nazeeruddin, M. Grätzel, and E.H. Sargent, *Depleted-Heterojunction Colloidal Quantum Dot Solar Cells*, ACS NANO 4 (6), May 24, 2010.

R. Martins and E. Fortunato, *Thin Film Position Sensitive Detectors: from 1D to 3D Applications*, Chap. 8 in R. A. Street (Ed.), *Technology and Applications of Amorphous Silicon*, Springer, 2010.

International Search Report dated Oct. 20, 2017 in PCT/EP2017/068956 filed on Jul. 27, 2017.

(56) References Cited

OTHER PUBLICATIONS

Leskela, M. et al., "Preparation of lead sulfide thin films by the atomic layer epitaxy process," Pergamon Press plc, Vacuum/vol. 41/Nos. 4-6, pp. 1457-1459 (1990).

Dasgupta, N. et al., "Fabrication and Characterization of Lead Sulfide Thin Films by Atomic Layer Deposition," The Electrochemical Society, ECS Transactions, 16 (4) 29-36 (2008), Total 8 pages.

Dasgupta, N. et al., "Design of an atomic layer deposition reactor for hydrogen sulfide compatibility," Review of Scientific Instruments 81, 044102 (2010), Total 6 pages.

Xu, J. et al., "Atomic layer deposition of absorbing thin films on nanostructured electrodes for short-wavelength infrared photosensing," AIP Publishing, Applied Physics Letters 107, 153105 (2015), Total 5 pages.

Blount, G., et al., "Photoconductive properties of chemically deposited PbS with dielectric overcoatings," AIP Publishing, Journal of Applied Physics 46, 3489 (1975), Total 12 pages.

Groner, M. et al., "Low-Temperature Al2O3 Atomic Layer Deposition," American Chemical Society, Chem. Mater., vol. 16, No. 4, 2004, pp. 639-645.

Yoon, W. et al., "Electrical Measurement Under Atmospheric Conditions of PbSe Nanocrystal Thin Films Passivated by Remote Plasma Atomic Layer Deposition of Al2O3," IEEE Transactions on Nanotechnology, vol. 12, No. 2, Mar. 2013, pp. 146-151.

Hu, C., et al., "Air-stable short-wave infrared PbS colloidal quantum dot photoconductors passivated with Al2O3 atomic layer deposition," AIP Publishing, Applied Physics Letters 105, 171110 (2014), Total 5 pages.

Liu, Y., et al., "Robust, Functional Nanocrystal Solids by Infilling with Atomic Layer Deposition," ACS Publications, American Chemical Society, Nano Letters 2011, 11, pp. 5349-5355.

Liu, Y., et al., "PbSe Quantum Dot Field-Effect Transistors with Air-Stable Electron Mobilities above 7 $cm^2$ $V^{-1}$ $S^{-1}$," ACS Publications, American Chemical Society, Nano Letters 2013, 13, pp. 1578-1587.

George, S., "Atomic Layer Deposition: An Overview," American Chemical Society, Chem. Rev. 2010, 110, pp. 111-131.

Konstantatos, G., et al., "Engineering the Temporal Response of Photoconductive Photodetectors via Selective Introduction of Surface Trap States," American Chemical Society, Nano Letters 2008, vol. 8, No. 5, pp. 1446-1450.

Soci, C., et al., "ZnO Nanowire UV Photodetectors with High Internal Gain," American Chemical Society, Nano Letters 2007, vol. 7, No. 4, pp. 1003-1009.

List of integrated circuit packaging types (Wikipedia article, downloaded Jan. 15, 2019 from https://en.wikipedia.org/wiki/List_of_integrated_circuit_packaging_types).

List of integrated circuit packaging types, Dimension Reference (Wikipedia article, downloaded Jan. 15, 2019 from https://en.wikipedia.org/wiki/List_of_integrated_circuit_packaging_types#PIN-PITCH).

*Wikipedia*, Article denoted, "Thermocouple", retrieved Jul. 20, 2016.

Chinese Office Action dated Jan. 29, 2019, in Chinese Patent Application No. 201580036919.9.

Pekkola et al., "Focus-Induced Photoresponse: a novel way to measure distances with photodetectors", *Scientific Reports* (2018) 8:9208, 8 pages.

L. Pintilie, et al., "Field-effect-assisted photoconductivity in PbS films deposited on silicon dioxide", *J. Appl. Phys*. 91, p. 5782, 2002.

International Preliminary Report on Patentability and Written Opinion dated Apr. 30, 2019, in PCT/EP2017/077151.

* cited by examiner

OPTICAL DETECTOR FOR AN OPTICAL DETECTION

FIELD OF THE INVENTION

The invention relates to an optical detector for an optical detection, in particular, of radiation within the infrared spectral range, specifically, with regard to sensing at least one optically conceivable property of an object. More particular, the detector may be used for determining transmissivity, absorption, emission, reflectance, and/or a position of at least one object. Furthermore, the invention relates to a human-machine interface, an entertainment device, a scanning system, a tracking system, a stereoscopic system, and a camera. Further, the invention relates to a method for manufacturing the optical detector and to various uses of the optical detector. Such devices, methods and uses can be employed for example in various areas of daily life, gaming, traffic technology, mapping of spaces, production technology, security technology, medical technology or in the sciences. However, further applications are possible.

PRIOR ART

Optical detectors designed for sensing especially in the infrared spectral range (IR detectors), in particular lead sulfide (PbS) or lead selenide (PbSe) photoconductors, are typically employed in applications where stray light in at least one of the ultraviolet (UV), visible (VIS) or near-infrared (NIR) spectral range has, preferably, to be removed from entering the optical detector, especially, by employing a filter for the desired wavelength(s). For this purpose, packages comprising at least one filter glass are generally used. More particular, so called "TO-packages", i.e. small pin count packages which are typically used for discrete electronic elements, such as transistors or diodes, may, additionally, be furnished with a long pass filter. As generally used, the term "long pass filter" refers to a colored glass filter or an optical interference filter which are designed to attenuate shorter wavelengths and to, concurrently, transmit longer wavelengths, whereby a cut-off wavelength accomplishes filtering of a desired spectral range. For some applications, a multitude of filters may be employed. By way of example, in an application for a moisture measurement of paper four individual filters may be used, wherein a first filter may be adapted for measuring water absorption and a second filter for determining cellulose absorption while the two remaining filters may be employed as reference channels. However, using a multitude of filters can be quite challenging with regard to eliminating cross-talk between the respective detectors.

WO 2016/120392 A1 discloses a longitudinal optical sensor designed to generate at least one sensor signal in a manner dependent on an illumination of the sensor region. According to the so-called "FiP effect", the sensor signal, given the same total power of the illumination, is hereby dependent on a geometry of the illumination, in particular on a beam cross-section of the illumination on the sensor region. Furthermore, an optical detector is disclosed which has at least one evaluation device designated to generate at least one item of geometrical information from the sensor signal, in particular at least one item of geometrical information about the illumination and/or the object. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

U.S. Pat. No. 4,602,158 A discloses providing a silicon (Si) wafer which does not employ individually bonded leads between infrared (IR) sensitive elements and input stages of multiplexers. The wafer is first coated with lead selenide (PbSe) in a first detector array area and, thereafter, with lead sulfide (PbS) within a second detector array area. As a result, the direct chemical deposition of PbSe and PbS upon the Si wafer allows eliminating individual wire bonding, bumping, flip chipping, planar interconnecting methods of connecting detector array elements to Si chip circuitry, e.g., multiplexers, to enable easy fabrication of very long arrays. The electrode structure employed produces an increase in the electrical field gradient between the electrodes for a given volume of detector material, relative to conventional electrode configurations.

L. Pintilie, E. Pentia, I. Matei, I. Pintilie, and E. Ozbay, *Field-effect-assisted photoconductivity in PbS films deposited on silicon dioxide*, J. Appl. Phys. 91, p. 5782, 2002, describes depositing lead sulfide (PbS) thin films from a chemical bath onto $SiO_2$/Si (n-type) substrates. Pseudo metal-oxide-semiconductor devices were obtained by evaporating source and drain gold electrodes on a PbS surface and aluminum gate electrode on a Si substrate. Field-effect-assisted photoconductivity in the PbS layer could be observed at room temperature in the 800-2700-nm wavelength domain for different values and polarities of the drain and gate voltages. The best results were obtained for a positive gate when both semiconductors are in depletion. An enhancement of about 25% of the photoconductive signal could be obtained compared with the case when the gate electrode is absent or is not used.

US 2014/124782 A1 discloses an image sensor having a first layer on a substrate, wherein the first layer comprises a chalcogenide-containing material. The image sensor further has a detection part which is connected to the first layer and being configured to detect a variation in electric characteristics of the first layer. Further, the image sensor comprises an interposition layer which is located between the substrate and the first layer, wherein the interposition layer is in contact with both the substrate and the first layer. In particular, the interposition layer includes a finite impulse response filter. Besides this type of filter, no other filter is used apart from the substrate itself, which may comprise a semiconductor material (e.g., silicon or germanium) and which is placed on a propagation path of the incident light in order to filter the incident light for generating "a more pure infrared light".

US 2006/065833 A1 discloses an infrared detector being responsive up to about 1600 nm. The detector comprises a substrate selected from Si, GaAs, Ge, or a combination thereof, a filtering layer disposed on the substrate, a converting layer disposed on the filtering layer and comprising a radiation upconverting material, and a diverter configured to direct the upconverted radiation to the substrate for generating an electronic signal being proportional to the upconverted radiation. Herein, the filtering layer may comprise a visible light transparent, UV-attenuating material. For this purpose, metal oxides, Ta2O5, SnO2, ZnO, and InSb may, preferably, be used. Alternatively, the filtering layer may be a long pass filter configured for filtering incident radiation below about 1100 nm while wavelengths above about 1100 nm are transmitted. Further, the above-mentioned converting layer may be selected from a large choice of different materials as indicated herein.

WO 2014/12355 A1 discloses a tunable spectrometer and a manufacturing method, wherein the spectrometer comprises an optical filter, a first reflector stack and a second reflector stack separated by a half-wave spacer at least one of which comprises a thermo-optic material, a heater and a heat-sink which are in contact with at least one of the first reflector stack, the second reflector stack and the half-wave spacer, and a detector array. Herein, the optical filter, preferably, is a monochromatic or a narrow band interference filter having a Fabry-Perot cavity.

Despite the advantages as implied by the above-mentioned devices, there still is a need for improvements with respect to a simple, cost-efficient and, still, reliable optical detector, in particular for applications in the infrared spectral range.

Problem Addressed by the Invention

Therefore, a problem addressed by the present invention is that of specifying a device and a method for an optical detection which at least substantially avoids the disadvantages of known devices and methods of this type.

In particular, providing an improved simple, cost-efficient and, still, reliable optical detector for detecting optical radiation, especially within the infrared spectral range, would be desirable, specifically with regard to sensing at least one of transmissivity, absorption, emission and reflectance. Hereby, the optical detector would, preferably, be arranged in a manner to be capable of effectively removing stray light from entering a sensor layer as far as possible.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical detector is disclosed. Herein, the optical detector according to the present invention comprises:

an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;

a sensor layer comprising a photosensitive material being deposited on the second surface of the optical filter, wherein the sensor layer is designed to generate at least one sensor signal in a manner dependent on an illumination of the sensor layer by the modified light beam;

an evaluation device designed to generate at least one item of information provided by the incident light beam by evaluating the sensor signal.

Herein, the listed components may be separate components. Alternatively, two or more of the components may be integrated into one component. Preferably, the evaluation device may be formed as a separate evaluation device independent from the other optical components, but may preferably be connected to the sensor layer in order to receive the sensor signal. However, other kinds of arrangement may be feasible.

As generally used, the term "optical detector" may, particularly, be designed for detecting at least one wavelength in at least a partition of a spectral range, wherein the desired partition of the spectral range may be selected from the ultraviolet (UV) spectral range, the visible (VIS) spectral range and/or the infrared (IR) spectral range. For the optical detector or, simply, the detector according the present invention, the IR range, i.e. the spectral range of 760 nm to 1000 µm, may, especially, be preferred. In a preferred embodiment, the detector according to the present invention may, in particular, be designed for detecting at least one wave-length in at least a partition of the mid infrared (MidIR) spectral range, i.e. the spectral range of 1.5 µm to 15 µm. However, the detector may be adapted to be especially designed for a wavelength range spanning an at least partially different spectral range.

According to the present invention, the detector comprises an optical filter. As generally used, the term "optical filter" refers to an optical element being designed for allowing an incident light beam to pass through the optical element, whereby the light beam is, generally, modified by changing a spectral composition of the incident light beam. As used herein, the term "changing a spectral composition" refers to modifying a transmission vs. wavelength relationship of the incident light beam by using the optical filter, thus, generating a modified light beam having a different transmission vs. wavelength relationship compared to the incident light beam.

In particular, the optical filter may, especially, be designed to attenuate partition of the spectral composition of the incident light beam. Herein, the optical filter may, preferably, be selected from a long pass filter. However, other kinds of optical filters may also be feasible, in particular a short pass filter, a band pass filter, a monochromatic filter, a photographic filter, a polarization filter, or a band rejection filter. As generally used, the term "long pass filter" relates to an optical element which is designed to generate the modified light beam by attenuating a first wavelength range below a cut-off wavelength and, concurrently, by transmitting a second wavelength range above the cut-off wavelength, wherein the term "cut-off wavelength", usually, refers to a wavelength at which 50% of a peak transmission occurs. As a result, the long pass filter is adapted to attenuate the shorter wavelengths below the cut-off wavelength whereas it allows the longer wavelengths above the cut-off wavelength to pass the respective optical element without or with only a minimal attenuation. Similarly, the short pass filter is designed to generate the modified light beam by attenuating the second wavelength range above the cut-off wavelength and, concurrently, by transmitting the first wavelength range below the cut-off wavelength. Further, the band pass filter is designed to transmit a band of wavelengths between two cut-off wavelengths while attenuating outside the band. In particular, a monochromatic filter is a band pass filter designed to transmit a particularly small band of wavelengths between two cut-off wavelengths, such as a band of less than 50 nm or less than 10 nm, while attenuating outside the band. Similarly, the band rejection filter is designed to attenuate in the band while transmitting outside the band. Further, a photographic filter is a filter known from the field of photography being adapted for attenuating a larger part of a band of wavelength such as a neutral density filter, a graduated neutral density filter, a polarizing filter, a color correction filter, a graduated color filter, a contrast enhancement filter, a color subtraction filter, a color conversion filter, a diffusion filter, a softening filter, or the like. However, other kinds of optical filters may still be feasible.

Since the detector according to the present invention may, as mentioned above, preferably be used for detecting in the IR spectral range, i.e. from 760 nm to 1000 µm, and, especially, in the MidIR spectral range, i.e. from 1.5 µm to 15 µm, the cut-off wavelength of the optical filter, in particular of the long pass filter, may be selected from a wavelength in the near infrared spectral (NIR) range, i.e. the spectral range of 760 nm to 1.5 µm, or, alternatively, the MidIR spectral range, i.e. from 1.5 µm to 15 µm, wherein the NIR spectral range may, particularly, be preferred, thus, allowing the detection over a partition of the NIR spectral range and the complete MidIR spectral range.

Herein, the optical element as employed for the optical filter may comprise a single optical component or, in an alternative embodiment, a combination of selected optical components adapted for accomplishing the purpose of modifying the transmission vs. wavelength relationship of an incident light beam. In particular, the optical filter, especially the long pass filter, may, thus, be selected from a stained glass filter or an optical interference filter. In a particular embodiment of the present invention, the optical filter may, thus, be adapted for modifying a propagation direction the incident light beam in order to furnish the modified light beam with a different propagation direction with respect to the incident light beam. In other words: The optical element may, thus, be adapted for modifying an angle of the light beam passing through a suitable optical element, whereby a value for the angle may be determined with respect to an arbitrary direction. For this purpose, the optical element may be or comprise a respective modifying mechanism as a whole, such as a prism or a tilted surface, or locally, such by employing micro lenses, micro grooves, a diffuser, or a beam shaper. Alternatively or in addition, modifying at least one type of polarization of the light beam passing through the optical filter may be feasible by using a suitable optical element, such as a quarter wave plate, a polarizer, or a crossed polarizer. Alternatively or in addition, the wavelength and/or the direction of propagation of the light may be modified by employing one or more non-linear optical effects, such a non-linear optical effect which may cause upconversion or downconversion, such as fluorescent phosphors, a fluorescent light concentrator, or upconversion phosphors. However, further embodiments may also be feasible.

As generally used, the terms "stained glass filter" or "stained polymer filter" refers to a kind specific kind of optical filters having an optically transparent substrate which comprises, preferably in a homogenous distribution over the substrate, an absorptive substance, in particular an organic or inorganic material such as a dye, pigment, salt, or the like, which together with the substrate exhibits the desired transmission vs. wavelength relationship. In general, the substrate may exhibit a high transmission over a broad spectral range while the absorptive substance may be used for defining the one or more cut-off-wavelengths, especially for the long pass filter. Thus, it may be feasible to provide a range of different long pass filters by using the same substrate along with a range of different dyes. The optically transparent substrate may be selected from a glass, a polymer, a silicone, a crystalline material, or the like. As a non-limiting example for stained glass filters, lead glass, cobalt glass, milk glass, uranium glass, or the like.

In contrast hereto, the terms "interference filter", "reflective filter", "thin-film filter", or "dichroic filter" refer to an optical element being designed to reflect one or more first spectral lines or first spectral bands and to transmit second spectral lines or second spectral bands. For this purpose, at least two layers each comprising a dielectric material having a specific thickness and a specific refractive index are deposited on a substrate. As a result, interfaces between the layers having different refractive indices generate reflections, by which some wavelengths are selectively reinforced, thus, providing the desired spectral band. Interference filters may also be realized as Fabry-Perot interferometers, dichroic glass filters, or Lyot filters. Further, the term "interference filter" may also refer to metal mesh filters.

Thus, in a preferred embodiment, the optical filter may comprise an electrically insulating substrate or, in an alternative embodiment, a semiconducting substrate. Herein, the substrate may comprise a material selected from glass, quartz, silicon (Si), silicone, a transparent organic polymer, a crystalline salt, such as potassium bromide (KBr), or a transparent conducting oxide (TCO), preferably selected from the group consisting of aluminum oxide ($Al_2O_3$), titanium oxide ($TiO_2$), indium tin oxide (ITO), fluorine doped tin oxide (SnO2:F; FTO), aluminum doped zinc oxide (AZO), magnesium oxide (MgO), or a perovskite transparent conducting oxide. However, other kinds of substrates may be feasible.

Thus, the optical filter as used herein has a first surface and a second surface, wherein the second surface is located oppositely with respect to the first surface. For the purposes of the present invention, the "first surface" of the optical filter is designed for received an incident light beam which may pass through the optical filter to the "second surface", whereby the modified light beam is generated by changing the transmission vs. wavelength relationship of the incident light beam according to a spectral characteristic of the optical filter. In general, at least one of, preferably both, the first surface and the second surface of the optical filter may be a flat surface having a planar area adapted for receiving the incident light beam.

In an alternative embodiment, at least one of the first surface or the second surface of the optical filter may be a curved surface, wherein the term "curved surface" refers to the area adapted for passing a light beam as long as its characteristics may deviate from being a flat plane. In particular, the optical filter may, thus, selected from a group consisting of a biconvex lense, a plano-convex lense, a biconcave lense, a plano-concave lens, and a meniscus lens. Herein, the curved surface may, especially, be designed to be able to correct any aberrations the light beam may experience along its path through the detector.

Further according to the present invention, the detector comprises a sensor layer comprising at least one photosensitive material, wherein the sensor layer may function as a sensor region of the detector. As used herein, the "sensor region" is considered as a partition of the detector being designed to receive the illumination of the detector by the light beam, wherein the illumination in a manner as received by the sensor region may trigger the generation of the at least one sensor signal, wherein the generation of the sensor signal may be governed by a defined relationship between the sensor signal and the manner of the illumination of the sensor region.

The sensor signal may generally be an arbitrary signal indicative of a desired optical property to be measured, in particular a transmissivity, absorption, emission and reflectance of an incident light beam, or a position of an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

In a preferred embodiment, the photosensitive material used in the sensor layer may be selected from a group consisting of dye solar cells, photoconductive materials, and quantum dots, wherein the photoconductive materials are particularly preferred.

For further details with regard to the dye solar cells, reference may be made to WO 2012/110924 A1 and WO 2014/097181 A1. As used herein, the term "photoconductive material", refers, in particular based on WO 2016/120392 A1, to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. Thus, the photoconductive material may, preferably, comprise an inorganic photoconductive material, in particular, a thin film semiconductor or a nanoparticulate photoconductive material; an organic photoconductive material, in particular an organic semiconductor; a combination, a solid solution, and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary CdTe may be solved in ZnTe leading to $Cd_{1-x}Zn_xTe$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state. By way of example, a pure silicon crystal may be doped with one or more of boron, aluminum, gallium, indium, phosphorous, arsenic, antimony, germanium, or other atoms, particularly, in order to modify the chemical and/or physical properties of the silicon crystal.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide. However, other inorganic photoconductive materials may equally be appropriate.

As mentioned above, the chalcogenide, may preferably be selected from a group comprising sulfide chalcogenides, selenide chalcogenides, telluride chalcogenides, ternary chalcogenides, quaternary and higher chalcogenides, may preferably be appropriate to be used for the sensor layer. As generally used, the term "chalcogenide" refers to a compound which may comprise a group 16 element of the periodic table apart from an oxide, i.e. a sulfide, a selenide, and a telluride. In particular, the photoconductive material may be or comprise a sulfide chalcogenide, preferably lead sulfide (PbS), a selenide chalcogenide, preferably lead selenide (PbSe), a telluride chalcogenide, preferably, cadmium telluride (CdTe), or a ternary chalcogenide is, preferably mercury zinc telluride (HgZnTe; MZT). Since at least the mentioned preferred photoconductive materials are, generally, known to exhibit a distinctive absorption characteristic within the infrared spectral range, the sensor layer which comprises one of the mentioned photoconductive materials may, preferably, be used as an infrared sensor. However, other embodiments and/or other photoconductive materials, in particular, the photoconductive materials as described below, may also be feasible.

In particular, the sulfide chalcogenide may be selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_{253}$), copper sulfide (CuS or $Cu_2S$), cobalt sulfide (CoS), nickel sulfide (NiS), molybdenum disulfide ($MoS_2$), iron disulfide ($FeS_2$), and chromium trisulfide ($CrS_3$).

In particular, the selenide chalcogenide may be selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe or $Cu_2Se$), molybdenum diselenide ($MoSe_2$), tin selenide (SnSe), and cobalt selenide (CoSe), and indium selenide ($In_2Se_3$). Further, solid solutions and/or doped variants of the mentioned compounds or of other compounds of this kind may also be feasible.

In particular, the telluride chalcogenide may be selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), and indium telluride ($In_2Te_3$). Further, solid solutions and/or doped variants of the mentioned compounds or of other compounds of this kind may also be feasible.

In particular, the ternary chalcogenide may be selected from a group comprising mercury cadmium telluride (HgCdTe; MCT), mercury zinc telluride (HgZnTe), mercury cadmium sulfide (HgCdS), lead cadmium sulfide (PbCdS), lead mercury sulfide (PbHgS), copper indium disulfide ($CuInS_2$; CIS), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), cadmium selenite ($CdSeO_3$), cadmium zinc telluride (CdZnTe), and cadmium zinc selenide (CdZnSe), further combinations by applying compounds from the above listed binary chalcogenides and/or binary III-V-compounds as listed below. Further, solid solutions and/or doped variants of the mentioned compounds or of other compounds of this kind may also be feasible.

With regard to quaternary and higher chalcogenides, this kind of material may be selected from a quaternary and higher chalcogenide which may be known to exhibit suitable photoconductive properties. In particular, a compound having a composition of $Cu(In, Ga)S/Se_2$ or of $Cu_2ZnSn(S/Se)_4$ may be feasible for this purpose.

With regard to the III-V compound, this kind of semiconducting material may be selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb). Further, solid solutions and/or doped variants of the mentioned compounds or of other compounds of this kind may also be feasible.

With regard to the II-VI compound, this kind of semiconducting material may be selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe). However, other II-VI compounds may be feasible. Further, solid solutions of the mentioned compounds or of other compounds of this kind may also be applicable.

With regard to the metal oxides, this kind of semiconducting material may be selected from a known metal oxide which may exhibit photoconductive properties, particularly from the group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), ferrite ($Fe_3O_4$), and perovskite oxides ($ABO_3$, wherein A is a divalent cation, and B a tetravalent cation). In addition, ternary, quarternary or higher metal oxides may also be applicable. Furthermore, solid solutions and/or doped variants of the mentioned compounds or of other compounds of this kind, which could be stoichiometric compounds or off-stoichiometric compounds, may also be feasible. As explained later in more detail, it may be preferable to select a metal oxide which might, simultaneously, also exhibit transparent or translucent properties.

With regard to a group IV element or compound, this kind of semiconducting material may be selected from a group comprising doped diamond (C), doped silicon (Si), silicon carbide (SiC), and silicon germanium (SiGe), wherein the semiconducting material may be selected from a crystalline material, a microcrystalline material, or, preferably, from an amorphous material. As generally used, the term "amorphous" refers to a non-crystalline allotropic phase of the semiconducting material. In particular, the photoconductive material may comprise at least one hydrogenated amorphous semiconducting material, wherein the amorphous material has, in addition, been passivated by applying hydrogen to the material, whereby, without wishing to be bound by theory, a number of dangling bonds within the material appear to have been reduced by several orders of magnitude. In particular, the hydrogenated amorphous semiconducting material may be selected from a group consisting of hydrogenated amorphous silicon (a-Si:H), a hydrogenated amorphous silicon carbon alloy (a-SiC:H), or a hydrogenated amorphous germanium silicon alloy (a-GeSi:H). However, other kinds of materials, such as hydrogenated microcrystalline silicon (µc-Si:H), may also be used for these purposes.

Alternatively or in addition, the organic photoconductive material may, in particular, be or comprise an organic compound, in particular an organic compound which may be known to comprise appropriate photoconductive properties, preferably polyvinylcarbazole, a compound which is generally used in xerography. However, a large number of other organic molecules which are described in WO 2016/120392 A1 in more detail may also be feasible.

In a further preferred embodiment, the photoconductive material may be provided in form of a colloidal film which may comprise quantum dots. This particular state of the photoconductive material which may exhibit slightly or significantly modified chemical and/or physical properties with respect to a homogeneous layer of the same material may, thus, also be denoted as colloidal quantum dots (CQD). As used herein, the term "quantum dots" refers to a state of the photoconductive material in which the photoconductive material may comprise electrically conducting particles, such as electrons or holes, which are confined in all three spatial dimensions to a small volume that is usually denominated as a "dot".

Herein, the quantum dots may exhibit a size which can, for simplicity, be considered as diameter of a sphere that might approximate the mentioned volume of the particles. In this preferred embodiment, the quantum dots of the photoconductive material may, in particular, exhibit a size from 1 nm to 100 nm, preferably from 2 nm to 100 nm, more preferred from 2 nm to 15 nm, provided that the quantum dots actually comprised in a specific thin film may exhibit a size being below the thickness of the specific thin film. In practice, the quantum dots may comprise nanometer-scale semiconductor crystals which might be capped with surfactant molecules and dispersed in a solution in order to form the colloidal film. Herein, the surfactant molecules may be selected to allow determining an average distance between the individual quantum dots within the colloidal film, in particular, as a result from approximate spatial extensions of the selected surfactant molecules. Further, depending on the synthesis of ligands, quantum dots may exhibit hydrophilic or hydrophobic properties. The CQD can be produced by applying a gas-phase, a liquid-phase, or a solid-phase approach. Hereby, various ways for a synthesis of the CQD are possible, in particular by employing known processes such as thermal spraying, colloidal synthesis, or plasma synthesis. However, other production processes may also be feasible.

Further in this preferred embodiment, the photoconductive material used for the quantum dots may, preferably, be selected from one of the photoconductive materials as mentioned above, more particular, from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), a perovskite structure materials $ABC_3$, wherein A denotes an alkaline metal or an organic cation, B=Pb, Sn, or Cu, and C a halide, and copper zinc tin sulfide (CZTS). Further, solid solutions and/or doped variants of the mentioned compounds or of other compounds of this kind may also be feasible. Core shell structures of the materials of this kind of materials may also be feasible. However, kinds of other photoconductive materials may also be feasible.

Herein, the layer of the photosensitive material, in particular of the photoconductive material, may be manufactured by applying at least one deposition method which may be selected from the group consisting of: chemical bath deposition, vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques. As a result, the layer of the photosensitive material, in particular of the photoconductive material, may exhibit a thickness in the range 10 nm to 100 μm, preferably from 100 nm to 10 μm, in particular from 300 nm to 5 μm.

In a particularly preferred embodiment, the sensor layer may be directly or indirectly applied to the second surface of the optical filter, especially, in a manner that no gap may be left nor generated between the optical filter and the sensor layer. As a result, the sensor layer may, preferably, be exactly one continuous sensor layer.

In a particular embodiment, the detector according to the present invention may, in addition, comprise an interlayer which may be located between the optical filter and the sensor layer. As generally used, the term "interlayer" refers to an additional layer which may be placed between two individual layers which adjoin two opposite surfaces of the interlayer. Herein, the interlayer may, especially, be applied in a manner that no gap may be left nor generated, on one hand, between the optical filter and the interlayer and, on the other hand, between the interlayer and the sensor layer. Again, the interlayer layer may, preferably, be exactly one continuous layer which may be placed adjacently with respect to the sensor layer.

Applying the additional interlayer may be of particular interest in a particular embodiment, in which the optical filter may be or comprise a semiconducting substrate. As a result, the semiconductor substrate as used for the optical filter could itself be used as an optical sensor being capable of providing a sensor signal to be evaluated, such as by the evaluation device.

In a preferred embodiment, a tandem sensor may be provided, the tandem sensor having a first optical sensor constituted by the sensor layer and a second optical sensor constituted by the semiconducting substrate of the optical filter. In this preferred embodiment, the interlayer may be or comprise a thick insulating layer which may, in particular, be designed in a manner that the first optical sensor and the second optical sensor may be operable separately. For this purpose, the thick insulating layer may exhibit a thickness being selected in order to impede an interaction between the first optical sensor and the second optical sensor, in particular, by avoiding an occurrence of an electrical field effect between the first optical sensor and the second optical sensor. Depending on the material selected for the interlayer, the thickness of the thick insulating layer may, thus, be 100 nm to 10 μm, more preferred of 250 nm to 5 μm. Preferably, the thick insulating layer may comprise one or more of silicon dioxide ($SiO_2$), silicon nitride ($Si_3N_4$), alumina ($Al_2O_3$), zirconia ($ZrO_2$), hafnium oxide ($HfO_2$), mixtures and/or laminates thereof. High-k dielectrics having a high dielectric constant are preferred to allow providing thick layers while maintaining high electrical fields. The insulating layer can be deposited via various methods, in particular, selected from atomic layer deposition (ALD), physical vapor deposition (PVD), or plasma enhanced chemical vapor deposition (PECVD).

In an alternative embodiment, the thickness of the interlayer may be selected in a manner that an interaction between the sensor layer and the semiconducting substrate of the optical filter may occur, in particular, by enabling an occurrence of a pronounced electrical field effect between the sensor layer and the semiconducting substrate of the optical filter via the interlayer, thus, providing a field-effect phototransistor. As generally used, the "field-effect phototransistor" may be a transistor which employs an electrical field in order to control an electrical conductivity of the interlayer having or comprising the sensor layer acting as a channel. Herein, the interlayer may, preferably, exhibit a high dielectric constant and a high breakdown voltage, thus, allowing exerting a high electric field onto the sensor layer and the semiconducting substrate of the optical filter. Depending on the material selected for the interlayer, the thickness of the thin insulating layer may only be 1 nm to 250 nm, preferably only 5 nm to 10 nm. Preferably, the thin insulating layer may comprise one or more of silicon dioxide ($SiO_2$), silicon nitride ($Si_3N_4$), alumina ($Al_2O_3$), zirconia ($ZrO_2$), hafnium oxide ($HfO_2$), mixtures and/or laminates thereof. High-k dielectrics having a high dielectric constant are preferred to allow providing thin layers while maintaining high electrical fields. The insulating layer can be deposited via various methods, in particular, selected from atomic layer deposition (ALD), physical vapor deposition (PVD), or plasma enhanced chemical vapor deposition (PECVD).

In further embodiments, the interlayer may, alternatively or in addition, exhibit one or more chemical or physical properties which may prove to be advantageous for the optical sensor. Thus, in a preferred embodiment, the interlayer may have adhesive properties, in particular, by being or comprising an adhesive layer being adapted for coating the sensor layer on the optical filter, such as a hydrophilic or hydrophobic layer. In a further preferred embodiment, the interlayer may have anti-reflective optical properties, in particular, by being adapted for reducing a difference in refractive index between the optical filter and the sensor layer by being or comprising an optically anti-reflective layer. Further properties may also be conceivable.

Further according to the present invention, the detector comprises an evaluation device designed to generate at least one item of information provided by the incident light beam by evaluating the sensor signal. As used herein, the term "evaluation device" generally refers to an arbitrary device designed to generate the items of information. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. Further, the evaluation device may comprise one or more data storage devices. Further, as outlined above, the evaluation device may comprise one or more interfaces, such as one or more wireless interfaces and/or one or more wire-bound interfaces.

The at least one evaluation device may be adapted to perform at least one computer program, such as at least one computer program performing or supporting the step of generating the items of information. As an example, one or more algorithms may be implemented which, by using the sensor signals as input variables, may perform a predetermined transformation into the position of the object.

The evaluation device may particularly comprise at least one data processing device, in particular an electronic data processing device, which can be designed to generate the items of information by evaluating the sensor signals. Thus, the evaluation device is designed to use the sensor signals as input variables and to generate the items of information provided by the incident light beam by processing these input variables. The processing can be done in parallel, subsequently or even in a combined manner. The evaluation device may use an arbitrary process for generating these items of information, such as by calculation and/or using at least one stored and/or known relationship. Besides the sensor signals, one or a plurality of further parameters and/or items of information can influence said relationship, for example at least one item of information about a modulation frequency. The relationship can be determined or determinable empirically, analytically or else semi-empirically. Particularly preferably, the relationship comprises at least one calibration curve, at least one set of calibration curves, at least one function or a combination of the possibilities mentioned. One or a plurality of calibration curves can be stored for example in the form of a set of values and the associated function values thereof, for example in a data storage device and/or a table. Alternatively or additionally, however, the at least one calibration curve can also be stored for example in parameterized form and/or as a functional equation. Separate relationships for processing the sensor signals into the items of information may be used. Alternatively, at least one combined relationship for processing the sensor signals is feasible. Various possibilities are conceivable and can also be combined.

By way of example, the evaluation device can be designed in terms of programming for the purpose of determining the items of information. The evaluation device can comprise in particular at least one computer, for example at least one microcomputer. Furthermore, the evaluation device can comprise one or a plurality of volatile or nonvolatile data memories. As an alternative or in addition to a data processing device, in particular at least one computer, the evaluation device can comprise one or a plurality of further electronic components which are designed for determining the items of information, for example an electronic table and in particular at least one look-up table and/or at least one application-specific integrated circuit (ASIC), and/or at least one digital signal processor (DSP), and/or at least one field programmable gate array (FPGA).

The detector has at least one evaluation device. In particular, the at least one evaluation device can also be designed to completely or partly control or drive the detector, for example by the evaluation device being designed to control at least one illumination source and/or to control at least one modulation device of the detector. The evaluation device can be designed, in particular, to carry out at least one measurement cycle in which one or a plurality of sensor signals, such as a plurality of sensor signals, are picked up, for example a plurality of sensor signals of successively at different modulation frequencies of the illumination.

The evaluation device is designed, as described above, to generate at least one item of information provided by the incident light beam by evaluating the at least one sensor signal. In a particular embodiment, said item of information may comprise at least one item of information on a longitudinal position of the object and/or, if applicable, on a transversal position of the object. The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. Said position of the object can be static or may even comprise at least one movement of the object, for example a relative movement between the detector or parts thereof and the object or parts thereof. In this case, a relative movement can generally comprise at least one linear movement and/or at least one rotational movement. Items of movement information can for example also be obtained by comparison of at least two items of information picked up at different times, such that for example at least one item of location information can also comprise at least one item of velocity information and/or at least one item of acceleration information, for example at least one item of information about at least one relative velocity between the object or parts thereof and the detector or parts thereof. In particular, the at least one item of location information can generally be selected from: an item of information about a distance between the object or parts thereof and the detector or parts thereof, in particular an optical path length; an item of information about a distance or an optical distance between the object or parts thereof and the optional transfer device or parts thereof; an item of information about a positioning of the object or parts thereof relative to the detector or parts thereof; an item of information about an orientation of the object and/or parts thereof relative to the detector or parts thereof; an item of information about a relative movement between the object or parts thereof and the detector or parts thereof; an item of information about a two-dimensional or three-dimensional spatial configuration of the object or of parts thereof, in particular a geometry or form of the object. Generally, the at least one item of location information can therefore be selected for example from the group consisting of: an item of information about at least one location of the object or at least one part thereof; information about at least one orientation of the object or a part thereof; an item of information about a geometry or form of the object or of a part thereof, an item of information about a velocity of the object or of a part thereof, an item of information about an acceleration of the object or of a part thereof, an item of information about a presence or absence of the object or of a part thereof in a visual range of the detector.

The at least one item of location information can be specified for example in at least one coordinate system, for example a coordinate system in which the detector or parts thereof rest. Alternatively or additionally, the location information can also simply comprise for example a distance between the detector or parts thereof and the object or parts thereof. Combinations of the possibilities mentioned are also conceivable.

In a particularly preferred embodiment of the present invention, the detector may further comprise at least two individual electrical contacts which are adapted to contact the sensor layer. As used herein, the term "contacting the sensor layer" refers to an electrically conductive connection between the respective contact and the sensor layer which may be arranged in a manner that each of the electrical contacts may be placed on a location at a surface of the sensor layer. For this purpose, the at least individual two electrical contacts may be applied at different locations of the layer of the photoconductive material, especially, in a manner that at least two of the individual electrical contacts are electrically isolated with respect to each other. Herein, each of the at least two electrical contacts may, preferably, be arranged in a manner that a direct electrical contact between the respective electrode and the sensor layer may be achieved, particularly in order to acquire the sensor signal with as little loss as possible, such as due to additional resistances in a transport path between the sensor layer and the evaluation device. In an alternative embodiment, the sensor layer may be arranged in a setup which may allow transmitting the sensor signal contactless to the evaluation device.

Consequently, upon impingement of the sensor region by the light beam the at least two electrical contacts may provide the sensor signal which depends on the electrical conductivity of the photoconductive material to the evaluation device. Herein, the electrical contacts may comprise an evaporated metal layer which may easily be provided by known evaporation techniques. In particular, the evaporated metal layer may comprise one or more of silver, aluminum, platinum, magnesium, chromium, titanium, or gold. Alternatively, at least one of the electrical contacts may comprise a layer of graphene.

In this kind of material, the electrical current may be guided via at least one first electrical contact through the material to at least one second electrical contact, wherein the first electrical contact may be isolated from the second electrical contact while both the first electrical contact and the second electrical contact may be in direct connection with the material. For this purpose, the direct connection may be provided by any known measure known from the state of the art, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

As mentioned above, in the particular embodiment in which the substrate used for the optical filter comprises a semiconducting substrate, at least two further individual electrical contacts can be provided which may contact the semiconducting substrate being designed as the second optical sensor. Herein, the at least two further individual electrical contacts may, preferably, comprise an evaporated metal layer, in particular selected from at least one of Au, Pt, Pd, W. In an alternative embodiment, also the second optical sensor may be arranged in a setup which may allow transmitting a sensor signal generated by the second optical sensor contactless to the evaluation device.

In a further, particularly preferred embodiment of the present invention, the detector may, additionally, comprise a cover layer. Herein, the cover layer may be deposited on the sensor layer, preferably, in a manner that it may directly contact the sensor layer. In a preferred embodiment, the cover layer may be deposited on the layer in a fashion that it may fully cover an accessible surface of the sensor layer. Preferably, the cover layer may be an amorphous layer comprising at least one metal-containing compound. However, other kinds of cover layers may also be feasible.

Preferably, at least one deposition method may be used for depositing the cover layer on the sensor layer. For this purpose, the at least one deposition method may, in particular, be selected from an atomic layer deposition, a chemical vapor deposition, a plasma-enhanced chemical vapor deposition, a physical vapor deposition, a sol-gel deposition, or a combination thereof. Consequently, the cover layer may be or comprise an atomic deposition layer, a chemical vapor deposition layer, or a physical vapor deposition layer, or a sol-gel deposition layer, or a plasma-enhanced chemical vapor deposition layer. Additional alternatives for the cover layer may comprise an epoxy resin layer or a glass layer. Herein, the term "atomic layer deposition", the equivalent terms "atomic layer epitaxy" or "molecular layer deposition" as well as their respective abbreviations "ALD, "ALE" or "MLD" are, generally, used for referring to a deposition process which may comprise a self-limiting process step and a subsequent self-limiting re-action step. Hence, the process which is applied in accordance with the present invention may also be referred to as an "ALD process". For further details referring to the ALD process, reference may be made to by George, Chem. Rev., 110, p. 111-131, 2010. Further, the term "chemical vapor deposition", usually abbreviated to "CVD" refers to a method in which a surface of a substrate or a layer located on a substrate may be exposed to at least one volatile precursor, wherein the precursor may react and/or decompose on the surface in order to generate a desired deposit. In a frequent case, possible by-products may be removed by applying a gas flow above the surface. Alternatively, a PECVD process may, preferably, be applicable as the deposition process, in particular, for obtaining a film of silicon nitride ($Si_3N_4$). Herein, the term "PECVD process" refers to a specific CVD process in which the precursors may be provided as a plasma, such as by application of a discharge in a reaction chamber.

As mentioned above, the cover layer may, preferentially, comprise at least one metal-containing compound. Herein, the metal-containing compound may, preferably, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, and Bi. In a specific embodiment, the metal-containing compound may, alternatively, comprise a semimetal, which may also be denominated as a "metalloid", wherein the semimetal may be selected from the group consisting of B, Ge, As, Sb, and Te. Preferably, the at least one metal-containing compound may be selected from the group consisting of Al, Ti, Ta, Mn, Mo, Zr, Hf, and W.

Herein, the at least one metal-containing compound may, preferably, be selected from the group comprising an oxide, a hydroxide, a chalcogenide, a pnictide, a carbide, or a combination thereof. As already defined above, the term "chalcogenide" refers to a compound which may comprise a group 16 element of the periodic table apart from an oxide, i.e. a sulfide, a selenide, and a telluride. In a similar fashion, the term "pnictide" refers to a, preferably binary, compound which may comprise a group 15 element of the periodic table, i.e. a nitride, a phosphide, arsenide and an antimonide. As described below in more detail, the metal-containing compound may, preferably, comprise at least one oxide, at least one hydroxide, or a combination thereof, preferably of Al, Ti, Zr, or Hf.

In an alternative embodiment, the cover layer may be or comprise a laminate which may have at least two adjacent layers, wherein the adjacent layers may, in particular, differ by their respective composition in a manner that one, both, some, or all of the adjacent layers may comprise one of the metal-containing compounds. Herein, the adjacent layers may comprise two different metal-containing compounds, such as described above, providing an amorphous structure. By way of example, the cover layer may comprise alternating adjacent layers of an Al-containing compound and of a Zr- or Hf-containing compound. However, other combinations of metal-containing compounds may also be possible. In addition, the laminate may further comprise additional adjacent layers which may not have any one of the metal-containing compounds as described elsewhere in this application but may rather be or comprise at least one of a metallic compound, a polymeric compound, a silicone compound, or a glass compound. Herein, other kinds of materials may also be feasible. As a result, the laminate may comprise additional adjacent layers that may be amorphous but which may, alternatively, also be or comprise crystalline or nanocrystalline layers.

In a particular preferred embodiment, the cover layer may fully cover the accessible surface of the sensor layer. Thus, the cover layer may, in a first regard, be adapted for providing an encapsulation for the sensor layer. As used herein the term "encapsulation" may refer to a package, preferably, an hermetic package, especially, in order to avoid as far as possible a partial or full degradation of the sensor layer or a partition thereof, in particular, by external influence, such as by humidity and/or by oxygen comprised in a surrounding atmosphere. Herein, the package may, preferably, be adapted to cover all accessible surfaces of the sensor layer, wherein it may be taken into account that the sensor layer may be deposited on a substrate which may already be adapted to protect a partition of the surfaces of the sensor layer. In other words, the substrate and the cover layer may be adapted in a fashion that they can cooperate in order to accomplish a packaging, preferably a hermetic packaging, of the sensor layer.

In a particularly preferred embodiment, the cover layer may exhibit a thickness of 10 nm to 600 nm, preferably of 20 nm to 200 nm, more preferred of 40 nm to 100 nm, most preferred of 50 to 75 nm. This thickness may, particularly, reflect the amount of metal-containing compounds within the cover layer that may be advantageous to achieve the function of providing encapsulation for the sensor layer. Herein, the cover layer may be a conformal layer with respect to the adjacent surface of the sensor layer. As generally used, the thickness of the conformal layer may, thus, follow the corresponding surface of the sensor layer within a deviation of ±50 nm, preferably of ±20 nm, mostly preferred of ±10 nm, wherein the deviation may occur over at least for at least 90%, preferably for at least 95%, mostly preferred for at least 99%, of a surface of the cover layer, hereby leaving aside any contamination or imperfection that may be present on the surface of the cover layer.

Further, the cover layer may be adapted to exhibit at least one further function in addition to the function of providing encapsulation. By way of example, the cover layer may exhibit a high refractive index, such as at least 1.2, preferably at least 1.5, in order to qualify as a suitable anti-reflective layer. As a result, it may be advantageous to select the material as used for the cover layer to be, preferably, optically transparent within the desired wavelength range, in particular, by exhibiting a suitable absorption characteristic. On the other hand, since the substrate is already at least partially transparent, a larger variety of different materials, including optically intransparent materials, may be employed for the cover layer. Further examples may include a second optical filter, a scratch-resistant layer, a hydrophilic layer, a hydrophobic layer, a self-cleaning layer, an anti-fog layer, and a conductive layer. Other functions may also be possible.

In particular, the cover layer which may comprise a property of a second optical filter can be designed for filtering the same wavelength range as the optical filter or for filtering a different wavelength range as compared to the optical filter. In this regard, it may also be possible to use a cover layer being or comprising a laminate. In particular, a stack employing at least two different kinds of metal oxides can be used as an interference filter. By way of example, a stack comprising aluminum oxide ($Al_2O_3$) and titanium oxide ($TiO_2$) alternatively stacked on top of each other may well be suited for such a purpose.

Further, it may be feasible to provide an optical element which may be designed for alternatively supplying the incident light beam to the optical filter and to the second optical filter, thus allowing the incident light beam alternatively impinging the sensor layer through the optical filter and the second optical filter. In this particular embodiment, the modified light beam illuminating the sensor layer through the optical filter may be designated as a "measuring beam", while the modified light beam illuminating the sensor layer through the second optical filter may be designed as a "reference beam", or vice-versa. Particularly preferred, the evaluation device may, in this embodiment, further be designed for comparing the sensor signals as generated by the measuring beam and the reference beam for refined evaluation purposes. By way of example, it may be possible to arrange properties of the measuring beam and the reference beam in a manner that they can be canceled out directly within the sensor layer, thus, allowing using methods adapted to amplify only a difference signal between the measuring beam and the reference beam, such as a lock-in technique.

In a particular embodiment, particularly in a case in which it might not be appropriate to provide the cover layer with the desired further function or in which an extent of the further function as provided by the selected cover layer may not be sufficient, the cover layer may, additionally, at least partially be covered by at least one additional layer at least partially deposited on the cover layer. Preferably, the additional layer may be or exhibit the further function and may, thus, comprise at least one of an anti-reflective layer, a second optical filter, a scratch-resistant layer, a hydrophilic layer, a hydrophobic layer, a self-cleaning layer, an anti-fog layer, or a conductive layer. Herein, the person skilled in the art may be easily capable of selecting and providing the at least one additional layer. However, other embodiments may also be possible.

In a preferred embodiment, the cover layer may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover layer. In a particular embodiment, an adhesive layer may be provided at the electrical contacts, wherein the adhesive layer may, especially, be adapted for bonding. For this purpose, the adhesive layer may comprise at least one of Ni, Cr, Ti or Pd.

According to the present invention, the detector may, preferably, be designed for detecting electromagnetic radiation over a considerably wide spectral range, wherein the ultraviolet (UV), visible, near infrared (NIR), and the infrared (IR) spectral ranges are particularly preferred. Herein, the following photoconductive materials may, especially, be selected for the sensor layer within the detector:

for the UV spectral range: doped diamond (C), zinc oxide (ZnO), titanium oxide ($TiO_2$), gallium nitride (GaN), gallium phosphide (GaP) or silicon carbide (SiC);

for the visible spectral range: silicon (Si), gallium arsenide (GaAs), cadmium sulfide (CdS), cadmium telluride (CdTe), copper indium sulfide ($CuInS_2$; CIS), copper indium gallium selenide (CIGS), copper zinc tin sulfide (CZTS);

for the NIR spectral range: indium gallium arsenide (InGaAs), silicon (Si), germanium (Ge), cadmium telluride (CdTe), copper indium sulfide ($CuInS_2$; CIS), copper indium gallium selenide (CIGS), copper zinc tin sulfide (CZTS), wherein CdTe, CIS, CIGS, and CZTS are particularly preferred for wavelengths above 850 nm;

for IR spectral range: indium gallium arsenide (InGaAs) for wavelengths up to 2.6 µm; indium arsenide (InAs) for wavelengths up to 3.1 µm; lead sulfide (PbS) for wavelengths up to 3.5 µm; lead selenide (PbSe) for wavelengths up to 5 µm; indium antimonide (InSb) for wavelengths up to 5.5 µm; and mercury cadmium telluride (MCT, HgCdTe) for wavelengths up 16 µm.

As already mentioned above, the detector for optical detection generally is a device which may be adapted for providing at least one item of information on the position of the at least one object. The detector may be a stationary device or a mobile device. Further, the detector may be a stand-alone device or may form part of another device, such as a computer, a vehicle or any other device. Further, the detector may be a hand-held device. Other embodiments of the detector are feasible.

As used herein, the position generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. As will be outlined in further detail below, the detector may have an optical axis, which may constitute a main direction of view of the detector. The optical axis may form an axis of the coordinate system, such as a z-axis. Further, one or more additional axes may be provided, preferably perpendicular to the z-axis.

Thus, as an example, the detector may constitute a coordinate system in which the optical axis forms the z-axis and in which, additionally, an x-axis and a y-axis may be provided which are perpendicular to the z-axis and which are perpendicular to each other. As an example, the detector and/or a part of the detector may rest at a specific point in this coordinate system, such as at the origin of this coordinate system. In this coordinate system, a direction parallel or antiparallel to the z-axis may be regarded as a longitudinal direction, and a coordinate along the z-axis may be considered a longitudinal coordinate. An arbitrary direction perpendicular to the longitudinal direction may be considered a transversal direction, and an x- and/or y-coordinate may be considered a transversal coordinate.

Alternatively, other types of coordinate systems may be used. Thus, as an example, a polar coordinate system may be used in which the optical axis forms a z-axis and in which a distance from the z-axis and a polar angle may be used as additional coordinates. Again, a direction parallel or antiparallel to the z-axis may be considered a longitudinal direction, and a coordinate along the z-axis may be considered a longitudinal coordinate. Any direction perpendicular to the z-axis may be considered a transversal direction, and the polar coordinate and/or the polar angle may be considered a transversal coordinate.

The detector may, especially, be adapted to provide the at least one item of information on the position of the at least one object in any feasible way. Thus, the information may e.g. be provided electronically, visually, acoustically or in any arbitrary combination thereof. The information may further be stored in a data storage of the detector or a separate device and/or may be provided via at least one interface, such as a wireless interface and/or a wire-bound interface.

In a particularly preferred embodiment, the detector may be or comprise a longitudinal optical sensor. As used herein, the "longitudinal optical sensor" is generally a device which is designed to generate at least one longitudinal sensor signal in a manner dependent on an illumination of the sensor region by the light beam, wherein the longitudinal sensor signal, given the same total power of the illumination, is dependent, according to the so-called "FiP effect" on a beam cross-section of the light beam in the sensor region. The longitudinal sensor signal may generally be an arbitrary signal indicative of the longitudinal position, which may also be denoted as a depth. As an example, the longitudinal sensor signal may be or may comprise a digital and/or an analog signal. As an example, the longitudinal sensor signal may be or may comprise a voltage signal and/or a current signal. Additionally or alternatively, the longitudinal sensor signal may be or may comprise digital data. The longitudinal sensor signal may comprise a single signal value and/or a series of signal values. The longitudinal sensor signal may further comprise an arbitrary signal which is derived by combining two or more individual signals, such as by averaging two or more signals and/or by forming a quotient of two or more signals. For potential embodiments of the longitudinal optical sensor and the longitudinal sensor signal, reference may be made to WO 2012/110924 A1 and WO 2014/097181 A1.

Further, the sensor region of the longitudinal optical sensor may be illuminated by at the least one light beam. Given the same total power of the illumination, the electrical conductivity of the sensor region may, therefore, depend on the beam cross-section of the light beam in the sensor region, be denominated as a "spot size" generated by the incident beam within the sensor region. Thus, the observable property that the electrical conductivity of the photoconductive material depends on an extent of the illumination of the sensor region comprising the photoconductive material by an incident light beam particularly accomplishes that two light beams comprising the same total power but generating different spot sizes on the sensor region provide different values for the electrical conductivity of the photoconductive material in the sensor region and are, consequently, distinguishable with respect to each other.

Further, since the longitudinal sensor signal may be determined by applying an electrical signal, such as a voltage signal and/or a current signal, the electrical conductivity of the material traversed by the electrical signal may, therefore, be taken into account when determining the longitudinal sensor signal. In addition, a bias voltage source and a load resistor employed in series with the longitudinal optical sensor may, preferably, be used here. As a result, the longitudinal optical sensor may, thus, principally allow determining the beam cross-section of the light beam in the sensor region from a recording of the longitudinal sensor signal, such as by comparing at least two longitudinal sensor signals, at least one item of information on the beam cross-section, specifically on the beam diameter. Further, since the beam cross-section of the light beam in the sensor region, according to the above-mentioned FiP effect, given the same total power of the illumination, depends on the longitudinal position or depth of an object which emits or reflects the light beam which impinges on the sensor region, the longitudinal optical sensor may, therefore, be applied to determining a longitudinal position of the respective object.

As already known from WO 2012/110924 A1, the longitudinal optical sensor is designed to generate at least one longitudinal sensor signal in a manner dependent on an illumination of the sensor region, wherein the sensor signal, given the same total power of the illumination depends on a beam cross-section of the illumination on the sensor region. As an example, a measurement of a photocurrent I as a function of a position of a lens is provided there, wherein the lens is configured for focusing electromagnetic radiation onto the sensor region of the longitudinal optical sensor. During the measurement, the lens is displaced relative to the longitudinal optical sensor in a direction perpendicular to the sensor region in a manner that, as a result, the diameter of the light spot on the sensor region changes. In this particular example in which a photovoltaic device, in particular, a dye solar cell, is employed as the material in the sensor region, the signal of the longitudinal optical sensor, in this case a photocurrent, clearly depends on the geometry of the illumination such that, outside a maximum at the focus of the lens, the photocurrent falls to less than 10% of its maximum value.

As outlined above, the at least one longitudinal sensor signal, given the same total power of the illumination by the light beam, is, according to the FiP effect, dependent on a beam cross-section of the light beam in the sensor region of the at least one longitudinal optical sensor. As used herein, the term "beam cross-section" generally refers to a lateral extension of the light beam or a light spot generated by the light beam at a specific location. In case a circular light spot is generated, a radius, a diameter or a Gaussian beam waist or twice the Gaussian beam waist may function as a measure of the beam cross-section. In case non-circular light-spots are generated, the cross-section may be determined in any other feasible way, such as by determining the cross-section of a circle having the same area as the non-circular light spot, which is also referred to as the equivalent beam cross-section. In this regard, it may be possible to employ the observation of an extremum, i.e. a maximum or a minimum, of the longitudinal sensor signal, in particular a global extremum, under a condition in which the corresponding material, such as a photovoltaic material, may be impinged by a light beam with the smallest possible cross-section, such as when the material may be located at or near a focal point as affected by an optical lens. In case the extremum is a maximum, this observation may be denominated as the positive FiP-effect, while in case the extremum is a minimum, this observation may be denominated as the negative FiP-effect.

Thus, irrespective of the photosensitive material actually comprised in the sensor region but given the same total power of the illumination of the sensor region by the light beam, a light beam having a first beam diameter or beam cross-section may generate a first longitudinal sensor signal, whereas a light beam having a second beam diameter or beam-cross section being different from the first beam diameter or beam cross-section generates a second longitudinal sensor signal being different from the first longitudinal sensor signal. Thus, by comparing the longitudinal sensor signals, at least one item of information on the beam cross-section, specifically on the beam diameter, may be generated. For details of this effect, reference may be made to WO 2012/110924 A1. Accordingly, the longitudinal sensor signals generated by the longitudinal optical sensors may be compared, in order to gain information on the total power and/or intensity of the light beam and/or in order to normalize the longitudinal sensor signals and/or the at least one item of information on the longitudinal position of the object for the total power and/or total intensity of the light beam. Thus, as an example, a maximum value of the longitudinal optical sensor signals may be detected, and all longitudinal sensor signals may be divided by this maximum value, thereby generating normalized longitudinal optical sensor signals, which, then, may be transformed by using the above-mentioned known relationship, into the at least one item of longitudinal information on the object. Other ways of normalization are feasible, such as a normalization using a mean value of the longitudinal sensor signals and dividing all longitudinal sensor signals by the mean value. Other options are possible. Each of these options may be appropriate to render the transformation independent from the total power and/or intensity of the light beam. In addition, information on the total power and/or intensity of the light beam might, thus, be generated.

Specifically in case one or more beam properties of the light beam propagating from the object to the detector are known, the at least one item of information on the longitudinal position of the object may thus be derived from a known relationship between the at least one longitudinal sensor signal and a longitudinal position of the object. The known relationship may be stored in the evaluation device as an algorithm and/or as one or more calibration curves. As an example, specifically for Gaussian beams, a relationship between a beam diameter or beam waist and a position of the object may easily be derived by using the Gaussian relationship between the beam waist and a longitudinal coordinate.

This embodiment may, particularly, be used by the evaluation device in order to resolve an ambiguity in the known relationship between a beam cross-section of the light beam and the longitudinal position of the object. Thus, even if the beam properties of the light beam propagating from the object to the detector are known fully or partially, it is known that, in many beams, the beam cross-section narrows before reaching a focal point and, afterwards, widens again. Thus, before and after the focal point in which the light beam has the narrowest beam cross-section, positions along the axis of propagation of the light beam occur in which the light beam has the same cross-section. Thus, as an example, at a distance z0 before and after the focal point, the cross-section of the light beam is identical. Thus, in case only one longitudinal optical sensor with a specific spectral sensitivity is used, a specific cross-section of the light beam might be determined, in case the overall power or intensity of the light beam is known. By using this information, the distance z0 of the respective longitudinal optical sensor from the focal point might be determined. However, in order to determine whether the respective longitudinal optical sensor is located before or behind the focal point, additional information is required, such as a history of movement of the object and/or the detector and/or information on whether the detector is located before or behind the focal point. In typical situations, this additional information may not be provided. Therefore, additional information may be gained in order to resolve the above-mentioned ambiguity. Thus, in case the evaluation device, by evaluating the longitudinal sensor signals, recognizes that the beam cross-section of the light beam on a first longitudinal optical sensor is larger than the beam cross-section of the light beam on a second longitudinal optical sensor, wherein the second longitudinal optical sensor is located behind the first longitudinal optical sensor, the evaluation device may determine that the light beam is still narrowing and that the location of the first longitudinal optical sensor is situated before the focal point of the light beam. Contrarily, in case the beam cross-section of the light beam on the first longitudinal optical sensor is smaller than the beam cross-section of the light beam on the second longitudinal optical sensor, the evaluation device may determine that the light beam is widening and that the location of the second longitudinal optical sensor is situated behind the focal point. Thus, generally, the evaluation device may be adapted to recognize whether the light beam widens or narrows, by comparing the longitudinal sensor signals of different longitudinal sensors.

For further details with regard to determining the at least one item of information on the longitudinal position of the object by employing the evaluation device according to the present invention, reference may made to the description in WO 2014/097181 A1. Thus, generally, the evaluation device may be adapted to compare the beam cross-section and/or the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

In addition to the at least one longitudinal coordinate of the object, at least one transversal coordinate of the object may be determined. Thus, generally, the evaluation device may further be adapted to determine at least one transversal coordinate of the object by determining a position of the light beam on the at least one transversal optical sensor, which may be a pixelated, a segmented or a large-area transversal optical sensor, as further outlined also in WO 2014/097181 A1.

Alternatively or in addition, the detector according to the present invention may, thus, be or comprise a transversal optical sensor. As used herein, the term "transversal optical sensor" generally refers to a device which is adapted to determine a transversal position of at least one light beam traveling from the object to the detector. With regard to the term "position", reference may be made to the definition above. Thus, preferably, the transversal position may be or may comprise at least one coordinate in at least one dimension perpendicular to an optical axis of the detector. As an example, the transversal position may be a position of a light spot generated by the light beam in a plane perpendicular to the optical axis, such as on a light-sensitive sensor surface of the transversal optical sensor. By way of example, the position in the plane may be given in Cartesian coordinates and/or polar coordinates. Other embodiments are feasible. For potential embodiments of the transversal optical sensor, reference may be made to WO 2014/097181 A1. However, other embodiments are feasible.

The transversal optical sensor may provide at least one transversal sensor signal. Herein, the transversal sensor signal may generally be an arbitrary signal indicative of the transversal position. As an example, the transversal sensor signal may be or may comprise a digital and/or an analog signal. As an example, the transversal sensor signal may be or may comprise a voltage signal and/or a current signal. Additionally or alternatively, the transversal sensor signal may be or may comprise digital data. The transversal sensor signal may comprise a single signal value and/or a series of signal values. The transversal sensor signal may further comprise an arbitrary signal which may be derived by combining two or more individual signals, such as by averaging two or more signals and/or by forming a quotient of two or more signals.

In a first embodiment as disclosed in WO 2014/097181 A1, the transversal optical sensor may be a photo detector having at least one first electrode, at least one second electrode and at least one photovoltaic material, wherein the photovoltaic material may be embedded in between the first electrode and the second electrode. Thus, the transversal optical sensor may be or may comprise one or more photo detectors, such as one or more organic photodetectors and, most preferably, one or more dye-sensitized organic solar cells (DSCs, also referred to as dye solar cells), such as one or more solid dye-sensitized organic solar cells (s-DSCs). Thus, the detector may comprise one or more DSCs (such as one or more sDSCs) acting as the at least one transversal optical sensor and one or more DSCs (such as one or more sDSCs) acting as the at least one longitudinal optical sensor.

In further embodiment as disclosed in WO 2016/120392 A1, the transversal optical sensor may comprise a layer of the photoconductive material, preferably an inorganic photoconductive material, such as one of the photoconductive materials as mentioned above and/or below. Preferably, the layer of the photoconductive material may directly or indirectly be applied to at least one substrate which, in particular, comprises a transparent conducting oxide, preferably indium tin oxide (ITO), fluorine doped tin oxide (SnO2:F; FTO), or magnesium oxide (MgO), or a perovskite transparent conductive oxide, such as $SrVO_3$, or $CaVO_3$, or, alternatively, metal nanowires, in particular Ag nanowires. However, other materials may also be feasible, in particular according to the desired transparent spectral range. In a particular embodiment, an interlayer comprising an insulating, a semiconductive or an electrically conducting material may, additionally, been applied.

As mentioned above, at least two electrodes may be present for recording the transversal optical signal. In a preferred embodiment, the at least two electrodes may actually be arranged in the form of at least two physical electrodes, preferably, exhibiting a form of a T-shape, wherein each physical electrode may comprise an electrically conducting material. In the embodiment of the transversal optical sensor, at least one of the electrodes of the transversal optical sensor may, preferably, be a split electrode having at least two partial electrodes, wherein the transversal optical sensor may have a sensor area, wherein the at least one transversal sensor signal may indicate an x- and/or a y-position of the incident light beam within the sensor area. The sensor area may be a surface of the photo detector facing towards the object. The sensor area preferably may be oriented perpendicular to the optical axis. Thus, the transversal sensor signal may indicate a position of a light spot generated by the light beam in a plane of the sensor area of the transversal optical sensor. Generally, as used herein, the term "partial electrode" refers to an electrode out of a plurality of electrodes, adapted for measuring at least one current and/or voltage signal, preferably independent from other partial electrodes. Thus, in case a plurality of partial electrodes is provided, the respective electrode is adapted to provide a plurality of electric potentials and/or electric currents and/or voltages via the at least two partial electrodes, which may be measured and/or used independently.

The transversal optical sensor may further be adapted to generate the transversal sensor signal in accordance with the electrical currents through the partial electrodes. Thus, a ratio of electric currents through two horizontal partial electrodes may be formed, thereby generating an x-coordinate, and/or a ratio of electric currents through vertical partial electrodes may be formed, thereby generating a y-coordinate. The detector, preferably the transversal optical sensor and/or the evaluation device, may be adapted to derive the information on the transversal position of the object from at least one ratio of the currents through the partial electrodes. Other ways of generating position coordinates by comparing currents through the partial electrodes are feasible.

The partial electrodes may generally be defined in various ways, in order to determine a position of the light beam in the sensor area. Thus, two or more horizontal partial electrodes may be provided in order to determine a horizontal coordinate or x-coordinate, and two or more vertical partial electrodes may be provided in order to determine a vertical coordinate or y-coordinate. Thus, the partial electrodes may be provided at a rim of the sensor area, wherein an interior space of the sensor area remains free and may be covered by one or more additional electrode materials. Herein, the additional electrode material preferably may be a transparent additional electrode material, such as a transparent metal and/or a transparent conductive oxide and/or, most preferably, a transparent conductive polymer.

By using the transversal optical sensor, wherein one of the electrodes is a split electrode with three or more partial electrodes, currents through the partial electrodes may be dependent on a position of the light beam in the sensor area. This may generally be due to the fact that Ohmic losses or resistive losses may occur on the way from a location of generation of electrical charges due to the impinging light onto the partial electrodes. Thus, besides the partial electrodes, the split electrode may comprise one or more additional electrode materials connected to the partial electrodes, wherein the one or more additional electrode materials provide an electrical resistance. Thus, due to the Ohmic losses on the way from the location of generation of the electric charges to the partial electrodes through with the one or more additional electrode materials, the currents through the partial electrodes depend on the location of the generation of the electric charges and, thus, to the position of the light beam in the sensor area. For details of this principle of determining the position of the light beam in the sensor area, reference may be made to the preferred embodiments below and/or to the physical principles and device options as disclosed in WO 2014/097181 A1 and the respective references therein.

Accordingly, the transversal optical sensor may comprise the sensor area, which, preferably, may be transparent to the light beam travelling from the object to the detector. The transversal optical sensor may, therefore, be adapted to determine a transversal position of the light beam in one or more transversal directions, such as in the x- and/or in the y-direction. For this purpose, the at least one transversal optical sensor may further be adapted to generate at least one transversal sensor signal. Thus, the evaluation device may be designed to generate at least one item of information on a transversal position of the object by evaluating the transversal sensor signal of the longitudinal optical sensor.

Further embodiments of the present invention referred to the nature of the light beam which propagates from the object to the detector. As used herein, the term "light" generally refers to electromagnetic radiation in one or more of the visible spectral range, the ultraviolet spectral range and the infrared spectral range. Therein, in partial accordance with standard ISO-21348 in a valid version at the date of this application, the term visible spectral range generally refers to a spectral range of 380 nm to 760 nm. The term infrared (IR) spectral range generally refers to electromagnetic radiation in the range of 760 nm to 1000 µm, wherein the range of 760 nm to 1.4 µm is usually denominated as near infrared (NIR) spectral range, the range from 1.5 µm to 15 µm as mid infrared (MIR), and the range from 15 µm to 1000 µm as far infrared (FIR) spectral range. The term ultraviolet spectral range generally refers to electromagnetic radiation in the range of 1 nm to 380 nm, preferably in the range of 100 nm to 380 nm. Preferably, light as used within the present invention is visible light, i.e. light in the visible spectral range.

The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space.

The light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

In addition, the detector may comprise at least one transfer device, such as an optical lens, in particular one or more refractive lenses, particularly converging thin refractive lenses, such as convex or biconvex thin lenses, and/or one or more convex mirrors, which may further be arranged along the common optical axis. Most preferably, the light beam which emerges from the object may in this case travel first through the at least one transfer device and thereafter through the sensor layer until it may finally impinge on an imaging device. As used herein, the term "transfer device" refers to an optical element which may be configured to transfer the at least one light beam emerging from the object to a sensor layer within the detector. Thus, the transfer device can be designed to feed light propagating from the object to the detector to the sensor layer, wherein this feeding can optionally be effected by means of imaging or else by means of non-imaging properties of the transfer device. In particular the transfer device can also be designed to collect the electromagnetic radiation before the latter is fed to the sensor layer.

In addition, the at least one transfer device may have imaging properties. Consequently, the transfer device comprises at least one imaging element, for example at least one lens and/or at least one curved mirror, since, in the case of such imaging elements, for example, a geometry of the illumination on the sensor region can be dependent on a relative positioning, for example a distance, between the transfer device and the object. As used herein, the transfer device may be designed in such a way that the electromagnetic radiation which emerges from the object is transferred completely to the sensor region, for example is focused completely onto the sensor region, in particular if the object is arranged in a visual range of the detector.

Generally, the detector may further comprise at least one imaging device, i.e. a device capable of acquiring at least one image. The imaging device can be embodied in various ways. Thus, the imaging device can be for example part of the detector in a detector housing. Alternatively or additionally, however, the imaging device can also be arranged outside the detector housing, for example as a separate imaging device. Alternatively or additionally, the imaging device can also be connected to the detector or even be part of the detector. In a preferred arrangement, the detector and the imaging device are aligned along a common optical axis along which the light beam travels. Thus, it may be possible to locate an imaging device in the optical path of the light beam in a manner that the light beam travels through the sensor layer until it impinges on the imaging device. However, other arrangements are possible.

As used herein, an "imaging device" is generally understood as a device which can generate a one-dimensional, a two-dimensional, or a three-dimensional image of the object or of a part thereof. In particular, the detector, with or without the at least one optional imaging device, can be completely or partly used as a camera, such as an IR camera, or an RGB camera, i.e. a camera which is designed to deliver three basic colors which are designated as red, green, and blue, on three separate connections. Thus, as an example, the at least one imaging device may be or may comprise at least one imaging device selected from the group consisting of: a pixelated organic camera element, preferably a pixelated organic camera chip; a pixelated inorganic camera element, preferably a pixelated inorganic camera chip, more preferably a CCD- or CMOS-chip; a monochrome camera element, preferably a monochrome camera chip; a multicolor camera element, preferably a multicolor camera chip; a full-color camera element, preferably a full-color camera chip. The imaging device may be or may comprise at least one device selected from the group consisting of a monochrome imaging device, a multi-chrome imaging device and at least one full color imaging device. A multi-chrome imaging device and/or a full color imaging device may be generated by using filter techniques and/or by using intrinsic color sensitivity or other techniques, as the skilled person will recognize. In particular contrast to the transversal optical sensor as described above, the imaging device may, generally, exhibit intransparent optical properties. Other embodiments of the imaging device are also possible.

The imaging device may be designed to image a plurality of partial regions of the object successively and/or simultaneously. By way of example, a partial region of the object can be a one-dimensional, a two-dimensional, or a three-dimensional region of the object which is delimited for example by a resolution limit of the imaging device and from which electromagnetic radiation emerges. In this context, imaging should be understood to mean that the electromagnetic radiation which emerges from the respective partial region of the object is fed into the imaging device, for example by means of the at least one optional transfer device of the detector. The electromagnetic rays can be generated by the object itself, for example in the form of a luminescent radiation. Alternatively or additionally, the at least one detector may comprise at least one illumination source for illuminating the object.

In particular, the imaging device can be designed to image sequentially, for example by means of a scanning method, in particular using at least one row scan and/or line scan, the plurality of partial regions sequentially. However, other embodiments are also possible, for example embodiments in which a plurality of partial regions is simultaneously imaged. The imaging device is designed to generate, during this imaging of the partial regions of the object, signals, preferably electronic signals, associated with the partial regions. The signal may be an analogue and/or a digital signal. By way of example, an electronic signal can be associated with each partial region. The electronic signals can accordingly be generated simultaneously or else in a temporally staggered manner. By way of example, during a row scan or line scan, it is possible to generate a sequence of electronic signals which correspond to the partial regions of the object, which are strung together in a line, for example. Further, the imaging device may comprise one or more signal processing devices, such as one or more filters and/or analogue-digital-converters for processing and/or preprocessing the electronic signals.

Light emerging from the object can originate in the object itself, but can also optionally have a different origin and propagate from this origin to the object and subsequently toward the detector. The latter case can be affected for example by at least one illumination source being used. The illumination source can be embodied in various ways. Thus, the illumination source can be for example part of the detector in a detector housing. Alternatively or additionally, however, the at least one illumination source can also be arranged outside a detector housing, for example as a separate light source. The illumination source can be arranged separately from the object and illuminate the object from a distance. Alternatively or additionally, the illumination source can also be connected to the object or even be part of the object, such that, by way of example, the electromagnetic radiation emerging from the object can also be generated directly by the illumination source. By way of example, at least one illumination source can be arranged on and/or in the object and directly generate the electromagnetic radiation by means of which the sensor region is illuminated. This illumination source can for example be or comprise an ambient light source and/or may be or may comprise an artificial illumination source. By way of example, at least one infrared emitter and/or at least one emitter for visible light and/or at least one emitter for ultraviolet light can be arranged on the object. By way of example, at least one light emitting diode and/or at least one laser diode can be arranged on and/or in the object. The illumination source can comprise in particular one or a plurality of the following illumination sources: a laser, in particular a laser diode, although in principle, alternatively or additionally, other types of lasers can also be used; a light emitting diode; an incandescent lamp; a neon light; a flame source; a heat source; an organic light source, in particular an organic light emitting diode; a structured light source; a light source comprising a diffractive optical element, a light source comprising a micro-mirror device, such as a digital light processor (DLP). Alternatively or additionally, other illumination sources can also be used. It is particularly preferred if the illumination source is designed to generate one or more light beams having a Gaussian beam profile, as is at least approximately the case for example in many lasers. For further potential embodiments of the optional illumination source, reference may be made to WO 2012/110924 A1 or WO 2014/097181 A1. Still, other embodiments are feasible. Herein, it may, particularly, be preferred when the illumination source may exhibit a spectral range which may be related to the spectral sensitivities of the longitudinal sensors, particularly in a manner to ensure that the longitudinal sensor which may be illuminated by the respective illumination source may provide a sensor signal with a high intensity which may, thus, enable a high-resolution evaluation with a sufficient signal-to-noise-ratio.

Furthermore, the detector can have at least one modulation device for modulating the illumination, in particular for a periodic modulation, in particular a periodic beam interrupting device. A modulation of the illumination should be understood to mean a process in which a total power of the illumination is varied, preferably periodically, in particular with one or a plurality of modulation frequencies. In particular, a periodic modulation can be effected between a maximum value and a minimum value of the total power of the illumination. The minimum value can be 0, but can also be >0, such that, by way of example, complete modulation does not have to be effected. The modulation can be effected for example in a beam path between the object and the sensor layer, for example by the at least one modulation device being arranged in said beam path. Alternatively or additionally, however, the modulation can also be effected in a beam path between an optional illumination source—described in even greater detail below—for illuminating the object and the object, for example by the at least one modulation device being arranged in said beam path. A combination of these possibilities is also conceivable. The at least one modulation device can comprise for example a beam chopper or some other type of periodic beam interrupting device, for example comprising at least one interrupter blade or interrupter wheel, which preferably rotates at constant speed and which can thus periodically interrupt the illumination. Alternatively or additionally, however, it is also possible to use one or a plurality of different types of modulation devices, for example modulation devices based on an electro-optical effect and/or an acousto-optical effect. Once again alternatively or additionally, the at least one optional illumination source itself can also be designed to generate a modulated illumination, for example by said illumination source itself having a modulated intensity and/or total power, for example a periodically modulated total power, and/or by said illumination source being embodied as a pulsed illumination source, for example as a pulsed laser. Thus, by way of example, the at least one modulation device can also be wholly or partly integrated into the illumination source. Various possibilities are conceivable.

Accordingly, the detector can be designed in particular to detect at least two sensor signals in the case of different modulations, in particular at least two longitudinal sensor signals at respectively different modulation frequencies. The evaluation device can be designed to generate the geometrical information from the at least two longitudinal sensor signals. As described in WO 2012/110924 A1 and WO 2014/097181 A1, it is possible to resolve ambiguities and/or it is possible to take account of the fact that, for example, a total power of the illumination is generally unknown. By way of example, the detector can be designed to bring about a modulation of the illumination of the object and/or at least one sensor region of the detector, with a frequency of 0.05 Hz to 1 MHz, such as 0.1 Hz to 10 kHz. As outlined above, for this purpose, the detector may comprise at least one modulation device, which may be integrated into the at least one optional illumination source and/or may be independent from the illumination source. Thus, at least one illumination source might, by itself, be adapted to generate the modulation of the illumination, and/or at least one independent modulation device may be present, such as at least one chopper and/or at least one device having a modulated transmissibility, such as at least one electro-optical device and/or at least one acousto-optical device.

According to the present invention, it may be advantageous in order to apply at least one modulation frequency to the detector as described above. However, it may still be possible to directly determine the longitudinal sensor signal without applying a modulation frequency to the detector. As will be demonstrated below in more detail, an application of a modulation frequency may not be required under many relevant circumstances in order to acquire the desired longitudinal information about the object. As a result, the detector may, thus, not be required to comprise a modulation device which may further contribute to the simple and cost-effective setup of the spatial detector. As a further result, a spatial light modulator may be used in a time-multiplexing mode rather than a frequency-multiplexing mode or in a combination thereof.

In a further aspect of the present invention, an arrangement comprising at least two individual detectors according to any of the preceding embodiments, each having an individual sensor layer, placed at two distinct locations is proposed. Herein, the at least two detectors preferably may have identical optical properties but might also be different with respect from each other. In addition, the arrangement may further comprise at least one illumination source. Herein, the at least one object might be illuminated by using at least one illumination source which generates primary light, wherein the at least one object elastically or inelastically reflects the primary light, thereby generating a plurality of light beams which propagate to one of the at least two detectors. The at least one illumination source may form or may not form a constituent part of each of the at least two detectors. By way of example, the at least one illumination source itself may be or may comprise an ambient light source and/or may be or may comprise an artificial illumination source. This embodiment is preferably suited for an application in which at least two detectors, preferentially two identical detectors, are employed for acquiring depth information, in particular, for the purpose to providing a measurement volume which extends the inherent measurement volume of a single detector.

In this regard, the individual detector may, preferably, be spaced apart from the other individual detector in order to allow acquiring an individual image which may differ from the images taken by the other individual detectors. In particular, the individual detectors may be arranged in separate beam paths in a collimated arrangement in order to generate a single circular, three-dimensional image. Thus, the individual detectors may be aligned in a manner that they are located parallel to the optical axis and may, in addition, exhibit an individual displacement in an orientation perpendicular to the optical axis of the detector. Herein, an alignment may be achieved by adequate measures, such as by adjusting a location and orientation of the individual detectors and/or the corresponding transfer element. Thus, the two individual detectors may, preferably, be spaced apart in a manner that they may be able to generate or increase a perception of depth information, especially in a fashion that the depth information may be obtained by combining visual information as derived from the two optical detectors having overlapping fields of view, such as the visual information as obtained by binocular vision. For this purpose, the individual detectors may, preferably be spaced apart from each other by a distance from 1 cm to 100 cm, preferably from 10 cm to 25 cm, as determined in the direction perpendicular to the optical axis. As used herein, the detector as provided in this embodiment may, in particular, be part of a "stereoscopic system" which will be described below in more detail. Besides allowing stereoscopic vision, further particular advantages of the stereoscopic system which are primarily based on a use of more than one detector may, in particular, include an increase of the total intensity and/or a lower detection threshold.

In a further aspect of the present invention, an arrangement comprising an optical detector as described elsewhere in this document and a circuit carrier device, preferably a printed circuit board (PCB), which may be designed to mechanically support and electrically connect the detector, is proposed. Herein, an opening may be introduced into the circuit carrier device and an optical filter being designed to receive the incident light beam may, preferably, be placed at the opening.

This kind of arrangement may, especially, be adapted to minimize an entry of stray light into the detector. For this purpose, an aperture stop may be provided in order to be located in a vicinity of the opening. Herein, the aperture stop may, particularly, be designed to inhibit stray light entering the optical filter apart through the opening in the circuit carrier device as described above. By way of example, the aperture stop may, particularly, be formed by employing copper traces which may be located on the circuit carrier device around the opening.

In a further aspect of the present invention, a human-machine interface for exchanging at least one item of information between a user and a machine is proposed. The human-machine interface as proposed may make use of the fact that the above-mentioned detector in one or more of the embodiments mentioned above or as mentioned in further detail below may be used by one or more users for providing information and/or commands to a machine. Thus, preferably, the human-machine interface may be used for inputting control commands.

The human-machine interface comprises at least one detector according to the present invention, such as according to one or more of the embodiments disclosed above and/or according to one or more of the embodiments as disclosed in further detail below, wherein the human-machine interface is designed to generate at least one item of geometrical information of the user by means of the detector wherein the human-machine interface is designed to assign the geometrical information to at least one item of information, in particular to at least one control command.

In a further aspect of the present invention, an entertainment device for carrying out at least one entertainment function is disclosed. As used herein, an entertainment device is a device which may serve the purpose of leisure and/or entertainment of one or more users, in the following also referred to as one or more players. As an example, the entertainment device may serve the purpose of gaming, preferably computer gaming. Additionally or alternatively, the entertainment device may also be used for other purposes, such as for exercising, sports, physical therapy or motion tracking in general. Thus, the entertainment device may be implemented into a computer, a computer network or a computer system or may comprise a computer, a computer network or a computer system which runs one or more gaming software programs.

The entertainment device comprises at least one human-machine interface according to the present invention, such as according to one or more of the embodiments disclosed above and/or according to one or more of the embodiments disclosed below. The entertainment device is designed to enable at least one item of information to be input by a player by means of the human-machine interface. The at least one item of information may be transmitted to and/or may be used by a controller and/or a computer of the entertainment device.

In a further aspect of the present invention, a tracking system for tracking the position of at least one movable object is provided. As used herein, a tracking system is a device which is adapted to gather information on a series of past positions of the at least one object or at least one part of an object. Additionally, the tracking system may be adapted to provide information on at least one predicted future position of the at least one object or the at least one part of the object. The tracking system may have at least one track controller, which may fully or partially be embodied as an electronic device, preferably as at least one data processing device, more preferably as at least one computer or microcontroller. Again, the at least one track controller may comprise the at least one evaluation device and/or may be part of the at least one evaluation device and/or might fully or partially be identical to the at least one evaluation device.

The tracking system comprises at least one detector according to the present invention, such as at least one detector as disclosed in one or more of the embodiments listed above and/or as disclosed in one or more of the embodiments below. The tracking system further comprises at least one track controller. The tracking system may comprise one, two or more detectors, particularly two or more identical detectors, which allow for a reliable acquisition of depth information about the at least one object in an overlapping volume between the two or more detectors. The track controller is adapted to track a series of positions of the object, each position comprising at least one item of information on a position of the object at a specific point in time.

The tracking system may further comprise at least one beacon device connectable to the object. For a potential definition of the beacon device, reference may be made to WO 2014/097181 A1. The tracking system preferably is adapted such that the detector may generate an information on the position of the object of the at least one beacon device, in particular to generate the information on the position of the object which comprises a specific beacon device exhibiting a specific spectral sensitivity. Thus, more than one beacon exhibiting a different spectral sensitivity may be tracked by the detector of the present invention, preferably in a simultaneous manner. Herein, the beacon device may fully or partially be embodied as an active beacon device and/or as a passive beacon device. As an example, the beacon device may comprise at least one illumination source adapted to generate at least one light beam to be transmitted to the detector. Additionally or alternatively, the beacon device may comprise at least one reflector adapted to reflect light generated by an illumination source, thereby generating a reflected light beam to be transmitted to the detector.

In a further aspect of the present invention, a scanning system for determining at least one position of at least one object is provided. As used herein, the scanning system is a device which is adapted to emit at least one light beam being configured for an illumination of at least one dot located at at least one surface of the at least one object and for generating at least one item of information about the distance between the at least one dot and the scanning system. For the purpose of generating the at least one item of information about the distance between the at least one dot and the scanning system, the scanning system comprises at least one of the detectors according to the present invention, such as at least one of the detectors as disclosed in one or more of the embodiments listed above and/or as disclosed in one or more of the embodiments below.

Thus, the scanning system comprises at least one illumination source which is adapted to emit the at least one light beam being configured for the illumination of the at least one dot located at the at least one surface of the at least one object. As used herein, the term "dot" refers to a small area on a part of the surface of the object which may be selected, for example by a user of the scanning system, to be illuminated by the illumination source. Preferably, the dot may exhibit a size which may, on one hand, be as small as possible in order to allow the scanning system determining a value for the distance between the illumination source comprised by the scanning system and the part of the surface of the object on which the dot may be located as exactly as possible and which, on the other hand, may be as large as possible in order to allow the user of the scanning system or the scanning system itself, in particular by an automatic procedure, to detect a presence of the dot on the related part of the surface of the object.

For this purpose, the illumination source may comprise an artificial illumination source, in particular at least one laser source and/or at least one incandescent lamp and/or at least one semiconductor light source, for example, at least one light-emitting diode, in particular an organic and/or inorganic light-emitting diode. On account of their generally defined beam profiles and other properties of handleability, the use of at least one laser source as the illumination source is particularly preferred. Herein, the use of a single laser source may be preferred, in particular in a case in which it may be important to provide a compact scanning system that might be easily storable and transportable by the user. The illumination source may thus, preferably be a constituent part of the detector and may, therefore, in particular be integrated into the detector, such as into the housing of the detector. In a preferred embodiment, particularly the housing of the scanning system may comprise at least one display configured for providing distance-related information to the user, such as in an easy-to-read manner. In a further preferred embodiment, particularly the housing of the scanning system may, in addition, comprise at least one button which may be configured for operating at least one function related to the scanning system, such as for setting one or more operation modes. In a further preferred embodiment, particularly the housing of the scanning system may, in addition, comprise at least one fastening unit which may be configured for fastening the scanning system to a further surface, such as a rubber foot, a base plate or a wall holder, such comprising as magnetic material, in particular for increasing the accuracy of the distance measurement and/or the handleablity of the scanning system by the user.

In a particularly preferred embodiment, the illumination source of the scanning system may, thus, emit a single laser beam which may be configured for the illumination of a single dot located at the surface of the object. By using at least one of the detectors according to the present invention at least one item of information about the distance between the at least one dot and the scanning system may, thus, be generated. Hereby, preferably, the distance between the illumination system as comprised by the scanning system and the single dot as generated by the illumination source may be determined, such as by employing the evaluation device as comprised by the at least one detector. However, the scanning system may, further, comprise an additional evaluation system which may, particularly, be adapted for this purpose. Alternatively or in addition, a size of the scanning system, in particular of the housing of the scanning system, may be taken into account and, thus, the distance between a specific point on the housing of the scanning system, such as a front edge or a back edge of the housing, and the single dot may, alternatively, be determined.

Alternatively, the illumination source of the scanning system may emit two individual laser beams which may be configured for providing a respective angle, such as a right angle, between the directions of an emission of the beams, whereby two respective dots located at the surface of the same object or at two different surfaces at two separate objects may be illuminated. However, other values for the respective angle between the two individual laser beams may also be feasible. This feature may, in particular, be employed for indirect measuring functions, such as for deriving an indirect distance which may not be directly accessible, such as due to a presence of one or more obstacles between the scanning system and the dot or which may otherwise be hard to reach. By way of example, it may, thus, be feasible to determine a value for a height of an object by measuring two individual distances and deriving the height by using the Pythagoras formula. In particular for being able to keep a predefined level with respect to the object, the scanning system may, further, comprise at least one leveling unit, in particular an integrated bubble vial, which may be used for keeping the predefined level by the user.

As a further alternative, the illumination source of the scanning system may emit a plurality of individual laser beams, such as an array of laser beams which may exhibit a respective pitch, in particular a regular pitch, with respect to each other and which may be arranged in a manner in order to generate an array of dots located on the at least one surface of the at least one object. For this purpose, specially adapted optical elements, such as beam-splitting devices and mirrors, may be provided which may allow a generation of the described array of the laser beams.

Thus, the scanning system may provide a static arrangement of the one or more dots placed on the one or more surfaces of the one or more objects. Alternatively, illumination source of the scanning system, in particular the one or more laser beams, such as the above described array of the laser beams, may be configured for providing one or more light beams which may exhibit a varying intensity over time and/or which may be subject to an alternating direction of emission in a passage of time. Thus, the illumination source may be configured for scanning a part of the at least one surface of the at least one object as an image by using one or more light beams with alternating features as generated by the at least one illumination source of the scanning device. In particular, the scanning system may, thus, use at least one row scan and/or line scan, such as to scan the one or more surfaces of the one or more objects sequentially or simultaneously. Thus, the scanning system may be adapted to measure angles by measuring three or more dots, or the scanning system may be adapted to measure corners or narrow regions such as a gable of a roof, which may be hardly accessible using a conventional measuring stick.

As a non-limiting example, the scanning system may be attached to a tripod and point towards an object or region with a several corners and surfaces. One or more flexibly movable laser sources are attached to the scanning system. The one or more laser sources are moved as such that they illuminate points of interest. The position of the illuminated points with respect to the scanning system is measured when pressing a designated button on the scanning system and the position information is transmitted via a wireless interface to a mobile phone. The position information is stored in a mobile phone application. The laser sources are moved to illuminate further points of interest the position of which are measured and transmitted to the mobile phone application. The mobile phone application may transform the set of points into a 3d model by connecting adjacent points with planar surfaces. The 3d model may be stored and processed further. The distances and or angles between the measured points or surfaces may be displayed directly on a display attached to a scanning system or on the mobile phone to which the position information is transmitted.

As a non-limiting example, a scanning system may comprise two or more flexible movable laser sources to project points and further one movable laser source projecting a line. The line may be used to arrange the two or more laser spots along a line and the display of the scanning device may display the distance between the two or more laser spots that may be arranged along the line, such as at equal distance. In the case of two laser spots, a single laser source may be used whereas the distance of the projected points is modified using one or more beam-splitters or prisms, where a beam-splitter or prism can be moved as such that the projected laser spots move apart or closer together. Further, the scanning system may be adapted to project further patterns such as a right angle, a circle, a square, a triangle, or the like, along which a measurement can be done by projecting laser spots and measuring their position.

As a non-limiting example, the scanning system may be adapted to support the work with tools, such as wood or metal processing tools, such as a saw, a driller, or the like. Thus, the scanning system may be adapted to measure the distance in two opposite directions and display the two measured distances or the sum of the distances in a display. Further, the scanning system may be adapted to measure the distance to the edge of a surface as such that when the scanning system is placed on the surface, a laser point is moved automatically away from the scanning system along the surface, until the distance measurement shows a sudden change due to a corner or the edge of a surface. This makes it possible to measure the distance of the end of a wood plank while the scanning device is placed on the plank but remote from its end. Further, the scanning system may measure the distance of the end of a plank in one direction and project a line or circle or point in a designated distance in the opposite direction. The scanning system may be adapted to project the line or circle or point in a distance depending on the distance measured in the opposite direction such as depending on a predetermined sum distance. This allows working with a tool such as a saw or driller at the projected position while placing the scanning system in a safe distance from the tool and simultaneously perform a process using the tool in a predetermined distance to the edge of the plank. Further, the scanning system may be adapted to project points or lines or the like in two opposite directions in a predetermined distance. When the sum of the distances is changed, only one of the projected distances changes.

As a non-limiting example, the scanning system may be adapted to be placed onto a surface, such as a surface on which a task is performed, such as cutting, sawing, drilling, or the like, and to project a line onto the surface in a predetermined distance that can be adjusted such as with buttons on the scanning device.

In a further aspect of the present invention, a stereoscopic system for generating at least one single circular, three-dimensional image of at least one object is provided. As used herein, the stereoscopic system as disclosed above and/or below may comprise at least two of the FiP sensors as the longitudinal optical sensors, wherein a first FiP sensor may be comprised in a tracking system, in particular in a tracking system according to the present invention, while a second FiP sensor may be comprised in a scanning system, in particular in a scanning system according to the present invention. Herein, the FiP sensors may, preferably, be arranged in separate beam paths in a collimated arrangement, such as by aligning the FiP sensors parallel to the optical axis and individually displaced perpendicular to the optical axis of the stereoscopic system. Thus, the FiP sensors may be able to generate or increase a perception of depth information, especially, by obtaining the depth information by a combination of the visual information derived from the individual FiP sensors which have overlapping fields of view and are, preferably, sensitive to an individual modulation frequency. For this purpose, the individual FiP sensors may, preferably, be spaced apart from each other by a distance from 1 cm to 100 cm, preferably from 10 cm to 25 cm, as determined in the direction perpendicular to the optical axis. In this preferred embodiment, the tracking system may, thus, be employed for determining a position of a modulated active target while the scanning system which is adapted to project one or more dots onto the one or more surfaces of the one or more objects may be used for generating at least one item of information about the distance between the at least one dot and the scanning system. In addition, the stereoscopic system may further comprise a separate position sensitive device being adapted for generating the item of information on the transversal position of the at least one object within the image as described elsewhere in this application.

Besides allowing stereoscopic vision, further particular advantages of the stereoscopic system which are primarily based on a use of more than one longitudinal optical sensors may, in particular, include an increase of the total intensity and/or a lower detection threshold. Further, whereas in a conventional stereoscopic system which comprises at least two conventional position sensitive devices corresponding pixels in the respective images have to be determined by applying considerable computational effort, in the stereoscopic system according to the present invention which comprises at least two FiP sensors the corresponding pixels in the respective images being recorded by using the FiP sensors, wherein each of the FiP sensors may be operated with a different modulation frequency, may apparently be assigned with respect to each other. Thus, it may be emphasized that the stereoscopic system according to the present invention may allow generating the at least one item of information on the longitudinal position of the object as well as on the transversal position of the object with reduced effort.

For further details of the stereoscopic system, reference may be made to the description of the tracking system and the scanning system, respectively.

In a further aspect of the present invention, a camera for imaging at least one object is disclosed. The camera comprises at least one detector according to the present invention, such as disclosed in one or more of the embodiments given above or given in further detail below. Thus, the detector may be part of a photographic device, specifically of a digital camera. Specifically, the detector may be used for 3D photography, specifically for digital 3D photography. Thus, the detector may form a digital 3D camera or may be part of a digital 3D camera. As used herein, the term "photography" generally refers to the technology of acquiring image information of at least one object. As further used herein, a "camera" generally is a device adapted for performing photography. As further used herein, the term "digital photography" generally refers to the technology of acquiring image information of at least one object by using a plurality of light-sensitive elements adapted to generate electrical signals indicating an intensity of illumination, preferably digital electrical signals. As further used herein, the term "3D photography" generally refers to the technology of acquiring image information of at least one object in three spatial dimensions. Accordingly, a 3D camera is a device adapted for performing 3D photography. The camera generally may be adapted for acquiring a single image, such as a single 3D image, or may be adapted for acquiring a plurality of images, such as a sequence of images. Thus, the camera may also be a video camera adapted for video applications, such as for acquiring digital video sequences.

Thus, generally, the present invention further refers to a camera, specifically a digital camera, more specifically a 3D camera or digital 3D camera, for imaging at least one object. As outlined above, the term imaging, as used herein, generally refers to acquiring image information of at least one object. The camera comprises at least one detector according to the present invention. The camera, as outlined above, may be adapted for acquiring a single image or for acquiring a plurality of images, such as image sequence, preferably for acquiring digital video sequences. Thus, as an example, the camera may be or may comprise a video camera. In the latter case, the camera preferably comprises a data memory for storing the image sequence.

In a further aspect of the present invention, a method for manufacturing an optical detector is disclosed. The method preferably may be used for manufacturing or producing at least one detector according to the present invention, such as of at least one detector according to one or more of the embodiments disclosed elsewhere in this document in further detail below. Thus, for optional embodiments of the method, reference might be made to the description of the various embodiments of the detector.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method according to the present invention comprises the following steps:

a) providing an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;

b) generating a sensor layer by depositing a photosensitive material on the second surface of the optical filter, wherein the sensor layer is designed to generate at least one sensor signal in a manner dependent on an illumination of the sensor layer by the modified light beam; and c) providing an evaluation device designed to generate at least one item of information provided by the incident light beam by evaluating the sensor signal.

As mentioned above, the optical filter may, preferably be selected from a group consisting of a band pass filter, a long pass filter, a short pass filter, a monochromatic filter, a photographic filter, a polarization filter, and a band rejection filter. In particular, the optical filter is one of a stained glass filter, a stained polymer filter, a metal mesh filter, a neutral density filter, or an optical interference filter. Further, the optical filter may also be adapted for modifying a propagation direction the incident light in order to furnish the modified light beam with a different propagation direction with respect to the incident light beam by using a suitable optical element adapted for modifying the light beam as a whole, such as a prism or a tilted surface, or locally, such by micro lenses, micro grooves, a diffuser, or a beam shaper. Alternatively or in addition, modifying at least one type of polarization of the light beam passing through the optical filter may be feasible by using a suitable optical element, such as a quarter wave plate, a polarizer, or a crossed polarizer. Alternatively or in addition, the wavelength and/or the direction of propagation of the light may be modified by using a non-linear optical effect which may cause upconversion or downconversion, such as fluorescent phosphors, a fluorescent light concentrator, or upconversion phosphors. However, further embodiments may also be feasible. Herein, the optical filter as provided may comprise one of an electrically insulating substrate or a semiconducting substrate, wherein the substrate for the optical filter may comprise at least one of glass, silicon (Si), a silicone, a transparent conducting oxide (TCO), or a transparent organic polymer. The optical filter may also be identical to the substrate, thereby comprising of a semitransparent glass, a dyed glass, a semitransparent polymer, or a dyed polymer.

In a particularly preferred embodiment, the sensor layer may be directly or indirectly applied to the optical filter, preferably in a manner that no gap may be left or generated between the optical filter and the sensor layer. For this purpose, the sensor layer may be applied by using a deposition method, wherein the deposition method is selected from the group consisting of vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

In a particular embodiment, an additional interlayer may be placed between the substrate and the sensor layer. For further details of the additional interlayer reference may be made to description of the interlayer as provided herein.

As mentioned above, the desired detector is, generally, designed to generate at least one sensor signal in a manner dependent on an illumination of the sensor layer by an incident light beam. For this purpose, at least two electrical contacts being adapted to electrically contact the sensor layer may be further provided. In general, the electrical contacts may be provided before or during any one of the method steps a) to c). In a particularly preferred embodiment, the electrical contacts may be provided by using an evaporated metal layer, such as by known evaporation techniques, wherein the metal layer may, particularly, comprise one or more of silver, aluminum, platinum, magnesium, chromium, titanium, gold, or graphene. Alternatively, the electrical contacts may be provided by a galvanic or chemically deposition process, such as electroless Ni, electroless Au, galvanic Ni, or galvanic Au.

In addition, a cover layer may be deposited on the sensor layer in a manner that it may also fully or partially cover the electrical contacts. In this particular embodiment, the electrical contacts are at least partially, preferably fully, covered by the cover layer may, thus, be bonded to at least one external connection by using electrically conductive leads, preferably in form of wires, in particular Au, Al, or Cu wires, wherein the electrically conductive leads may, especially, be bonded to the electrical contacts through the cover layer. By way of example, Au contacts covered by the cover layer may, subsequently, be contacted by wire bonds.

As already described above, at least one additional layer may, further, be deposited on the cover layer or a partition thereof. Herein, the additional layer may be selected to be or comprise at least one of an additional optical filter layer, an anti-reflective layer, an adhesive layer, an encapsulating layer, a scratch-resistant layer, a hydrophilic layer, a hydrophobic layer, a self-cleaning layer, an anti-fog layer, or a conductive layer.

In addition, further details concerning the manufacturing process for the optical detector may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, pMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAP-BGA, UCSP, pBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at https://en.wikipedia.org/wiki/List_of_integrated_circuit_packaging_types or https://en.wikipedia.org/wiki/List_of_integrated_circuit_package_dimensions.

In a further aspect of the present invention, a use of a detector according to the present invention is disclosed. Therein, a use of the detector for a purpose of determining a position of an object, in particular a lateral position of an object, is proposed, in particular, for a purpose of use selected from the group consisting of: a position measurement, in particular in traffic technology; an entertainment application; a security application; a human-machine interface application; a tracking application; a scanning application; a stereoscopic vision application; a photography application; an imaging application or camera application; a mapping application for generating maps of at least one space; a homing or tracking beacon detector for vehicles; a position measurement of objects with a thermal signature (hotter or colder than background); a machine vision application; a robotic application.

Thus, generally, the devices according to the present invention, such as the detector, may be applied in various fields of uses. Specifically, the detector may be applied for a purpose of use, selected from the group consisting of: a position measurement in traffic technology; an entertainment application; a security application; a human-machine interface application; a tracking application; a photography application; a cartography application; a mapping application for generating maps of at least one space; a homing or tracking beacon detector for vehicles; a mobile application; a webcam; an audio device; a Dolby surround audio system; a computer peripheral device; a gaming application; a camera or video application; a surveillance application; an automotive application; a transport application; a logistics application; a vehicle application; an airplane application; a ship application; a spacecraft application; a robotic application; a medical application; a sports' application; a building application; a construction application; a manufacturing application; a machine vision application; a use in combination with at least one sensing technology selected from time-of-flight detector, radar, Lidar, ultrasonic sensors, or interferometry. Additionally or alternatively, applications in local and/or global positioning systems may be named, especially landmark-based positioning and/or navigation, specifically for use in cars or other vehicles (such as trains, motorcycles, bicycles, trucks for cargo transportation), robots or for use by pedestrians. Further, indoor positioning systems may be named as potential applications, such as for household applications and/or for robots used in manufacturing, logistics, surveillance, or maintenance technology.

Thus, firstly, the devices according to the present invention may be used in mobile phones, tablet computers, laptops, smart panels or other stationary or mobile or wearable computer or communication applications. Thus, the devices according to the present invention may be combined with at least one active light source, such as a light source emitting light in the visible range or infrared spectral range, in order to enhance performance. Thus, as an example, the devices according to the present invention may be used as cameras and/or sensors, such as in combination with mobile software for scanning and/or detecting environment, objects and living beings. The devices according to the present invention may even be combined with 2D cameras, such as conventional cameras, in order to increase imaging effects. The devices according to the present invention may further be used for surveillance and/or for recording purposes or as input devices to control mobile devices, especially in combination with voice and/or gesture recognition. Thus, specifically, the devices according to the present invention acting as human-machine interfaces, also referred to as input devices, may be used in mobile applications, such as for controlling other electronic devices or components via the mobile device, such as the mobile phone. As an example, the mobile application including at least one device according to the present invention may be used for controlling a television set, a game console, a music player or music device or other entertainment devices.

Further, the devices according to the present invention may be used in webcams or other peripheral devices for computing applications. Thus, as an example, the devices according to the present invention may be used in combination with software for imaging, recording, surveillance, scanning, or motion detection. As outlined in the context of the human-machine interface and/or the entertainment device, the devices according to the present invention are particularly useful for giving commands by facial expressions and/or body expressions. The devices according to the present invention can be combined with other input generating devices like e.g. mouse, keyboard, touchpad, microphone etc. Further, the devices according to the present invention may be used in applications for gaming, such as by using a webcam. Further, the devices according to the present invention may be used in virtual training applications and/or video conferences. Further, devices according to the present invention may be used to recognize or track hands, arms, or objects used in a virtual or augmented reality application, especially when wearing head mounted displays.

Further, the devices according to the present invention may be used in mobile audio devices, television devices and gaming devices, as partially explained above. Specifically, the devices according to the present invention may be used as controls or control devices for electronic devices, entertainment devices or the like. Further, the devices according to the present invention may be used for eye detection or eye tracking, such as in 2D- and 3D-display techniques, especially with transparent displays for augmented reality applications and/or for recognizing whether a display is being looked at and/or from which perspective a display is being looked at. Further, devices according to the present invention may be used to explore a room, boundaries, obstacles, in connection with a virtual or augmented reality application, especially when wearing a head-mounted display.

Further, the devices according to the present invention may be used in or as digital cameras such as DSC cameras and/or in or as reflex cameras such as SLR cameras. For these applications, reference may be made to the use of the devices according to the present invention in mobile applications such as mobile phones, as disclosed above.

Further, the devices according to the present invention may be used for security or surveillance applications. Thus, as an example, at least one device according to the present invention can be combined with one or more digital and/or analogue electronics that will give a signal if an object is within or outside a predetermined area (e.g. for surveillance applications in banks or museums). Specifically, the devices according to the present invention may be used for optical encryption. Detection by using at least one device according to the present invention can be combined with other detection devices to complement wavelengths, such as with IR, x-ray, UV-VIS, radar or ultrasound detectors. The devices according to the present invention may further be combined with an active infrared light source to allow detection in low light surroundings. The devices according to the present invention are generally advantageous as compared to active detector systems, specifically since the devices according to the present invention avoid actively sending signals which may be detected by third parties, as is the case e.g. in radar applications, ultrasound applications, LI DAR or similar active detector devices. Thus, generally, the devices according to the present invention may be used for an unrecognized and undetectable tracking of moving objects. Additionally, the devices according to the present invention generally are less prone to manipulations and irritations as compared to conventional devices.

Further, given the ease and accuracy of 3D detection by using the devices according to the present invention, the devices according to the present invention generally may be used for facial, body and person recognition and identification. Therein, the devices according to the present invention may be combined with other detection means for identification or personalization purposes such as passwords, finger prints, iris detection, voice recognition or other means. Thus, generally, the devices according to the present invention may be used in security devices and other personalized applications.

Further, the devices according to the present invention may be used as 3D barcode readers for product identification.

In addition to the security and surveillance applications mentioned above, the devices according to the present invention generally can be used for surveillance and monitoring of spaces and areas. Thus, the devices according to the present invention may be used for surveying and monitoring spaces and areas and, as an example, for triggering or executing alarms in case prohibited areas are violated. Thus, generally, the devices according to the present invention may be used for surveillance purposes in building surveillance or museums, optionally in combination with other types of sensors, such as in combination with motion or heat sensors, in combination with image intensifiers or image enhancement devices and/or photomultipliers. Further, the devices according to the present invention may be used in public spaces or crowded spaces to detect potentially hazardous activities such as commitment of crimes such as theft in a parking lot or unattended objects such as unattended baggage in an airport.

Further, the devices according to the present invention may advantageously be applied in camera applications such as video and camcorder applications. Thus, the devices according to the present invention may be used for motion capture and 3D-movie recording. Therein, the devices according to the present invention generally provide a large number of advantages over conventional optical devices. Thus, the devices according to the present invention generally require a lower complexity with regard to optical components. Thus, as an example, the number of lenses may be reduced as compared to conventional optical devices, such as by providing the devices according to the present invention having one lens only. Due to the reduced complexity, very compact devices are possible, such as for mobile use. Conventional optical systems having two or more lenses with high quality generally are voluminous, such as due to the general need for voluminous beam-splitters. Further, the devices according to the present invention generally may be used for focus/autofocus devices, such as autofocus cameras. Further, the devices according to the present invention may also be used in optical microscopy, especially in confocal microscopy.

Further, the devices according to the present invention generally are applicable in the technical field of automotive technology and transport technology. Thus, as an example, the devices according to the present invention may be used as distance and surveillance sensors, such as for adaptive cruise control, emergency brake assist, lane departure warning, surround view, blind spot detection, traffic sign detection, traffic sign recognition, lane recognition, rear cross traffic alert, light source recognition for adapting the head light intensity and range depending on approaching traffic or vehicles driving ahead, adaptive front-lighting systems, automatic control of high beam head lights, adaptive cut-off lights in front light systems, glare-free high beam front lighting systems, marking animals, obstacles, or the like by headlight illumination, rear cross traffic alert, and other driver assistance systems, such as advanced driver assistance systems, or other automotive and traffic applications. Further, devices according to the present invention may be used in driver assistance systems which may, particularly, be adapted for anticipating maneuvers of the driver beforehand for collision avoidance. Further, the devices according to the present invention can also be used for velocity and/or acceleration measurements, such as by analyzing a first and second time-derivative of position information gained by using the detector according to the present invention. This feature generally may be applicable in automotive technology, transportation technology or general traffic technology. Applications in other fields of technology are feasible. A specific application in an indoor positioning system may be the detection of positioning of passengers in transportation, more specifically to electronically control the use of safety systems such as airbags. Herein, the use of an airbag may, especially, be prevented in a case in which the passenger may be located within the vehicle in a manner that a use of the airbag might cause an injury, in particular a severe injury, with the passenger. Further, in vehicles such as cars, trains, planes or the like, especially in autonomous vehicles, devices according to the present invention may be used to determine whether a driver pays attention to the traffic or is distracted, or asleep, or tired, or incapable of driving, such as due to the consumption of alcohol or other drugs.

In these or other applications, generally, the devices according to the present invention may be used as stand-alone devices or in combination with other sensor devices, such as in combination with radar and/or ultrasonic devices. Specifically, the devices according to the present invention may be used for autonomous driving and safety issues. Further, in these applications, the devices according to the present invention may be used in combination with infrared sensors, radar sensors, which are sonic sensors, two-dimensional cameras or other types of sensors. In these applications, the generally passive nature of the devices according to the present invention is advantageous. Thus, since the devices according to the present invention generally do not require emitting signals, the risk of interference of active sensor signals with other signal sources may be avoided. The devices according to the present invention specifically may be used in combination with recognition software, such as standard image recognition software. Thus, signals and data as provided by the devices according to the present invention typically are readily processable and, therefore, generally require lower calculation power than established stereovision systems such as LIDAR. Given the low space demand, the devices according to the present invention such as cameras may be placed at virtually any place in a vehicle, such as on or behind a window screen, on a front hood, on bumpers, on lights, on mirrors or other places and the like. Various detectors according to the present invention such as one or more detectors based on the effect disclosed within the present invention can be combined, such as in order to allow autonomously driving vehicles or in order to increase the performance of active safety concepts. Thus, various devices according to the present invention may be combined with one or more other devices according to the present invention and/or conventional sensors, such as in the windows like rear window, side window or front window, on the bumpers or on the lights.

A combination of at least one device according to the present invention such as at least one detector according to the present invention with one or more rain detection sensors is also possible. This is due to the fact that the devices according to the present invention generally are advantageous over conventional sensor techniques such as radar, specifically during heavy rain. A combination of at least one device according to the present invention with at least one conventional sensing technique such as radar may allow for a software to pick the right combination of signals according to the weather conditions.

Further, the devices according to the present invention may generally be used as break assist and/or parking assist and/or for speed measurements. Speed measurements can be integrated in the vehicle or may be used outside the vehicle, such as in order to measure the speed of other cars in traffic control. Further, the devices according to the present invention may be used for detecting free parking spaces in parking lots.

Further, the devices according to the present invention may generally be used for vision, in particular for vision under difficult visibility conditions, such as in night vision, fog vision, or fume vision. For achieving this purpose, the detector may be sensitive at least within a wavelength range in which small particles, such as particles being present in smoke or fume, or small droplets, such as droplets being present in fog, mist or haze, may not reflect an incident light beam or only a small partition thereof. As generally known, the reflection of the incident light beam may be small or negligent in a case in which the wavelength of the incident beam exceeds the size of the particles or of the droplets, respectively. Further, might vision may be enabled by detecting thermal radiation being emitted by a bodies and objects. Thus, the detector may particularly be sensitive within the infrared (IR) spectral range, preferably within the mid infrared (MidIR) spectral range, may, thus, allow good visibility even at night, in fume, smoke, fog, mist, or haze.

Further, the devices according to the present invention may be used in the fields of medical systems and sports. Thus, in the field of medical technology, surgery robotics, e.g. for use in endoscopes, may be named, since, as outlined above, the devices according to the present invention may require a low volume only and may be integrated into other devices. Specifically, the devices according to the present invention having one lens, at most, may be used for capturing 3D information in medical devices such as in endoscopes. Further, the devices according to the present invention may be combined with an appropriate monitoring software, in order to enable tracking and analysis of movements. This may allow an instant overlay of the position of a medical device, such as an endoscope or a scalpel, with results from medical imaging, such as obtained from magnetic resonance imaging, x-ray imaging, or ultrasound imaging. These applications are specifically valuable e.g. in medical treatments where precise location information is important such as in brain surgery and long-distance diagnosis and tele-medicine. Further, the devices according to the present invention may be used in 3D-body scanning. Body scanning may be applied in a medical context, such as in dental surgery, plastic surgery, bariatric surgery, or cosmetic plastic surgery, or it may be applied in the context of medical diagnosis such as in the diagnosis of myofascial pain syndrome, cancer, body dysmorphic disorder, or further diseases. Body scanning may further be applied in the field of sports to assess ergonomic use or fit of sports equipment.

Body scanning may further be used in the context of clothing, such as to determine a suitable size and fitting of clothes. This technology may be used in the context of tailor-made clothes or in the context of ordering clothes or shoes from the internet or at a self-service shopping device such as a micro kiosk device or customer concierge device. Body scanning in the context of clothing is especially important for scanning fully dressed customers.

Further, the devices according to the present invention may be used in the context of people counting systems, such as to count the number of people in an elevator, a train, a bus, a car, or a plane, or to count the number of people passing a hallway, a door, an aisle, a retail store, a stadium, an entertainment venue, a museum, a library, a public location, a cinema, a theater, or the like. Further, the 3D-function in the people counting system may be used to obtain or estimate further information about the people that are counted such as height, weight, age, physical fitness, or the like. This information may be used for business intelligence metrics, and/or for further optimizing the locality where people may be counted to make it more attractive or safe. In a retail environment, the devices according to the present invention in the context of people counting may be used to recognize returning customers or cross shoppers, to assess shopping behavior, to assess the percentage of visitors that make purchases, to optimize staff shifts, or to monitor the costs of a shopping mall per visitor. Further, people counting systems may be used for anthropometric surveys. Further, the devices according to the present invention may be used in public transportation systems for automatically charging passengers depending on the length of transport. Further, the devices according to the present invention may be used in playgrounds for children, to recognize injured children or children engaged in dangerous activities, to allow additional interaction with playground toys, to ensure safe use of playground toys or the like.

Further, the devices according to the present invention may be used in construction tools, such as a range meter that determines the distance to an object or to a wall, to assess whether a surface is planar, to align or objects or place objects in an ordered manner, or in inspection cameras for use in construction environments or the like.

Further, the devices according to the present invention may be applied in the field of sports and exercising, such as for training, remote instructions or competition purposes. Specifically, the devices according to the present invention may be applied in the fields of dancing, aerobic, football, soccer, basketball, baseball, cricket, hockey, track and field, swimming, polo, handball, volleyball, rugby, sumo, judo, fencing, boxing, golf, car racing, laser tag, battlefield simulation etc. The devices according to the present invention can be used to detect the position of a ball, a bat, a sword, motions, etc., both in sports and in games, such as to monitor the game, support the referee or for judgment, specifically automatic judgment, of specific situations in sports, such as for judging whether a point or a goal actually was made.

Further, the devices according to the present invention may be used in the field of auto racing or car driver training or car safety training or the like to determine the position of a car or the track of a car, or the deviation from a previous track or an ideal track or the like.

The devices according to the present invention may further be used to support a practice of musical instruments, in particular remote lessons, for example lessons of string instruments, such as fiddles, violins, violas, celli, basses, harps, guitars, banjos, or ukuleles, keyboard instruments, such as pianos, organs, keyboards, harpsichords, harmoniums, or accordions, and/or percussion instruments, such as drums, timpani, marimbas, xylophones, vibraphones, bongos, congas, timbales, djembes or tablas.

The devices according to the present invention further may be used in rehabilitation and physiotherapy, in order to encourage training and/or in order to survey and correct movements. Therein, the devices according to the present invention may also be applied for distance diagnostics.

Further, the devices according to the present invention may be applied in the field of machine vision. Thus, one or more of the devices according to the present invention may be used e.g. as a passive controlling unit for autonomous driving and or working of robots. In combination with moving robots, the devices according to the present invention may allow for autonomous movement and/or autonomous detection of failures in parts. The devices according to the present invention may also be used for manufacturing and safety surveillance, such as in order to avoid accidents including but not limited to collisions between robots, production parts and living beings. In robotics, the safe and direct interaction of humans and robots is often an issue, as robots may severely injure humans when they are not recognized. Devices according to the present invention may help robots to position objects and humans better and faster and allow a safe interaction. Given the passive nature of the devices according to the present invention, the devices according to the present invention may be advantageous over active devices and/or may be used complementary to existing solutions like radar, ultrasound, 2D cameras, IR detection etc. One particular advantage of the devices according to the present invention is the low likelihood of signal interference. Therefore multiple sensors can work at the same time in the same environment, without the risk of signal interference. Thus, the devices according to the present invention generally may be useful in highly automated production environments like e.g. but not limited to automotive, mining, steel, etc. The devices according to the present invention can also be used for quality control in production, e.g. in combination with other sensors like 2-D imaging, radar, ultrasound, IR etc., such as for quality control or other purposes. Further, the devices according to the present invention may be used for assessment of surface quality, such as for surveying the surface evenness of a product or the adherence to specified dimensions, from the range of micrometers to the range of meters. Other quality control applications are feasible. In a manufacturing environment, the devices according to the present invention are especially useful for processing natural products such as food or wood, with a complex 3-dimensional structure to avoid large amounts of waste material. Further, devices according to the present invention may be used to monitor the filling level of tanks, silos etc. Further, devices according to the present invention may be used to inspect complex products for missing parts, incomplete parts, loose parts, low quality parts, or the like, such as in automatic optical inspection, such as of printed circuit boards, inspection of assemblies or sub-assemblies, verification of engineered components, engine part inspections, wood quality inspection, label inspections, inspection of medical devices, inspection of product orientations, packaging inspections, food pack inspections, or the like.

Further, the devices according to the present invention may be used in vehicles, trains, airplanes, ships, spacecraft and other traffic applications. Thus, besides the applications mentioned above in the context of traffic applications, passive tracking systems for aircraft, vehicles and the like may be named. The use of at least one device according to the present invention, such as at least one detector according to the present invention, for monitoring the speed and/or the direction of moving objects is feasible. Specifically, the tracking of fast moving objects on land, sea and in the air including space may be named. The at least one device according to the present invention, such as the at least one detector according to the present invention, specifically may be mounted on a still-standing and/or on a moving device. An output signal of the at least one device according to the present invention can be combined e.g. with a guiding mechanism for autonomous or guided movement of another object. Thus, applications for avoiding collisions or for enabling collisions between the tracked and the steered object are feasible. The devices according to the present invention are generally useful and advantageous due to a low calculation power required, an instant response and due to a passive nature of the detection system which is, generally, more difficult to detect and to disturb as compared to active systems, like e.g. radar. The devices according to the present invention are particularly useful but not limited to e.g. speed control and air traffic control devices. Further, the devices according to the present invention may be used in automated tolling systems for road charges.

The devices according to the present invention may, generally, be used in passive applications. Passive applications include guidance for ships in harbors or in dangerous areas, and for aircraft when landing or starting. Wherein, fixed, known active targets may be used for precise guidance. The same can be used for vehicles driving on dangerous but well defined routes, such as mining vehicles. Further, the devices according to the present invention may be used to detect rapidly approaching objects, such as cars, trains, flying objects, animals, or the like. Further, the devices according to the present invention can be used for detecting velocities or accelerations of objects, or to predict the movement of an object by tracking one or more of its position, speed, and/or acceleration depending on time.

Further, as outlined above, the devices according to the present invention may be used in the field of gaming. Thus, the devices according to the present invention can be passive for use with multiple objects of the same or of different size, color, shape, etc., such as for movement detection in combination with software that incorporates the movement into its content. In particular, applications are feasible in implementing movements into graphical output. Further, applications of the devices according to the present invention for giving commands are feasible, such as by using one or more of the devices according to the present invention for gesture or facial recognition. The devices according to the present invention may be combined with an active system in order to work under e.g. low light conditions or in other situations in which enhancement of the surrounding conditions is required. Additionally or alternatively, a combination of one or more devices according to the present invention with one or more IR or VIS light sources is possible. A combination of a detector according to the present invention with special devices is also possible, which can be distinguished easily by the system and its software, e.g. and not limited to, a special color, shape, relative position to other devices, speed of movement, light, frequency used to modulate light sources on the device, surface properties, material used, reflection properties, transparency degree, absorption characteristics, etc. The device can, amongst other possibilities, resemble a stick, a racquet, a club, a gun, a knife, a wheel, a ring, a steering wheel, a bottle, a ball, a glass, a vase, a spoon, a fork, a cube, a dice, a figure, a puppet, a teddy, a beaker, a pedal, a switch, a glove, jewelry, a musical instrument or an auxiliary device for playing a musical instrument, such as a plectrum, a drumstick or the like. Other options are feasible.

Further, the devices according to the present invention may be used to detect and or track objects that emit light by themselves, such as due to high temperature or further light emission processes. The light emitting part may be an exhaust stream or the like. Further, the devices according to the present invention may be used to track reflecting objects and analyze the rotation or orientation of these objects.

Further, the devices according to the present invention may generally be used in the field of building, construction and cartography. Thus, generally, one or more devices according to the present invention may be used in order to measure and/or monitor environmental areas, e.g. countryside or buildings. Therein, one or more devices according to the present invention may be combined with other methods and devices or can be used solely in order to monitor progress and accuracy of building projects, changing objects, houses, etc. The devices according to the present invention can be used for generating three-dimensional models of scanned environments, in order to construct maps of rooms, streets, houses, communities or landscapes, both from ground or air. Potential fields of application may be construction, cartography, real estate management, land surveying or the like. As an example, the devices according to the present invention may be used in vehicles capable of flight, such as drones or multicopters, in order to monitor buildings, chimneys, production sites, agricultural production environments such as fields, production plants, or landscapes, to support rescue operations, to support work in dangerous environments, to support fire brigades in a burning location indoors or outdoors, to find or monitor one or more persons, animals, or moving objects, or for entertainment purposes, such as a drone following and recording one or more persons doing sports such as skiing or cycling or the like, which could be realized by following a helmet, a mark, a beacon device, or the like. Devices according to the present invention could be used recognize obstacles, follow a predefined route, follow an edge, a pipe, a building, or the like, or to record a global or local map of the environment. Further, devices according to the present invention could be used for indoor or outdoor localization and positioning of drones, for stabilizing the height of a drone indoors where barometric pressure sensors are not accurate enough, or for the interaction of multiple drones such as concertized movements of several drones or recharging or refueling in the air or the like.

Further, the devices according to the present invention may be used within an interconnecting network of home appliances such as CHAIN (Cedec Home Appliances Interoperating Network) to interconnect, automate, and control basic appliance-related services in a home, e.g. energy or load management, remote diagnostics, pet related appliances, child related appliances, child surveillance, appliances related surveillance, support or service to elderly or ill persons, home security and/or surveillance, remote control of appliance operation, and automatic maintenance support. Further, the devices according to the present invention may be used in heating or cooling systems such as an air-conditioning system, to locate which part of the room should be brought to a certain temperature or humidity, especially depending on the location of one or more persons. Further, the devices according to the present invention may be used in domestic robots, such as service or autonomous robots which may be used for household chores. The devices according to the present invention may be used for a number of different purposes, such as to avoid collisions or to map the environment, but also to identify a user, to personalize the robot's performance for a given user, for security purposes, or for gesture or facial recognition. As an example, the devices according to the present invention may be used in robotic vacuum cleaners, floor-washing robots, dry-sweeping robots, ironing robots for ironing clothes, animal litter robots, such as cat litter robots, security robots that detect intruders, robotic lawn mowers, automated pool cleaners, rain gutter cleaning robots, window washing robots, toy robots, telepresence robots, social robots providing company to less mobile people, or robots translating and speech to sign language or sign language to speech. In the context of less mobile people, such as elderly persons, household robots with the devices according to the present invention may be used for picking up objects, transporting objects, and interacting with the objects and the user in a safe way. Further the devices according to the present invention may be used in robots operating with hazardous materials or objects or in dangerous environments. As a non-limiting example, the devices according to the present invention may be used in robots or unmanned remote-controlled vehicles to operate with hazardous materials such as chemicals or radioactive materials especially after disasters, or with other hazardous or potentially hazardous objects such as mines, unexploded arms, or the like, or to operate in or to investigate insecure environments such as near burning objects or post disaster areas, or for manned or unmanned rescue operations in the air, in the sea, underground, or the like.

Further, the devices according to the present invention may be used in household, mobile or entertainment devices, such as a refrigerator, a microwave, a washing machine, a window blind or shutter, a household alarm, an air condition devices, a heating device, a television, an audio device, a smart watch, a mobile phone, a phone, a dishwasher, a stove or the like, to detect the presence of a person, to monitor the contents or function of the device, or to interact with the person and/or share information about the person with further household, mobile or entertainment devices. Herein, the devices according to the present invention may be used to support elderly or disabled persons, blind persons, or persons with limited vision abilities, such as in household chores or at work such as in devices for holding, carrying, or picking objects, or in a safety system with optical and/or acoustical signals adapted for signaling obstacles in the environment.

The devices according to the present invention may further be used in agriculture, for example to detect and sort out vermin, weeds, and/or infected crop plants, fully or in parts, wherein crop plants may be infected by fungus or insects. Further, for harvesting crops, the devices according to the present invention may be used to detect animals, such as deer, which may otherwise be harmed by harvesting devices. Further, the devices according to the present invention may be used to monitor the growth of plants in a field or greenhouse, in particular to adjust the amount of water or fertilizer or crop protection products for a given region in the field or greenhouse or even for a given plant. Further, in agricultural biotechnology, the devices according to the present invention may be used to monitor the size and shape of plants.

Further, devices according to the present invention may be used to guide users during a shaving, hair cutting, or cosmetics procedure, or the like. Further, devices according to the present invention may be used to record or monitor what is played on an instrument, such as a violin. Further, devices according to the present invention may be used in smart household appliances such as a smart refrigerator, such as to monitor the contents of the refrigerator and transmit notifications depending on the contents. Further, devices according to the present invention may be used for monitoring or tracking populations of humans, animals, or plants, such as dear or tree populations in forests. Further, devices according to the present invention may be used in harvesting machines, such as for harvesting crops, flowers or fruits, such as grapes, corn, hops, apples, grains, rice, strawberries, asparagus, tulips, roses, soy beans, or the like. Further, devices according to the present invention may be used to monitor the growth of plants, animals, algae, fish, or the like, such as in breeding, food production, agriculture or research applications, to control irrigation, fertilization, humidity, temperature, use of herbicides, insecticides, fungicides, rodenticides, or the like. Further, devices according to the present invention may be used in feeding machines for animals or pets, such as for cows, pigs, cats, dogs, birds, fish, or the like. Further, devices according to the present invention may be used in animal product production processes, such as for collecting milk, eggs, fur, meat, or the like, such as in automated milking or butchering processes. Further, devices according to the present invention may be used for automated seeding machines, or sowing machines, or planting machines such as for planting corn, garlic, trees, salad or the like. Further, devices according to the present invention may be used to assess or monitor weather phenomena, such as clouds, fog, or the like, or to warn from danger of avalanches, tsunamis, gales, earthquakes, thunder storms, or the like. Further, devices according to the present invention may be used to measure motions, shocks, concussions, or the like such as to monitor earthquake risk. Further, devices according to the present invention may be used in traffic technology to monitor dangerous crossings, to control traffic lights depending on traffic, to monitor public spaces, to monitor roads, gyms, stadiums, ski resorts, public events, or the like. Further, devices according to the present invention may be used in medical applications such as to monitor or analyze tissues, medical or biological assays, changes in tissues such as in moles or melanoma or the like, to count bacteria, blood cells, cells, algae, or the like, for retina scans, breath or pulse measurements, gastroscopy, patient surveillance, or the like. Further, devices according to the present invention may be used to monitor the shape, size, or circumference of drops, streams, jets, or the like or to analyze, assess, or monitor profiles or gas or liquid currents such as in a wind channel, or the like. Further, devices according to the present invention may be used to warn drivers such as car or train drivers when they are getting sick or tired or the like. Further, devices according to the present invention may be used in material testing to recognize strains or tensions or fissures, or the like. Further, devices according to the present invention may be used in sailing to monitor and optimize sail positions such as automatically. Further, devices according to the present invention may be used for fuel level gauges.

Further, the devices according to the present invention may be combined with sensors to detect chemicals or pollutants, electronic nose chips, microbe sensor chips to detect bacteria or viruses or the like, Geiger counters, tactile sensors, heat sensors, or the like. This may for example be used in constructing smart robots which are configured for handling dangerous or difficult tasks, such as in treating highly infectious patients, handling or removing highly dangerous substances, cleaning highly polluted areas, such as highly radioactive areas or chemical spills, or for pest control in agriculture.

One or more devices according to the present invention can further be used for scanning of objects, such as in combination with CAD or similar software, such as for additive manufacturing and/or 3D printing. Therein, use may be made of the high dimensional accuracy of the devices according to the present invention, e.g. in x-, y- or z-direction or in any arbitrary combination of these directions, such as simultaneously. In this regard, determining a distance of an illuminated spot on a surface which may provide reflected or diffusely scattered light from the detector may be performed virtually independent of the distance of the light source from the illuminated spot. This property of the present invention is in direct contrast to known methods, such as triangulation or such as time-of-flight (TOF) methods, wherein the distance between the light source and the illuminated spot must be known a priori or calculated a posteriori in order to be able to determine the distance between the detector and the illuminated spot. In contrast hereto, for the detector according to the present invention is may be sufficient that the spot is adequately illuminated. Further, the devices according to the present invention may be used for scanning reflective surfaces, such of metal surfaces, independent whether they may comprise a solid or a liquid surface. Further, the devices according to the present invention may be used in inspections and maintenance, such as pipeline inspection gauges. Further, in a production environment, the devices according to the present invention may be used to work with objects of a badly defined shape such as naturally grown objects, such as sorting vegetables or other natural products by shape or size or cutting products such as meat or objects that are manufactured with a precision that is lower than the precision needed for a processing step.

Further, the devices according to the present invention may be used in local navigation systems to allow autonomously or partially autonomously moving vehicles or multicopters or the like through an indoor or outdoor space. A non-limiting example may comprise vehicles moving through an automated storage for picking up objects and placing them at a different location.

Indoor navigation may further be used in shopping malls, retail stores, museums, airports, or train stations, to track the location of mobile goods, mobile devices, baggage, customers or employees, or to supply users with a location specific information, such as the current position on a map, or information on goods sold, or the like.

Further, the devices according to the present invention may be used to ensure safe driving of motorcycles, such as driving assistance for motorcycles by monitoring speed, inclination, upcoming obstacles, unevenness of the road, or curves or the like. Further, the devices according to the present invention may be used in trains or trams to avoid collisions.

Further, the devices according to the present invention may be used in handheld devices, such as for scanning packaging or parcels to optimize a logistics process. Further, the devices according to the present invention may be used in further handheld devices such as personal shopping devices, RFID-readers, handheld devices for use in hospitals or health environments such as for medical use or to obtain, exchange or record patient or patient health related information, smart badges for retail or health environments, or the like.

As outlined above, the devices according to the present invention may further be used in manufacturing, quality control or identification applications, such as in product identification or size identification (such as for finding an optimal place or package, for reducing waste etc.). Further, the devices according to the present invention may be used in logistics applications. Thus, the devices according to the present invention may be used for optimized loading or packing containers or vehicles. Further, the devices according to the present invention may be used for monitoring or controlling of surface damages in the field of manufacturing, for monitoring or controlling rental objects such as rental vehicles, and/or for insurance applications, such as for assessment of damages. Further, the devices according to the present invention may be used for identifying a size of material, object or tools, such as for optimal material handling, especially in combination with robots. Further, the devices according to the present invention may be used for process control in production, e.g. for observing filling level of tanks. Further, the devices according to the present invention may be used for maintenance of production assets like, but not limited to, tanks, pipes, reactors, tools etc. Further, the devices according to the present invention may be used for analyzing 3D-quality marks. Further, the devices according to the present invention may be used in manufacturing tailor-made goods such as tooth inlays, dental braces, prosthesis, clothes or the like. The devices according to the present invention may also be combined with one or more 3D-printers for rapid prototyping, 3D-copying or the like. Further, the devices according to the present invention may be used for detecting the shape of one or more articles, such as for anti-product piracy and for anti-counterfeiting purposes.

Further, the devices according to the present invention may be used in the context of gesture recognition. In this context, gesture recognition in combination with devices according to the present invention may, in particular, be used as a human-machine interface for transmitting information via motion of a body, of body parts or of objects to a machine. Herein, the information may, preferably, be transmitted via a motion of hands or hand parts, such as fingers, in particular, by pointing at objects, applying sign language, such as for deaf people, making signs for numbers, approval, disapproval, or the like, by waving the hand, such as when asking someone to approach, to leave, or to greet a person, to press an object, to take an object, or, in the field of sports or music, in a hand or finger exercise, such as a warm-up exercise. Further, the information may be transmitted by motion of arms or legs, such as rotating, kicking, grabbing, twisting, rotating, scrolling, browsing, pushing, bending, punching, shaking, arms, legs, both arms, or both legs, or a combination of arms and legs, such as for a purpose of sports or music, such as for entertainment, exercise, or training function of a machine. Further, the information may be transmitted by motion of the whole body or major parts thereof, such as jumping, rotating, or making complex signs, such as sign language used at airports or by traffic police in order to transmit information, such as "turn right", "turn left", "proceed", "slow down", "stop", or "stop engines", or by pretending to swim, to dive, to run, to shoot, or the like, or by making complex motions or body positions such as in yoga, pilates, judo, karate, dancing, or ballet. Further, the information may be transmitted by using a real or mock-up device for controlling a virtual device corresponding to the mock-up device, such as using a mock-up guitar for controlling a virtual guitar function in a computer program, using a real guitar for controlling a virtual guitar function in a computer program, using a real or a mock-up book for reading an e-book or moving pages or browsing through in a virtual document, using a real or mock-up pen for drawing in a computer program, or the like. Further, the transmission of the information may be coupled to a feedback to the user, such as a sound, a vibration, or a motion.

In the context of music and/or instruments, devices according to the present invention in combination with gesture recognition may be used for exercising purposes, control of instruments, recording of instruments, playing or recording of music via use of a mock-up instrument or by only pretending to have a instrument present such as playing air guitar, such as to avoid noise or make recordings, or, for conducting of a virtual orchestra, ensemble, band, big band, choir, or the like, for practicing, exercising, recording or entertainment purposes or the like.

Further, in the context of safety and surveillance, devices according to the present invention in combination with gesture recognition may be used to recognize motion profiles of persons, such as recognizing a person by the way of walking or moving the body, or to use hand signs or movements or signs or movements of body parts or the whole body as access or identification control such as a personal identification sign or a personal identification movement.

Further, in the context of smart home applications or internet of things, devices according to the present invention in combination with gesture recognition may be used for central or non-central control of household devices which may be part of an interconnecting network of home appliances and/or household devices, such as refrigerators, central heating, air condition, microwave ovens, ice cube makers, or water boilers, or entertainment devices, such as television sets, smart phones, game consoles, video recorders, DVD players, personal computers, laptops, tablets, or combinations thereof, or a combination of household devices and entertainment devices.

Further, in the context of virtual reality or of augmented reality, devices according to the present invention in combination with gesture recognition may be used to control movements or function of the virtual reality application or of the augmented reality application, such as playing or controlling a game using signs, gestures, body movements or body part movements or the like, moving through a virtual world, manipulating virtual objects, practicing, exercising or playing sports, arts, crafts, music or games using virtual objects such as a ball, chess figures, go stones, instruments, tools, brushes.

Further, in the context of medicine, devices according to the present invention in combination with gesture recognition may be used to support rehabilitation training, remote diagnostics, or to monitor or survey surgery or treatment, to overlay and display medical images with positions of medical devices, or to overlay display prerecorded medical images such as from magnetic resonance tomography or x-ray or the like with images from endoscopes or ultra sound or the like that are recorded during an surgery or treatment.

Further, in the context of manufacturing and process automation, devices according to the present invention in combination with gesture recognition may be used to control, teach, or program robots, drones, unmanned autonomous vehicles, service robots, movable objects, or the like, such as for programming, controlling, manufacturing, manipulating, repairing, or teaching purposes, or for remote manipulating of objects or areas, such as for safety reasons, or for maintenance purposes.

Further, in the context of business intelligence metrics, devices according to the present invention in combination with gesture recognition may be used for people counting, surveying customer movements, areas where customers spend time, objects, customers test, take, probe, or the like.

Further, devices according to the present invention may be used in the context of do-it-yourself or professional tools, especially electric or motor driven tools or power tools, such as drilling machines, saws, chisels, hammers, wrenches, staple guns, disc cutters, metals shears and nibblers, angle grinders, die grinders, drills, hammer drills, heat guns, wrenches, sanders, engravers, nailers, jig saws, buiscuit joiners, wood routers, planers, polishers, tile cutters, washers, rollers, wall chasers, lathes, impact drivers, jointers, paint rollers, spray guns, morticers, or welders, in particular, to support precision in manufacturing, keeping a minimum or maximum distance, or for safety measures.

Further, the devices according to the present invention may be used to aid visually impaired persons. Further, devices according to the present invention may be used in touch screen such as to avoid direct context such as for hygienic reasons, which may be used in retail environments, in medical applications, in production environments, or the like. Further, devices according to the present invention may be used in agricultural production environments such as in stable cleaning robots, egg collecting machines, milking machines, harvesting machines, farm machinery, harvesters, forwarders, combine harvesters, tractors, cultivators, ploughs, destoners, harrows, strip tills, broadcast seeders, planters such as potato planters, manure spreaders, sprayers, sprinkler systems, swathers, balers, loaders, forklifts, mowers, or the like.

Further, devices according to the present invention may be used for selection and/or adaption of clothing, shoes, glasses, hats, prosthesis, dental braces, for persons or animals with limited communication skills or possibilities, such as children or impaired persons, or the like. Further, devices according to the present invention may be used in the context of warehouses, logistics, distribution, shipping, loading, unloading, smart manufacturing, industry 4.0, or the like. Further, in a manufacturing context, devices according to the present invention may be used in the context of processing, dispensing, bending, material handling, or the like.

The devices according to the present invention may be combined with one or more other types of measurement devices. Thus, the devices according to the present invention may be combined with one or more other types of sensors or detectors, such as a time of flight (TOF) detector, a stereo camera, a lightfield camera, a lidar, a radar, a sonar, an ultrasonic detector, or interferometry. When combining devices according to the present invention with one or more other types of sensors or detectors, the devices according to the present invention and the at least one further sensor or detector may be designed as independent devices, with the devices according to the present invention being separate from the at least one further sensor or detector. Alternatively, the devices according to the present invention and the at least one further sensor or detector may fully or partially be integrated or designed as a single device.

Thus, as a non-limiting example, the devices according to the present invention may further comprise a stereo camera. As used herein, a stereo camera is a camera which is designed for capturing images of a scene or an object from at least two different perspectives. Thus, the devices according to the present invention may be combined with at least one stereo camera.

The stereo camera's functionality is generally known in the art, since stereo cameras generally are known to the skilled person. The combination with the devices according to the present invention may provide additional distance information. Thus, the devices according to the present invention may be adapted, in addition to the stereo camera's information, to provide at least one item of information on a longitudinal position of at least one object within a scene captured by the stereo camera. Information provided by the stereo camera, such as distance information obtained by evaluating triangulation measurements performed by using the stereo camera, may be calibrated and/or validated by using the devices according to the present invention. Thus, as an example, the stereo camera may be used to provide at least one first item of information on the longitudinal position of the at least one object, such as by using triangulation measurements, and the devices according to the present invention may be used to provide at least one second item of information on the longitudinal position of the at least one object. The first item of information and the second item of information may be used to improve accuracy of the measurements. Thus, the first item of information may be used for calibrating the second item of information or vice a versa. Consequently, the devices according to the present invention, as an example, may form a stereo camera system, having the stereo camera and the devices according to the present invention, wherein the stereo camera system is adapted to calibrate the information provided by the stereo camera by using the information provided by devices according to the present invention.

Consequently, additionally or alternatively, the devices according to the present invention may be adapted to use the second item of information, provided by the devices according to the present invention, for correcting the first item of information, provided by the stereo camera. Additionally or alternatively, the devices according to the present invention may be adapted to use the second item of information, provided by the devices according to the present invention, for correcting optical distortion of the stereo camera. Further, the devices according to the present invention may adapted to calculate stereo information provided by the stereo camera, and the second item of information provided by devices according to the present invention may be used for speeding up the calculation of the stereo information.

As an example, the devices according to the present invention may be adapted to use at least one virtual or real object within a scene captured by the devices according to the present invention for calibrating the stereo camera. As an example, one or more objects and/or areas and/or spots may be used for calibration. As an example, the distance of at least one object or spot may be determined by using the devices according to the present invention, and distance information provided by the stereo camera may be calibrated by using this distance is determined by using the devices according to the present invention. For instance, at least one active light spot of the devices according to the present invention may be used as a calibration point for the stereo camera. The active light spot, as an example, may move freely in the picture.

The devices according to the present invention may be adapted to continuously or discontinuously calibrate the stereo camera by using information provided by the active distance sensor. Thus, as an example, the calibration may take place at regular intervals, continuously or occasionally.

Further, typical stereo cameras exhibit measurement errors or uncertainties which are dependent on the distance of the object. This measurement error may be reduced when combined with information provided by the devices according to the present invention.

Combinations of stereo cameras with other types of distance sensors are generally known in the art. Thus, in D. Scaramuzza et al., IEEE/RSJ International Conference on Intelligent Robots and Systems, IROS 2007, pp. 4164-4169, 2007, an extrinsic self-calibration of a camera and a 3D laser range finder from natural scenes is disclosed. Similarly, in D. Klimentjew et al., IEEE Conference on Multisensor Fusion and Integration for Intelligent Systems (MFI), pages 236-241, 2010, a multi sensor fusion of camera and 3D laser range finder for object recognition is disclosed. As the skilled person will recognize, the laser range finder in these setups known in the art may simply be replaced or complemented by at least one device according to the present invention, without altering the methods and advantages disclosed by these prior art documents. For potential setups of the stereo camera, reference may be made to these prior art documents. Still, other setups and embodiments of the at least one optional stereo camera are feasible.

Preferably, for further potential details of the optical detector, the method, the human-machine interface, the entertainment device, the tracking system, the camera and the various uses of the detector, in particular with regard to the transfer device, the transversal optical sensors, the evaluation device and, if applicable, to the longitudinal optical sensor, the modulation device, the illumination source and the imaging device, specifically with respect to the potential materials, setups and further details, reference may be made to one or more of WO 2012/110924 A1, US 2012/206336 A1, WO 2014/097181 A1, US 2014/291480 A1, and PCT patent application No. PCT/EP2016/051817, filed Jan. 28, 2016, the full content of all of which is herewith included by reference.

Further, the devices according to the present invention may be used for infra-red detection applications, heat-detection applications, thermometer applications, heat-seeking applications, flame-detection applications, fire-detection applications, smoke-detection applications, temperature sensing applications, spectroscopy applications, or the like. Further, devices according to the present invention may be used in photocopy or xerography applications. Further, devices according to the present invention may be used to monitor exhaust gas, to monitor combustion processes, to monitor pollution, to monitor industrial processes, to monitor chemical processes, to monitor food processing processes, to assess water quality, to assess air quality, or the like. Further, devices according to the present invention may be used for quality control, temperature control, motion control, exhaust control, gas sensing, gas analytics, motion sensing, chemical sensing, or the like.

The above-described optical detector, the method, the human-machine interface and the entertainment device, which comprises at least one of the detectors, and also the proposed uses have considerable advantages over the prior art. Thus, generally, a simple and, still, efficient detector for an accurate determining a position of at least one object in space, specifically with regard to a depth or both to the depth and a width of the at least one object may be provided. Further, the detectors according to the present invention may be particularly sensitive over at least a partition of the IR spectral range, thus providing efficient, reliable and large-area position sensitive devices for the infrared.

As compared to devices known in the art, the detector as proposed herein can, preferably, be arranged in a manner to be capable of effectively removing stray light from entering a sensor layer as far as possible, in particular, by employing a suitable optical filter adapted for the desired wavelengths. For achieving this purpose, a gapless positioning of the sensor layer with respect to the optical filter may, especially, be advantageous. Further, the detector as described herein may, preferably, be supplied as a non-bulky hermetic package which may, nevertheless, provide a high degree of protection against possible degradation by external influence, such as humidity and/or oxygen, even at elevated temperatures and/or humidity. Herein, the materials used for the detector may be selected in order to ensure that the sensor layer may exhibit a suitable absorption characteristic over a desired spectral range.

Further, the detector can be simply manufactured and easily be integrated into a package. Furthermore, the bondability of the electrical contacts even through the cover layer and the non-bulky hermetic package of the sensor layer may allow easy integration on a circuit carrier device, such as a printed circuit board (PCB), such as by providing an opening in the circuit carrier device being designed for receiving the incident light beam and guiding it to the optical filter, thereby minimizing an amount of stray light which may, otherwise, enter the optical filter, such as through an expoxy or glass layer a being present on the PCB. In an alternative embodiment, the encapsulated photosensitive layer may be contacted by using through glass vias, which may allow a direct, hermetic connection from the top of the substrate to the bottom. In this alternative embodiment, devices could be glued or soldered directly onto the circuit carrier device, such as the PCB.

Summarizing, in the context of the present invention, the following embodiments are regarded as particularly preferred:

Embodiment 1

An optical detector, comprising
an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;
a sensor layer comprising a photosensitive material being deposited on the second surface of the optical filter, wherein the sensor layer is designed to generate at least one sensor signal in a manner dependent on an illumination of the sensor layer by the modified light beam; and
an evaluation device designed to generate at least one item of information provided by the incident light beam by evaluating the sensor signal.

Embodiment 2

The detector according to the preceding embodiment, wherein the detector is designed for detecting at least one wavelength in at least a partition of a spectral range selected from the ultraviolet spectral range, the visible spectral range and the infrared spectral range.

Embodiment 3

The detector according to the preceding embodiment, wherein the detector is designed for detecting at least one wavelength in at least a partition of the infrared spectral range, the infrared spectral range ranging from 760 nm to 1000 µm.

Embodiment 4

The detector according to the preceding embodiment, wherein the detector is designed for detecting at least one wavelength in at least a partition of the mid infrared spectral range, the mid infrared spectral range ranging from of 1.5 µm to 15 µm.

Embodiment 5

The detector according to any one of the preceding embodiments, wherein the optical filter is selected from a group consisting of a band pass filter, a long pass filter, a short pass filter, a monochromatic filter, a photographic filter, a polarization filter, a neutral density filter, and a band rejection filter.

Embodiment 6

The detector according to the preceding embodiment, wherein the optical filter is a long pass filter, the long pass filter being designed to generating the modified light beam by attenuating a first wavelength range below a cut-off wavelength and, concurrently, by transmitting a second wavelength range above the cut-off wavelength, the cut-off wavelength referring to a wavelength at 50% of peak transmission.

Embodiment 7

The detector according to the preceding embodiment, wherein the cut-off wavelength of the long pass filter is selected from a wavelength in the near infrared spectral range, the near infrared spectral range ranging from 760 nm to 1.5 µm, or the mid infrared spectral range, the mid infrared spectral range ranging from of 1.5 µm to 15 µm.

Embodiment 8

The detector according to any one of the preceding embodiments, wherein at least two individual electrical contacts contact the sensor layer, wherein the electrical contacts are designed to transmit the sensor signal to the evaluation device.

Embodiment 9

The detector according to any one of the preceding embodiments, wherein the optical filter is one of a stained glass filter, a stained polymer filter, a metal mesh filter, or an optical interference filter.

Embodiment 9

The detector according to any one of the preceding embodiments, wherein the optical filter is adapted for modifying a propagation direction the incident light beam in order to furnish the modified light beam with a different propagation direction with respect to the incident light beam.

Embodiment 10

The detector according to the preceding embodiment, wherein the optical filter is or comprises a prism, a tilted surface, micro lenses, micro grooves, a diffuser, or a beam shaper.

Embodiment 11

The detector according to any one of the preceding embodiments, wherein the optical filter is adapted for modifying at least one type of polarization of the incident light beam in order to furnish the modified light beam with a different type of polarization with respect to the incident light beam.

Embodiment 12

The detector according to the preceding embodiment, wherein the optical filter is or comprises a quarter wave plate, a polarizer, or a crossed polarizer.

Embodiment 13

The detector according to any one of the preceding embodiments, wherein the optical filter is adapted for modifying the incident light beam by applying at least one non-linear optical effect.

Embodiment 14

The detector according to the preceding embodiment, wherein the non-linear optical effect causes upconversion or downconversion.

Embodiment 15

The detector according to the preceding embodiment, wherein the optical filter is or comprises fluorescent phosphors, a fluorescent light concentrator, or upconversion phosphors.

Embodiment 16

The detector according to any one of the preceding embodiments, wherein the optical filter is or comprises one of an electrically insulating substrate or a semiconducting substrate.

Embodiment 17

The detector according to the preceding embodiment, wherein a material for the substrate is selected from glass, quartz, silicon (Si), a transparent conducting oxide (TOO), or a transparent organic polymer.

Embodiment 18

The detector according to the preceding embodiment, wherein the transparent conducting oxide (TCO) is selected from the group consisting of aluminum oxide ($Al_2O_3$), titanium oxide ($TiO_2$), indium tin oxide (ITO), fluorine doped tin oxide ($SnO2$:F; FTO), aluminum doped zinc oxide (AZO), magnesium oxide (MgO), or a perovskite transparent conducting oxide.

Embodiment 19

The detector according to any one of the three preceding embodiments, wherein at least two further individual electrical contacts contact the semiconducting substrate, wherein the semiconducting substrate is designed as an optical sensor.

Embodiment 20

The sensor according to the three preceding embodiment, wherein the at least two further individual electrical contacts comprises at least one of Au, Pt, Pd, W.

Embodiment 21

The detector according to the preceding embodiment, wherein the sensor layer is exactly one continuous sensor layer.

Embodiment 22

The detector according to any one of the preceding embodiments, wherein the sensor layer is directly or indirectly applied to the second surface of the optical filter.

Embodiment 23

The detector according to the preceding embodiment, wherein no gap is left or generated between the optical filter and the sensor layer.

Embodiment 24

The detector according to any one of the two preceding embodiments, wherein the sensor layer is applied by using a deposition method.

Embodiment 25

The detector according to the preceding embodiment, wherein the deposition method is selected from the group consisting of chemical bath deposition, vacuum evaporation, sputtering, atomic layer deposition, chemical vapor deposition, spray pyrolysis, anodization, electrodeposition, electroconversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading and solution-gas interface techniques.

Embodiment 26

The detector according to any one of the preceding embodiments, additionally comprising an interlayer between the optical filter and the sensor layer.

Embodiment 27

The detector according to the preceding embodiment, wherein the interlayer comprises one of
- a thick insulating layer being designed in a manner that the optical filter and the sensor layer are separately operable as a first optical sensor and a second optical sensor, wherein the thick insulating layer exhibits a thickness being selected in order to impede an interaction between the first optical sensor and the second optical sensor, in particular, by avoiding an occurrence of an electrical field effect between the first optical sensor and the second optical sensor; or
- a thin insulating layer being designed in a manner that an interaction between the optical filter and the sensor layer occurs, wherein the thin insulating layer exhibits a thickness being selected in order to enable an occurrence of an electrical field effect between the optical filter and the sensor layer via the thin insulating layer.

Embodiment 28

The detector according to the preceding embodiment, wherein the insulating layer comprises one or more of silicon dioxide ($SiO_2$), silicon nitride ($Si_3N_4$), alumina ($Al_2O_3$), zirconia ($ZrO_2$), hafnium oxide ($HfO_2$), mixtures and/or laminates thereof.

Embodiment 29

The detector according to any one of the two preceding embodiments, wherein the insulating layer is deposited by a deposition method, wherein the deposition method is, in particular, selected from atomic layer deposition (ALD), physical vapor deposition (PVD), or plasma enhanced chemical vapor deposition (PECVD).

Embodiment 30

The detector according to any one of the four preceding embodiments, wherein the interlayer is or comprises an adhesive layer, preferably hydrophilic layer or a hydrophobic layer.

Embodiment 31

The detector according to any one of the five preceding embodiments, wherein the interlayer is or comprises an optically anti-reflective layer.

Embodiment 32

The detector according to any one of the preceding embodiments, wherein the photosensitive material for the sensor layer is selected from a group dye solar cells, and quantum dots, wherein the photoconductive materials are particularly preferred.

Embodiment 33

The detector according to any one of the preceding embodiments, wherein the photoconductive material comprises an inorganic photoconductive material, an organic photoconductive material, or a combination thereof.

Embodiment 34

The detector according to the preceding embodiment, wherein the inorganic photoconductive material comprises one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

Embodiment 35

The detector according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 36

The detector according to the preceding embodiment, wherein the sulfide chalcogenide is selected from a group comprising lead sulfide (PbS), cadmium sulfide (CdS), zinc sulfide (ZnS), mercury sulfide (HgS), silver sulfide (Ag2S), manganese sulfide (MnS), bismuth trisulfide (Bi2S3), antimony trisulfide (Sb2S3), arsenic trisulfide (As2S3), tin (II) sulfide (SnS), tin (IV) disulfide (SnS2), indium sulfide (In2S3), copper sulfide (CuS), cobalt sulfide (CoS), nickel sulfide (NiS), molybdenum disulfide (MoS2), iron disulfide (FeS2), chromium trisulfide (CrS3), copper indium sulfide (CIS), copper indium gallium selenide (CIGS), copper zinc tin sulfide (CZTS), and solid solutions and/or doped variants thereof.

Embodiment 37

The detector according to any one of the two preceding embodiments, wherein the selenide chalcogenide is selected from a group comprising lead selenide (PbSe), cadmium selenide (CdSe), zinc selenide (ZnSe), bismuth triselenide (Bi2Se3), mercury selenide (HgSe), antimony triselenide (Sb2Se3), arsenic triselenide (As2Se3), nickel selenide (NiSe), thallium selenide (TlSe), copper selenide (CuSe), molybdenum diselenide (MoSe2), tin selenide (SnSe), cobalt selenide (CoSe), indium selenide (In2Se3), copper zinc tin selenide (CZTSe), and solid solutions and/or doped variants thereof.

Embodiment 38

The detector according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride (Bi2Te3), arsenic tritelluride (As2Te3), antimony tritelluride (Sb2Te3), nickel telluride (NiTe), thallium telluride (TlTe), copper telluride (CuTe), molybdenum ditelluride (MoTe2), tin telluride (SnTe), and cobalt telluride (CoTe), silver telluride (Ag2Te), indium telluride (In2Te3), and solid solutions and/or doped variants thereof.

Embodiment 39

The detector according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide (CuInS2), cadmium sulfoselenide (CdSSe), zinc sulfoselenide (ZnSSe), thallous sulfoselenide (TlSSe), cadmium zinc sulfide (CdZnS), cadmium chromium sulfide (CdCr2S4), mercury chromium sulfide (HgCr2S4), copper chromium sulfide (CuCr2S4), cadmium lead selenide (CdPbSe), copper indium diselenide (CuInSe2), indium gallium arsenide (InGaAs), lead oxide sulfide (Pb2OS), lead oxide selenide (Pb2OSe), lead sulfoselenide (PbSSe), arsenic selenide telluride (As2Se2Te), indium gallium phosphide (InGaP), gallium arsenide phosphide (GaAsP), aluminum gallium phosphide (AlGaP), cadmium selenite (CdSeO3), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 40

The detector according to any one of the seven preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 41

The detector according to any one of the eight preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 42

The detector according to any one of the nine preceding embodiments, wherein the metal oxide is selected from a group comprising copper (II) oxide (CuO), copper (I) oxide (CuO2), nickel oxide (NiO), zinc oxide (ZnO), silver oxide (Ag2O), manganese oxide (MnO), titanium dioxide (TiO2), barium oxide (BaO), lead oxide (PbO), cerium oxide (CeO2), bismuth oxide (Bi2O3), cadmium oxide (CdO), and solid solutions and/or doped variants thereof.

Embodiment 43

The detector according to any one of the ten preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 44

The detector according to any one of the eleven preceding embodiments, wherein the photoconductive material is provided as a colloidal film comprising quantum dots.

Embodiment 45

The detector according to the preceding embodiment, wherein the photoconductive material is selected from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe), copper indium sulfide (CIS), copper indium gallium selenide (CIGS), and copper zinc tin sulfide (CZTS).

Embodiment 46

The detector according to the preceding embodiment, wherein the sensor layer exhibits a thickness from 1 nm to 100 µm, preferably from 10 nm to 10 µm, more preferred from 100 nm to 1 µm.

Embodiment 47

The detector according to any one of the preceding embodiments, further comprising a cover layer deposited on the sensor layer.

Embodiment 48

The detector according to the preceding embodiment, wherein the cover layer is an amorphous layer comprising at least one metal-containing compound.

Embodiment 49

The detector according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Ge, As, Sb, and Te.

Embodiment 50

The detector according to the preceding embodiment, wherein the at least one metal-containing compound comprises a metal selected from the group consisting of Al, Ti, Ta, Mn, Mo, Zr, Hf, and W.

Embodiment 51

The detector according to any one of the three preceding embodiments, wherein the at least one metal-containing compound is selected from the group comprising an oxide, a hydroxide, a chalcogenide, a pnictide, a carbide, or a combination thereof.

Embodiment 52

The detector according to the preceding embodiment, wherein the at least one metal-containing compound comprises at least one oxide, at least one hydroxide, or a combination thereof of Al, Ti, Zr or Hf.

Embodiment 53

The detector according to any one of the six preceding embodiments, wherein the cover layer has a thickness of 10 nm to 600 nm, preferably of 20 nm to 200 nm, more preferred of 40 nm to 100 nm, most preferred of 50 to 75 nm.

Embodiment 54

The detector according to any one of the seven preceding embodiments, wherein the cover layer is or comprises an chemical bath deposition, vacuum evaporation, sputtering, atomic layer deposition, chemical vapor deposition, spray pyrolysis, anodization, electrodeposition, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, dip coating, and solution-gas interface techniques.

Embodiment 55

The detector according to any one of the eight preceding embodiments, wherein the cover layer additionally comprises a property of at least one of a second optical filter, an anti-reflective layer, an encapsulating layer, an adhesive layer, a scratch-resistant layer, a hydrophilic layer, a hydrophobic layer, a self-cleaning layer, an anti-fog layer, or a conductive layer.

Embodiment 56

The detector according the preceding embodiment, wherein the second optical filter is designed for filtering the same wavelength range as the optical filter or for filtering a different wavelength range compared to the optical filter.

Embodiment 57

The detector according to the preceding embodiment, further comprising an optical element designed for alternatively supplying the incident light beam to the optical filter and the second optical filter, the incident light beam thereby alternatively impinging the sensor layer through the optical filter and the second optical filter.

Embodiment 58

The detector according to the preceding embodiment, wherein the modified light beam illuminating the sensor layer through the optical filter is a measuring beam while the modified light beam illuminating the sensor layer through the second optical filter is a reference beam, or vice-versa, wherein the evaluation device is further designed for comparing the sensor signals generated by the measuring beam and the reference beam.

Embodiment 59

The detector according to any one of the twelve preceding embodiments, wherein the cover layer directly contacts the sensor layer.

Embodiment 60

The detector according to the preceding embodiment, wherein the cover layer fully covers the accessible surface of the sensor layer.

Embodiment 61

The detector according to any one of the two preceding embodiments, wherein the cover layer at least partially covers the electrical contacts.

Embodiment 62

The detector according to the preceding embodiment, the electrical contacts are bondable through the cover layer.

Embodiment 63

The detector according to any one of the preceding embodiments, wherein the electrical contacts are bondable, preferably by using wires, in particular Au, Al, or Cu wires.

Embodiment 64

The detector according to any one of the preceding embodiments, wherein the at least two individual electrical contacts are applied at different locations of the sensor layer.

Embodiment 65

The detector according to any one of the preceding embodiments, wherein the electrical contacts comprise at least one electrode material selected from the group consisting of Ag, Pt, Mo, Al, Au, and graphene.

Embodiment 66

The detector according to the preceding embodiment, wherein an adhesive layer is provided at the electrical contacts, wherein the adhesive layer is adapted for bonding.

Embodiment 67

The detector according to the preceding embodiment, wherein the adhesive layer comprises at least one of Ni, Cr, Ti or Pd.

Embodiment 68

The detector according to any one of the preceding embodiments, wherein the first surface and/or the second surface of the optical filter is a flat surface or a curved surface.

Embodiment 69

The detector according to the preceding embodiment, wherein the optical filter is selected from a group consisting of a biconvex lense, a plano-convex lense, a biconcave lense, a plano-concave lens, and a meniscus lens.

Embodiment 70

The detector according to any one of the two preceding embodiment, wherein the curved surface is designed to correct aberrations of the light beam path through the detector.

Embodiment 71

The detector according to any of the preceding embodiments, wherein the detector is adapted to generate the sensor signal by one or more of measuring an electrical resistance or a conductivity of at least one part of the sensor layer.

Embodiment 72

The detector according to the preceding embodiment, wherein the detector is adapted to generate the sensor signal by performing at least one current-voltage measurement and/or at least one voltage-current-measurement.

Embodiment 73

The detector according to any one of the preceding embodiments, further comprising a bias voltage source.

Embodiment 74

The detector according to the preceding embodiment, wherein the bias voltage source and a load resistor are arranged in series with the sensor layer.

Embodiment 75

The detector according to any one of the two preceding embodiments, wherein a bias voltage is applied across the photosensitive material of the sensor layer.

Embodiment 76

The detector according to any one of the preceding embodiments, wherein the detector furthermore has at least one modulation device for modulating the illumination.

Embodiment 77

The detector according to the preceding embodiment, wherein the light beam is a modulated light beam.

Embodiment 78

The detector according to the preceding embodiment, wherein the detector is designed to detect at least two sensor signals in the case of different modulations, in particular at least two sensor signals at respectively different modulation frequencies, wherein the evaluation device is designed to generate the at least one item of information on the position of an object by evaluating the at least two sensor signals at the respectively different modulation frequencies.

Embodiment 79

The detector according to any one of the two preceding embodiments, wherein the optical sensor is furthermore designed in such a way that the sensor signal, given the same total power of the illumination, is dependent on a modulation frequency of a modulation of the illumination.

Embodiment 80

The detector according to the preceding embodiment, wherein the light beam is a non-modulated continuous-wave light beam.

Embodiment 81

The detector according to any one of the preceding embodiments, wherein the sensor signal is a longitudinal sensor signal, wherein the longitudinal sensor signal, given the same total power of the illumination, is dependent on a beam cross-section of the light beam in the sensor layer, wherein the longitudinal sensor signal, given the same total power of the illumination, is dependent on the beam cross-section of the light beam in the sensor layer, wherein the evaluation device is designed to generate at least one item of information on a longitudinal position of an object by evaluating the longitudinal sensor signal.

Embodiment 82

The detector according to the preceding embodiment, wherein the evaluation device is designed to generate the at least one item of information on the longitudinal position of the object from at least one predefined relationship between the geometry of the illumination and a relative positioning of the object with respect to the detector, preferably taking account of a known power of the illumination and optionally taking account of a modulation frequency with which the illumination is modulated.

Embodiment 83

The detector according to any one of the two preceding embodiments, wherein the sensor signal is a uniform sensor signal for the entire sensor layer.

Embodiment 84

The detector according to any one of the three preceding embodiments, wherein the evaluation device is adapted to normalize the longitudinal sensor signal and to generate the information on the longitudinal position of the object independent from an intensity of the modified light beam.

Embodiment 85

The detector according to the preceding embodiment, wherein the evaluation device is adapted to recognize whether the modified light beam widens or narrows, by comparing the longitudinal sensor signals of different longitudinal sensors.

Embodiment 86

The detector according to any one of the five preceding embodiments, wherein the evaluation device is adapted to generate the at least one item of information on the longitudinal position of the object by determining a diameter of the modified light beam from the at least one longitudinal sensor signal.

Embodiment 87

The detector according to the preceding embodiment, wherein the evaluation device is adapted to compare the diameter of the modified light beam with known beam properties of the light beam in order to determine the at least one item of information on the longitudinal position of the object, preferably from a known dependency of a beam diameter of the modified light beam on at least one propagation coordinate in a direction of propagation of the modified light beam and/or from a known Gaussian profile of the modified light beam.

Embodiment 88

The detector according to any one of the preceding embodiments, wherein the sensor signal is a transversal sensor signal, wherein the transversal sensor signal is provided by the electrical contacts contacting the sensor layer.

Embodiment 89

The detector according to the preceding embodiment, wherein the electrical contacts are configured as at least one split electrode, wherein the bias voltage source is applicable to the at least one split electrode, wherein the evaluation device is further designed to generate at least one item of information on a transversal position of the object by applying the bias voltage source and the at least one split electrode and by evaluating the transversal sensor signal.

Embodiment 90

The detector according to the preceding embodiment, wherein the split electrode comprises at least two partial electrodes.

Embodiment 91

The detector according to the preceding embodiment, wherein at least four partial electrodes are provided, wherein each of the partial electrodes is preferably provided in a form comprising a T shape.

Embodiment 92

The detector according to any one of the two preceding embodiments, wherein electrical currents through the partial electrodes are dependent on a position of the modified light beam in the sensor layer.

Embodiment 93

The detector according to the preceding embodiment, wherein the transversal sensor signal is generated in accordance with the electrical currents through the partial electrodes, wherein the evaluation device is adapted to generate the information on the transversal position of the object from at least one ratio of the currents through the partial electrodes.

Embodiment 94

The detector according to any one of the preceding embodiments relating to a detector, furthermore comprising at least one illumination source.

Embodiment 95

The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 96

The detector according to the preceding embodiment, wherein the light beam is generated by a reflection of the primary radiation on the object and/or by light emission by the object itself, stimulated by the primary radiation.

Embodiment 97

The detector according to the preceding embodiment, wherein the spectral sensitivity of the sensor layer is covered by the spectral range of the illumination source.

Embodiment 98

The detector according to any one of the preceding embodiments, wherein the detector further comprises at least one transfer device, the transfer device being adapted to guide the light beam onto the sensor layer.

Embodiment 99

The detector according to the preceding embodiment, wherein the transfer device comprises at least one of an optical lens, a mirror, a beam splitter, a further optical filter.

Embodiment 100

The detector according to any one of the preceding embodiments, wherein the detector further comprises at least one imaging device.

Embodiment 101

The detector according to the preceding embodiment, wherein the imaging device comprises a camera.

Embodiment 102

The detector according to any one of the two preceding embodiments, wherein the imaging device comprises at least one of: an inorganic camera; a monochrome camera; a multichrome camera; a full-color camera; a pixelated inorganic chip; a pixelated organic camera; a CCD chip, preferably a multi-color CCD chip or a full-color CCD chip; a CMOS chip; an IR camera; an RGB camera.

Embodiment 103

An arrangement comprising an optical detector according to any one of the preceding embodiments and a circuit carrier device designed to mechanically support and electrically connect the detector.

Embodiment 104

The arrangement according to the preceding embodiment, wherein an optical filter comprised by the detector is placed at an opening introduced into the circuit carrier device, the opening being designed to receive the incident light beam.

Embodiment 105

The arrangement according to the preceding embodiment, wherein an aperture stop is located in a vicinity of the opening, wherein the aperture stop is designed to inhibit light entering the optical filter apart through the opening.

Embodiment 106

The arrangement according to the preceding embodiment, wherein the aperture stop is formed by copper traces located on the circuit carrier device around the opening.

Embodiment 107

The arrangement according to any one of the four preceding embodiments, wherein the circuit carrier device is a printed circuit board (PCB).

Embodiment 108

A human-machine interface for exchanging at least one item of information between a user and a machine, in particular for inputting control commands, wherein the human-machine interface comprises at least one detector according to any one of the preceding embodiments relating to a detector, wherein the human-machine interface is designed to generate at least one item of geometrical information of the user by means of the detector wherein the human-machine interface is designed to assign to the geometrical information at least one item of information, in particular at least one control command.

Embodiment 109

The human-machine interface according to the preceding embodiment, wherein the at least one item of geometrical information of the user is selected from the group consisting of: a position of a body of the user; a position of at least one body part of the user; an orientation of a body of the user; an orientation of at least one body part of the user.

Embodiment 110

The human-machine interface according to any of the two preceding embodiments, wherein the human-machine interface further comprises at least one beacon device connectable to the user, wherein the human-machine interface is adapted such that the detector may generate an information on the position of the at least one beacon device.

Embodiment 111

The human-machine interface according to the preceding embodiment, wherein the beacon device comprises at least one illumination source adapted to generate at least one light beam to be transmitted to the detector.

Embodiment 112

An entertainment device for carrying out at least one entertainment function, in particular a game, wherein the entertainment device comprises at least one human-machine interface according to any of the preceding embodiments referring to a human-machine interface, wherein the entertainment device is designed to enable at least one item of information to be input by a player by means of the human-machine interface, wherein the entertainment device is designed to vary the entertainment function in accordance with the information.

Embodiment 113

A tracking system for tracking the position of at least one movable object, the tracking system comprising at least one detector according to any of the preceding embodiments referring to a detector, the tracking system further comprising at least one track controller, wherein the track controller is adapted to track a series of positions of the object, each comprising at least one item of information on a position of the object at a specific point in time.

Embodiment 114

The tracking system according to the preceding embodiment, wherein the tracking system further comprises at least one beacon device connectable to the object, wherein the tracking system is adapted such that the detector may generate an information on the position of the object of the at least one beacon device.

Embodiment 115

A scanning system for determining at least one position of at least one object, the scanning system comprising at least one detector according to any of the preceding embodiments relating to a detector, the scanning system further comprising at least one illumination source adapted to emit at least one light beam configured for an illumination of at least one dot located at at least one surface of the at least one object, wherein the scanning system is designed to generate at least one item of information about the distance between the at least one dot and the scanning system by using the at least one detector.

Embodiment 116

The scanning system according to the preceding embodiment, wherein the illumination source comprises at least one artificial illumination source, in particular at least one laser source and/or at least one incandescent lamp and/or at least one semiconductor light source.

Embodiment 117

The scanning system according to any one of the two preceding embodiments, wherein the illumination source emits a plurality of individual light beams, in particular an array of light beams exhibiting a respective pitch, in particular a regular pitch.

Embodiment 118

The scanning system according to any one of the three preceding embodiments, wherein the scanning system comprises at least one housing, wherein the at least one item of information about the distance between the at least one dot and the scanning system distance is determined between the at least one dot and a specific point on the housing of the scanning system, in particular a front edge or a back edge of the housing.

Embodiment 119

The scanning system according to the preceding embodiment, wherein the housing comprises at least one of a display, a button, a fastening unit, a leveling unit.

Embodiment 120

A stereoscopic system comprising at least one tracking system according to any one of the embodiments which refer to the tracking system and at least one scanning system according to any one of the embodiments which refer to the scanning system, wherein the tracking system and the scanning system each comprise at least one optical detector which are placed in a collimated arrangement in such a manner that they are aligned in an orientation parallel to the optical axis of the stereoscopic system and, concurrently, exhibit an individual displacement with respect to the orientation perpendicular to the optical axis of the stereoscopic system.

Embodiment 121

The stereoscopic system according to the preceding embodiment, wherein the tracking system and the scanning system each comprise at least one longitudinal optical sensor, wherein the sensor signals of the longitudinal optical sensors are combined for determining the item of information on the longitudinal position of the object.

Embodiment 122

The stereoscopic system according to the preceding embodiment, wherein the sensor signals of the longitudinal optical sensors are distinguishable with respect to each other by applying a different modulation frequency.

Embodiment 123

The stereoscopic system according to any one of the three preceding embodiments, wherein the stereoscopic system further comprises at least one transversal optical sensor, wherein the sensor signals of the transversal optical sensor are used for determining the item of information on the transversal position of the object.

Embodiment 124

The stereoscopic system according to the preceding embodiment, wherein a stereoscopic view of the object is obtained by combining the item of information on the longitudinal position of the object and the item of information on the transversal position of the object.

Embodiment 125

A camera for imaging at least one object, the camera comprising at least one detector according to any one of the preceding embodiments referring to a detector.

Embodiment 126

A method for manufacturing an optical detector, the method comprising the following steps:
  a) providing an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;
  b) generating a sensor layer by depositing a photosensitive material on the second surface of the optical filter, wherein the sensor layer is designed to generate at least one sensor signal in a manner dependent on an illumination of the sensor layer by the modified light beam; and
  c) providing an evaluation device designed to generate at least one item of information provided by the incident light beam by evaluating the sensor signal.

Embodiment 127

The method according to the preceding embodiment, wherein the optical filter is selected from a group consisting of a band pass filter, a long pass filter, a short pass filter, a monochromatic filter, a photographic filter, a polarization filter, a neutral density filter, and a band rejection filter.

Embodiment 128

The method according to any one of the two preceding embodiments, wherein the optical filter is one of a stained glass filter, a stained polymer filter, a metal mesh filter, or an optical interference filter.

Embodiment 129

The method according to any one of the three preceding embodiments, wherein the optical filter is selected from a prism, a tilted surface, micro lenses, micro grooves, a diffuser, or a beam shaper.

Embodiment 130

The method according to any one of the four preceding embodiments, wherein the optical filter is selected from a quarter wave plate, a polarizer, or a crossed polarizer.

Embodiment 131

The method according to any one of the five preceding embodiments, wherein the optical filter is selected from fluorescent phosphors, a fluorescent light concentrator, or upconversion phosphors.

Embodiment 132

The method according to the preceding embodiment, wherein the optical filter as provided comprises one of an electrically insulating substrate or a semiconducting substrate.

Embodiment 133

The method according to the preceding embodiment, wherein the optical filter as provided comprises at least one of glass, quartz, silicon (Si), a transparent conducting oxide (TOO), or a transparent organic polymer.

Embodiment 134

The method according to any one of the preceding embodiments referring to the method, further comprising applying the sensor layer directly or indirectly to the second surface of the optical filter.

Embodiment 135

The method according to the preceding embodiment, wherein no gap is left or generated between the optical filter and the sensor layer.

Embodiment 136

The method according to any one of the two preceding embodiments, wherein the sensor layer is applied by using a deposition method, wherein the deposition method is selected from the group consisting of chemical bath deposition, vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

Embodiment 137

The method according to any one of the preceding embodiments, further comprising placing an interlayer between the substrate and the sensor layer.

Embodiment 138

The method according to any one of the preceding embodiments referring to the method, wherein the photosensitive material used for the sensor layer is selected from a group consisting of dye solar cells, photoconductive materials, and quantum dots, wherein the photoconductive materials are particularly preferred.

Embodiment 139

The method according to any one of the preceding embodiments referring to the method, further comprising the following step:
d) providing at least two individual electrical contacts contacting the sensor layer, wherein the electrical contacts are designed to transmit the sensor signal to the evaluation device.

Embodiment 140

The method according to any one of the preceding embodiments referring to the method, wherein a cover layer is generated, the cover layer at least partially, preferably fully, covering the sensor layer.

Embodiment 141

The method according to any one of the preceding embodiments referring to the method, wherein the electrical contacts are bonded to at least one external connection by using electrically conductive leads, preferably in form of wires, in particular Au, Al, or Cu wires.

Embodiment 142

The method according to the preceding embodiment, wherein the electrically conductive leads are bonded to the electrical contacts through the cover layer.

Embodiment 143

The use of a detector according to any one of the preceding claims referring to a detector, for a purpose of use, selected from the group consisting of: a distance measurement, in particular in traffic technology; a position measurement, in particular in traffic technology; an entertainment application; a security application; a human-machine interface application; a tracking application; a scanning application; in stereoscopic vision; a photography application; an imaging application or camera application; a mapping application for generating maps of at least one space; a homing or tracking beacon detector for vehicles; a distance and/or position measurement of objects with a thermal signature; a machine vision application; a robotic application; a logistics application; a vehicle application; an airplane application; a ship application; a spacecraft application; a robotic application; a medical application; a sports' application; a building application; a construction application; a manufacturing application; a machine vision application; a use in combination with at least one sensing technology selected from time-of-flight detector, radar, Lidar, ultrasonic sensors, or interferometry.

Embodiment 144

A use of a detector according to any one of the preceding embodiments relating to a detector for a purpose of: an infra-red detection application; a heat-detection application; a thermometer application; a heat-seeking application; a flame-detection application; a fire-detection application; a smoke-detection application; a temperature sensing application; a spectroscopy application; a photocopy application; a xerography applications; exhaust gas monitoring application; a combustion process monitoring application; a pollution monitoring application; an industrial process monitoring application; a chemical process monitoring application; a food processing process monitoring application; a water quality monitoring application; an air quality monitoring application; a quality control application; a temperature control application; a motion control application; an exhaust control application; a gas sensing application; a gas analytics application; a motion sensing application; a chemical sensing application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 1:
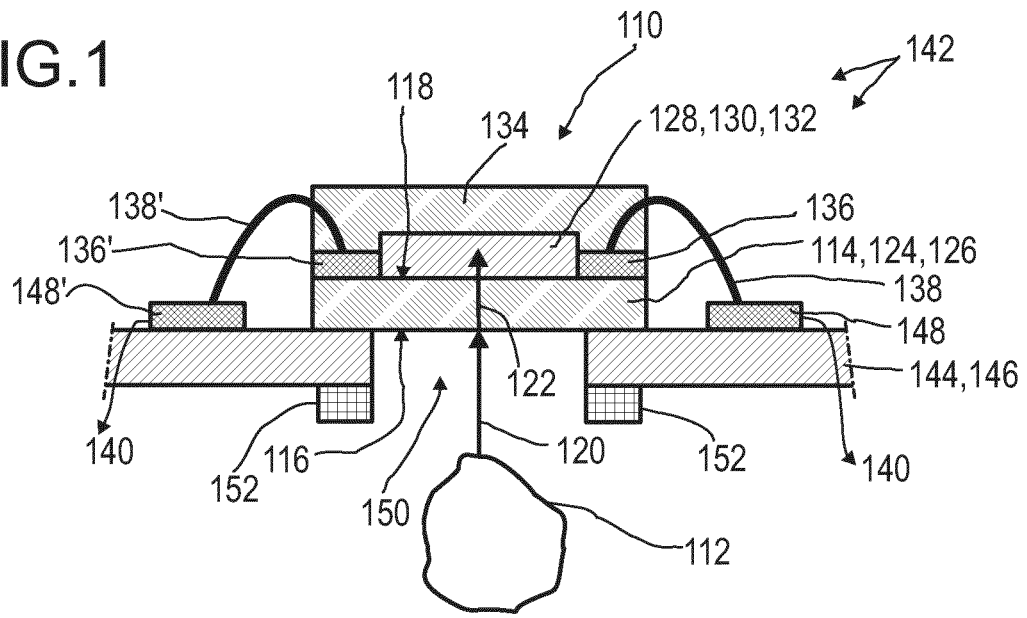
FIG. 1 shows an exemplary embodiment of an optical detector according to the present invention comprising an optical filter.

FIGS. 1 to 4 illustrate each, in a highly schematic fashion, an exemplary embodiment of an optical detector 110 according to the present invention. Herein, the detector 110 is adapted for optical detection, in particular, for detecting at least one wavelength in at least a partition of a spectral range, wherein the desired partition of the spectral range may be selected from the ultraviolet (UV), the visible (VIS) and/or the infrared (IR) spectral range, wherein the IR range, i.e. the spectral range of 760 nm to 1000 µm, and, especially, the mid infrared (MidIR) spectral range, i.e. the spectral range of 1.5 µm to 15 µm, may be preferred.

Specifically, the detector may be designed for sensing at least one optically conceivable property of at least one object 112. In particular, the optically conceivable property determinable by the detector 110 may be selected from at least one of an optical property and/or a geometric property of the object 112. By way of example, the optical property may, preferably, be selected from a transmissivity, absorption, emission, and/or reflectance of the object 112, while the geometric property may, in particular, refer to a position of the object 112 in relation to the detector 110. For sake of simplicity, the object 112 is only schematically depicted in FIGS. 1, 3 and 5, however, the object 112 may also assumed to be present in the embodiments according to FIGS. 2 and 4.

The detector 110 comprises at least one optical filter 114 having at least a first surface 116 and a second surface 118, wherein the second surface 118 is located oppositely with respect to the first surface 116. Herein, the first surface 116 and/or the second surface 118 of the optical filter 114 may, as depicted in FIGS. 1 to 4, preferably be a flat surface. However, in an alternative embodiment (not depicted here), at least one of the first surface 116 or of the second surface 118 of the optical filter 114 may exhibit a curved surface, wherein the curved surface refers to an area which may deviate from being a flat plane. Herein, the curved surface may, especially, be designed to correct aberrations the light beam 120 may experience on its path through the detector. In particular, the curved surface may be is selected from a group consisting of a biconvex lense, a plano-convex lense, a biconcave lense, a plano-concave lens, and a meniscus lens. However, other kinds of curved surfaces may also be conceivable.

For the purposes of the present invention, the optical filter 114 is designed for allowing an incident light beam 120 to be received by the first surface 116 of the optical filter 114 to pass through the optical filter 114 to the second surface 118, whereby a spectral composition of the incident light beam 120 is modified in a manner that a modified light beam 122 is generated. In particular, the optical filter 114 may be selected from a group consisting of a band pass filter, a long pass filter, a short pass filter, a monochromatic filter, a photographic filter, a polarization filter, and a band rejection filter. In a preferred embodiment, the optical filter may be a long pass filter 124, wherein the long pass filter 124 may be designed to generate the modified light beam 122 by attenuating a first wavelength range as comprised by the modified light beam 122 below a cut-off wavelength and, concurrently, by transmitting a second wavelength range of the modified light beam 122 above the cut-off wavelength. As generally used, the term "cut-off wavelength" may refer to a wavelength at 50% of peak transmission. With particular regard to providing the detector 110 to be sensitive in at least a selected partition of the IR spectral range and to, concurrently, reduce an amount of stray light, especially, outside the selected partition of the IR spectral range, the cut-off wavelength of the long pass filter may selected from a wavelength in the near infrared spectral range, i.e. the spectral range ranging from 760 nm to 1.5 µm, or the mid infrared spectral range, i.e. the spectral range ranging from of 1.5 µm to 15 µm.

In particular, the optical filter 114, especially the long pass filter 124, may, thus, be selected from a stained glass filter or an optical interference filter. As described above, the stained glass filter comprises an optically transparent substrate having, preferably in a homogenous distribution over the substrate, an absorptive substance, in particular a dye, which together with the substrate exhibits the desired transmission vs. wavelength relationship. As alternatively used, the interference filter is or comprises an optical element designed to reflect one or more first spectral lines or bands and to, concurrently, transmit second spectral lines or bands. Thus, in the preferred embodiment as described here, the optical filter 114 may comprise an electrically insulating substrate 126. Preferably, the electrically insulating substrate may comprise glass, quartz, or a transparent organic polymer. However, other kinds of substrates could also be used.

Further, the modified light beam 122 which leaves the optical filter 114 through the second surface 118 of the optical filter 114 may impinge on a sensor layer 128 which may, thus, directly be applied to the second surface 118 of the optical filter 114, preferentially that no gap may remain between the optical filter 114 and the sensor layer 128. Herein, the sensor layer may, as depicted here, be exactly a single continuous sensor layer. For this purpose, the sensor layer 128 may, preferably, be deposited on the optical filter 114 by using a deposition method, advantageously, by using a bath deposition process, which may easily allow generating a thickness from 1 nm to 100 µm, preferably from 10 nm to 10 µm, more preferred from 100 nm to 1 µm. However, alternative arrangements of the sensor layer 128 or other deposition methods for generating the sensor layer 128 may also be feasible.

According to the present invention, the sensor layer 128 is designed to generate at least one sensor signal in a manner dependent on an illumination of the sensor layer 128 by the modified light beam 122. According to the present invention, the sensor layer 128 comprises at least one photosensitive material 130. In a particularly preferred embodiment, the photosensitive material 130 may comprise a photoconductive material 132, preferentially, at least one chalcogenide material, in particular, selected from the group consisting of lead sulfide (PbS) lead selenide (PbSe), lead telluride (PbTe), cadmium telluride (CdTe), or indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), and copper zinc tin sulfide (CZTS). However, other chalcogenides or other kinds of photoconductive materials 132 may also be employed. In alternative embodiments (not depicted here), the photosensitive material 130 as comprised by the sensor layer 128 may be selected from a dye solar cell or a quantum dot layer.

According to the particular embodiment of the detector 110 as schematically depicted in FIG. 1, the detector 110 may, further, comprise an optional cover layer 134 which may, preferably, be directly deposited on the sensor layer 128. Herein, the cover layer 134 may, especially, be an amorphous layer comprising at least one metal-containing compound, wherein the metal-containing compound may, advantageously, be selected from an oxide, a hydroxide, a chalcogenide, a pnictide, or a carbide of Al, Ti, Ta, Mn, Mo, Zr, Hf, or W or a combination thereof. Herein, the cover layer, which may, particularly, exhibit a thickness of 10 nm to 600 nm, preferably of 20 nm to 200 nm, may be or comprise an atomic deposition layer. Alternatively, the cover layer 134 may be generated by employing a chemical vapor deposition (CVD) process, such as a plasma-enhanced chemical vapor deposition (PECVD) process. Further, other deposition methods, such as spin coating or ink-jet printing, may also be applied.

Particularly in order to avoid as far as possible a degradation of the sensor layer 128 by external influence, such as by humidity and/or by oxygen as comprised in a surrounding atmosphere, the cover layer 134 may provide an encapsulation, preferably, a hermetic packaging, of the sensor layer 128, in particular, by fully covering any accessible surfaces of the sensor layer 128. For this purpose, the cover layer 134 may, as schematically illustrated in FIG. 1, additionally, cover electrical contacts 136, 136' which are designated to contact the sensor layer 128, in particular, at different locations at the sensor layer 128. Preferably, the electrical contacts 136, 136' may comprise at least one electrode material selected from a group consisting of Ag, Pt, Mo, Al, Au, and graphene. Further, the electrical contacts 136, 136' may be bonded through the cover layer 134, whereby, preferably, bonding wires 138, 138' may be used, wherein the wires 138, 138' may, in particular, be or comprise Au, Al, or Cu wires. Particularly in order to support the bonding between the bonding wires and the electrode material of the electrical contacts 136, 136', an adhesive layer (not depicted here) may, additionally, be provided at the electrical contacts 136, 136', wherein the adhesive layer may comprise at least one of Ni, Cr, Ti or Pd. However, other kinds of bonding may also be feasible.

Further, the electrical contacts 136, 136' may be designed to transmit the sensor signal as generated by the sensor layer 128 to the evaluation device 140. Alternatively, the sensor signal may be transmitted from the sensor layer 128 to the evaluation device 140 in a wireless fashion. Consequently, the resulting sensor signal as provided by the sensor layer 128 upon impingement by the modified light beam 122 depends on properties of the photosensitive material 130, in particular of the photoconductive material 132, comprised by in the sensor layer 128. The evaluation device 140 is, generally, designed to generate at least one item of information provided by the incident light beam 120 about one or more optically conceivable properties of at least one object 112 by evaluating the sensor signal. For this purpose, the evaluation device 140 may comprise one or more electronic devices and/or one or more software components, in order to evaluate the sensor signals. Thus, the evaluation device 140 may be adapted to determine the at least one item of information by comparing more than one sensor signals as acquired by the sensor layer 128.

Preferably, the evaluation device 140 may be adapted to determine the at least one item of information on a longitudinal position of the object 112 by comparing more than one longitudinal sensor signals of the sensor layer 128 which may, in this particular embodiment, be arranged as a longitudinal optical sensor. For this purpose, the detector 110 may, particularly, be adapted to generate the sensor signal by performing at least one current-voltage measurement and/or at least one voltage-current-measurement. As known for FiP devices, the longitudinal sensor signal, given the same total power of the illumination, may be dependent on a beam cross-section of the modified light beam 122 in the sensor layer 128. For the purpose of generating the at least one item of information on the longitudinal position of the object 112, the evaluation device 140 may, thus, be designed to employ at least one predefined relationship between the geometry of the illumination and a relative positioning of the object 112 with respect to the detector 110, thereby, preferably, taking account of a known power of the illumination. However, application of other kinds of evaluation procedures may also be feasible.

Alternatively or in addition, the evaluation device 140 may be adapted to determine at least one item of information on a transversal position of the object 112 by comparing more than one transversal sensor signals as provided by the sensor layer 128. For this purpose, the sensor layer 128 may, in particular, be contacted by at least one pair of electrodes, wherein the electrodes may contact the photosensitive material 130 in order to acquire the transversal sensor signals. In a particularly preferred embodiment of the transversal optical sensor, any or all of the electrodes may be split electrodes, wherein each split electrode may comprise at least two partial electrodes. Herein, electrical currents through the partial electrodes may be dependent on a position of the modified light beam 122 in the sensor layer 128 and the transversal sensor signal may, thus, be generated in accordance with the electrical currents through the partial electrodes.

Alternatively or in addition, the evaluation device 140 may be adapted to determine at least one optical property of the object 112, such as selected from the transmissivity, absorption, emission, and/or reflectance of the object 112.

Further, FIGS. 1 to 4 each schematically illustrate an arrangement 142 in which the detector 110 may be placed on a circuit carrier device 144. As generally used, the circuit carrier device 144 refers to a platform being designed to mechanically support and electrically connect electronical, electrical, and/or optical elements, such as the detector 110. In a particularly preferred embodiment the circuit carrier device 144 may be or comprise a printed circuit board (PCB) 146. Herein, the electrical contacts 136, 136' designed to transmit the sensor signal generated by the sensor layer 128 directly or indirectly to the evaluation device 140 may, as illustrated in FIG. 1, be bonded, such as through the cover layer 134, using the bonding wires 138, 138'. As shown here, the bonding wires 138, 138' carrying the sensor signal may, in a particularly preferred embodiment, be guided to contact pads 148, 148' which are located on a surface of the circuit carrier device 144 and which comprise an electrically conducting material, wherefrom the sensor signal may, further, be guided to the evaluation device 140 in a direct or an indirect manner. In particular, the arrangement 142 may allow an easy handling and contacting of the detector 110, preferably, by automatically picking and placing the detector 110 on a selected location on the circuit carrier device 144 and by, subsequently, providing the bonding wires 138, 138'.

In addition, the arrangement 142 may, advantageously, be employed for, additionally, reducing the amount of stray light which may, otherwise, impede the signal-to-noise ratio of the detector 110. For this purpose, an opening 150 may be provided in the circuit carrier device 144 which may be designed for receiving the incident light beam 120 and for guiding the incident light beam 120 to the optical filter 114. Hereby, the amount of stray light which may, otherwise, enter the optical filter 114, such as through an expoxy or glass layer on the circuit carrier device 144, may, thus, be minimized. Herein, the optical filter 114 as comprised by the detector 110 may, especially, be placed at the 150 opening introduced into the circuit carrier device 144, as schematically depicted in each of FIGS. 1 to 4.

Further, an aperture stop 152 may be placed in a vicinity of the opening 150, wherein the aperture stop 152 may be designed to inhibit additional light entering the optical filter 114 apart from the incident light beam 120 impinging the optical filter 114 through the opening 150 in the circuit carrier device 144. For this purpose, the aperture stop 152 may be formed by copper traces which may be placed on the on the circuit carrier device 142 around the opening 150. For sake of simplicity, the aperture stop 152 is only schematically depicted in FIG. 1 which, however, does not imply that the aperture stop 152 may not be present in the embodiments according to FIGS. 2 to 4.

Generally, the evaluation device 140 may be part of a data processing device and/or may comprise one or more data processing devices. The evaluation device 140 may be fully or partially integrated into the circuit carrier device 144 and/or may fully or partially be embodied as a separate device which may be electrically connected in a wireless or wire-bound fashion to the sensor layer 128. The evaluation device 140 may further comprise one or more additional components, such as one or more electronic hardware components and/or one or more software components, such as one or more measurement units and/or one or more evaluation units and/or one or more controlling units (not depicted here).

The light beam 120 for illumining the detector 110 may be generated by a light-emitting object 112. Alternatively or in addition, the light beam 120 may be generated by a separate illumination source (not depicted here), which may include an ambient light source and/or an artificial light source, such as a light-emitting diode, being adapted to illuminate the object 112 that the object 112 may be able to reflect at least a part of the light generated by the illumination source in a manner that the light beam 120 may be configured to reach the optical filter 114, preferably by entering the opening 150 in the circuit carrier device 144. In a specific embodiment, the illumination source may be a modulated light source, wherein one or more modulation properties of the illumination source may be controlled by at least one optional modulation device. Alternatively or in addition, the modulation may be effected in a beam path between the illumination source and the object 112 and/or between the object 112 and the optical filter 114. Further possibilities may be conceivable. In this specific embodiment, it may be advantageous taking into account one or more of the modulation properties, in particular the modulation frequency, when evaluating the sensor signal for determining the at least one item of information on the object 112.

Figure 2:
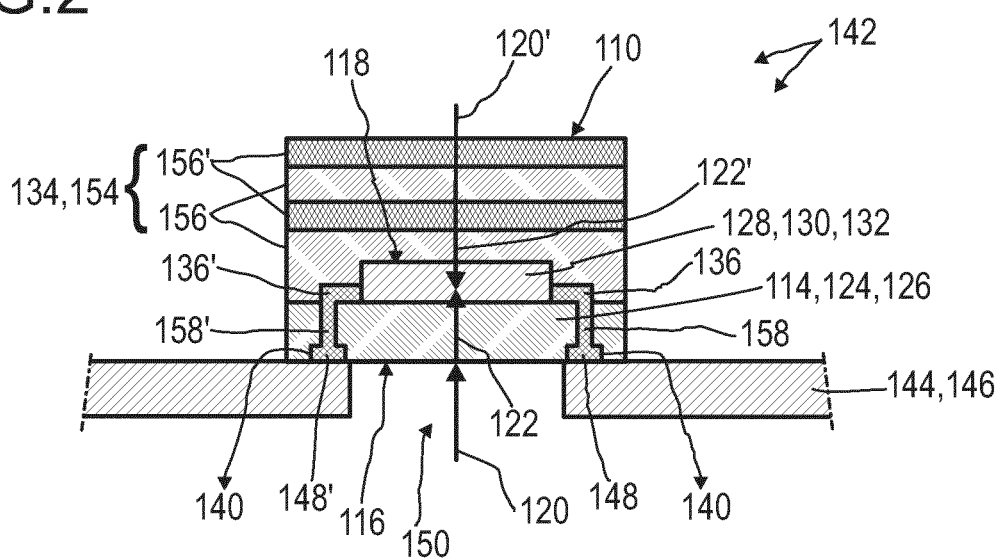
FIG. 2 shows a further exemplary embodiment of the detector comprising an encapsulation being adapted to serve as a second optical filter.

FIG. 2 illustrates a further exemplary embodiment of the detector 110 in which the cover layer 134 may be adapted to serve as a second optical filter 154. Herein, the cover layer 134 can be designed for filtering the same wavelength range as the optical filter 114 or, alternatively or in addition, for filtering a different wavelength range with respect to the optical filter 114. For this purpose, it may, as further depicted in FIG. 2, be possible to use a cover layer 134 which may be or comprise a laminate. In particular, a stack employing a first cover layer 156 and a second cover layer 156', alternatively stacked on top of each other, wherein each cover layer 156, 156' may comprise a different kind of metal oxide, can be used as an interference filter. In a particularly preferred embodiment, the first cover layer 156 may comprise aluminum oxide ($Al_2O_3$) while the second cover layer 156' may comprise titanium oxide ($TiO_2$). However, other kinds of stacks of first and second cover layers 156, 156' may also be conceivable.

As further illustrated in FIG. 2, it may be feasible to provide an optical element, such as a beam splitter (not depicted here), which may be designed for alternatively supplying the incident light beam 120 to the optical filter 114 and to the second optical filter 154. As a result, the incident light beam 120 may, alternatively, impinge through the optical filter 114 and through the second optical filter 154. In this particular embodiment, the modified light beam 122 illuminating the sensor layer 128 through the optical filter 114 may be designated as a "measuring beam", while the modified light beam 122' illuminating the sensor layer 128 through the second optical filter 154 may be designed as a "reference beam", or vice-versa. In this embodiment it may be particularly preferred that the evaluation device may, further, be designed for comparing the sensor signals as generated by the measuring beam and by the reference beam for refined evaluation purposes. By way of example, it may be possible to arrange properties of the measuring beam and of the reference beam in a manner that they may be canceled out directly within the sensor layer 128, thus, allowing an application of methods adapted to amplify only a difference signal between the measuring beam and the reference beam, such as lock-in techniques.

As further illustrated in FIG. 2, the sensor signals may, in an alternative embodiment, be guided from the electrical contacts 136, 136' through glass vias 158 to the contact pads 148, 148' on the circuit carrier device 144. This kind of setup together with the cover layer 134 may allow a direct, hermetic enclosure of the complete detector 110. In this alternative embodiment, the detector 110 could be glued or soldered directly onto the circuit carrier device 144, such as the printed circuit board (PCB) 146.

Figure 3:
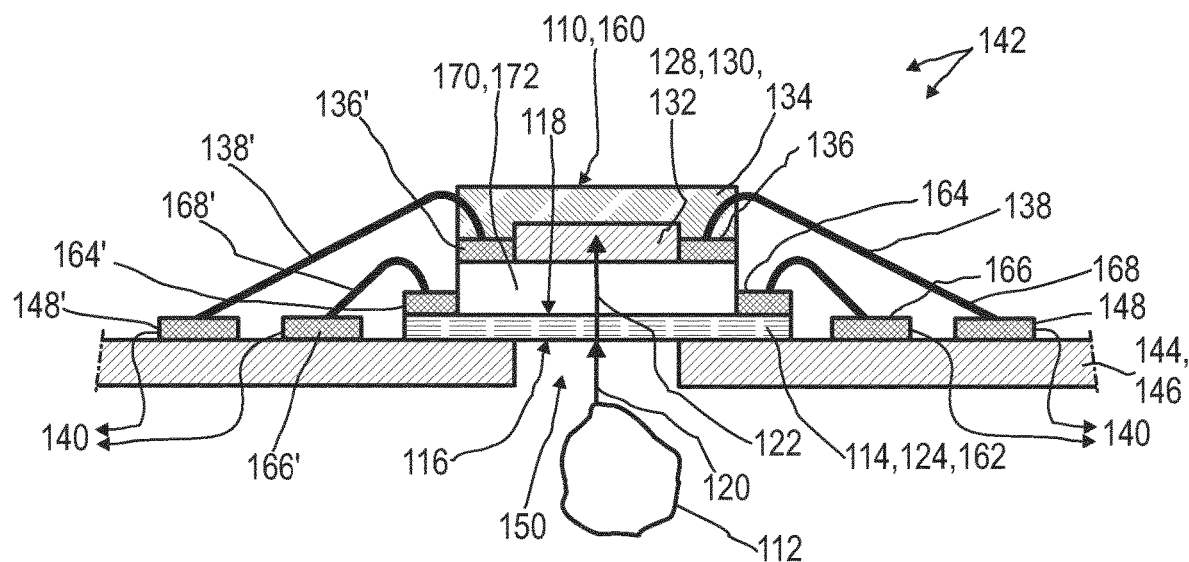
FIG. 3 shows a further exemplary embodiment of the detector comprising a semiconducting substrate for the optical filter and a thick insulating layer as an interlayer, thus providing a tandem detector.

FIG. 3 illustrates a further exemplary embodiment of the detector 110 providing a tandem detector 160 having a first optical sensor and a second optical sensor. For this purpose, the optical filter 114 comprises a semiconducting substrate 162, wherein a material for the substrate may, preferably, be silicon (Si), or a transparent conducting oxide (TOO), wherein the transparent conducting oxide (TCO) may be selected from the group consisting of aluminum oxide (Al2O3), titanium oxide (TiO2), indium tin oxide (ITO), fluorine doped tin oxide (SnO2:F; FTO), aluminum doped zinc oxide (AZO), magnesium oxide (MgO), or a perovskite transparent conducting oxide. In addition to the sensor layer 128 which may be designated as the first optical sensor, the semiconducting substrate 162 may be designed as the second optical sensor by providing at least two further electrical contacts 164, 164' adapted to contact the semiconducting substrate 162. Herein, the further electrical contacts 164, 164' may comprise at least one of Au, Pt, Pd, or W as electrode material. As further shown in FIG. 3, the further electrical contacts 164, 164' may be bonded to further contact pads 166, 166' located on the circuit carrier device 144 by applying further bonding wires 168, 168'. However, other kinds of bonding may be feasible, such as by using vias 158, 158' as shown in FIG. 2.

In the embodiment as illustrated in FIG. 3, an interlayer 170 being or comprising a thick insulating layer 172, preferably a thick silicon dioxide layer, may, preferably, be provided, particularly, in order to avoid an occurrence of an electrical field effect between the sensor layer 128 acting as a the first optical sensor and the optical filter 114 comprises a semiconducting substrate 162 and acting the second optical sensor. Herein, the thick insulating layer 172 may, preferably, exhibit a thickness of 100 nm to 10 μm, more preferred of 250 nm to 5 μm. Herein, the interlayer 170 may, especially, be applied in a manner that no gap may remain, on one hand, between the optical filter 114 and the interlayer 170 and, on the other hand, between the interlayer 170 and the sensor layer 128. Again, the interlayer layer 170 may, preferably, be exactly one continuous layer located in an adjacent manner with regard to the sensor layer 128.

Figure 4:
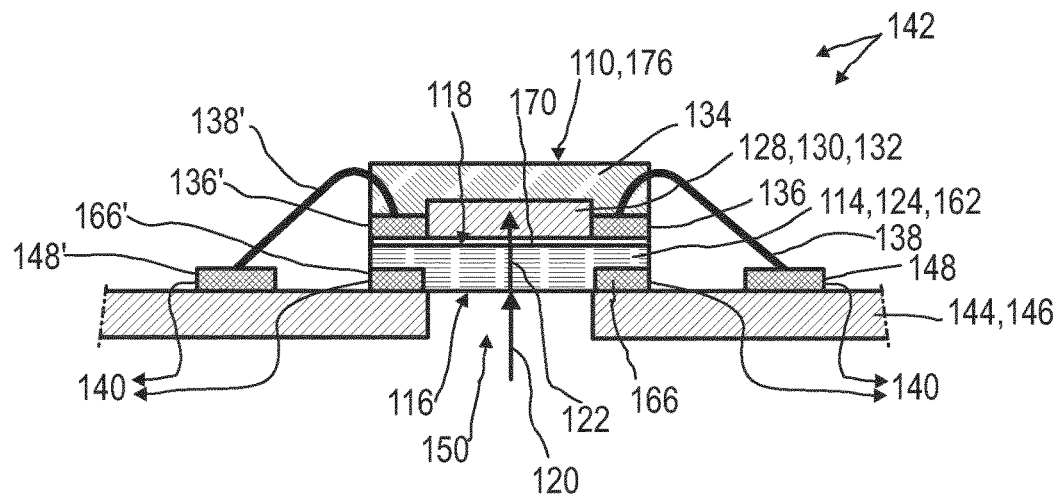
FIG. 4 shows a further exemplary embodiment of the detector comprising a semiconducting substrate for the optical filter and a thin insulating layer as the interlayer, thus providing a field-effect phototransistor.

FIG. 4 illustrates an alternative embodiment of the detector 110, in which the interlayer 170 may be or comprise a thin insulating layer 174, preferably a thin silicon dioxide layer, which may have a thickness of 1 nm to 250 nm, preferably of 5 nm to 10 nm, and which may, preferably, be defect free and, thus, exhibit a high electrical resistivity. In this alternative embodiment, a pronounced electrical field effect may be generated between the sensor layer 128 acting as the first optical sensor, on one hand, and the optical filter 114 comprising the semiconducting substrate 162 acting the second optical sensor, on the other hand, whereby a field-effect phototransistor 176 may, thus, be provided.

For further details concerning a particular feature in one or more of FIGS. 2 to 4, reference may be made to any one of the other figures selected from FIGS. 1 to 4. In addition, a combination of a feature shown in a particular Figure with a different feature shown in one of the other Figures may also be possible and is, thus, explicitly covered by the disclosure of this document.

Figure 5:
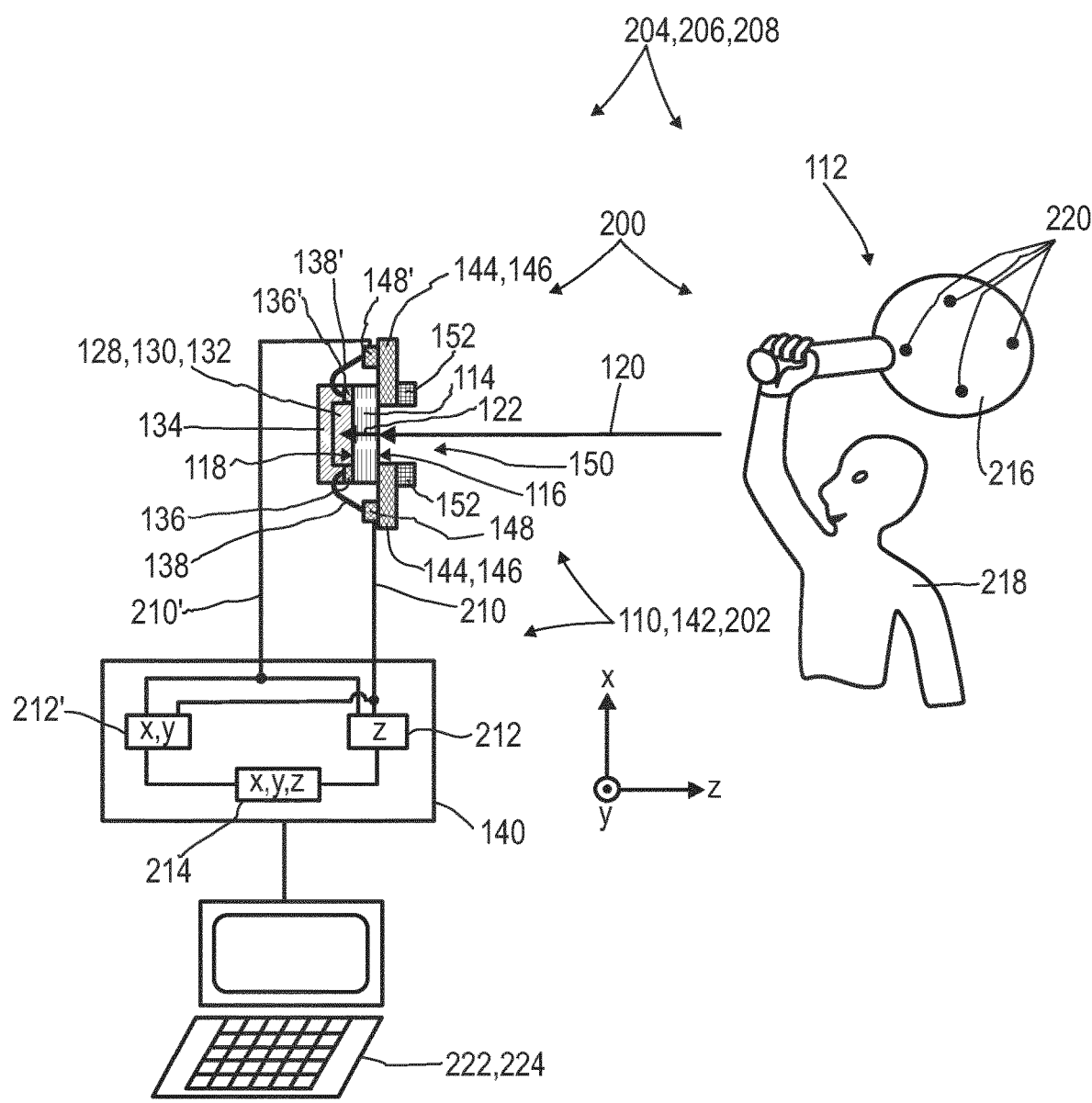
FIG. 5 shows an exemplary embodiment of a detector, a detector system, a human-machine interface, an entertainment device, a tracking system and a camera according to the present invention.

As a further example, FIG. 5 shows an exemplary embodiment of a detector system 200, comprising the arrangement 142 in which the at least one detector 110 is placed on the circuit carrier device 144, in particular on the printed circuit board (PCB) 146, as described above. However other kinds of detectors, such as the detector 110 as disclosed in one or more of the other embodiments as shown in FIGS. 2 to 4 or a combination thereof may also be feasible. Herein, the detector 110 may be employed as a camera 202, specifically for 3D imaging, which may be made for acquiring images and/or image sequences, such as digital video clips. Further, FIG. 5 shows an exemplary embodiment of a human-machine interface 204, which comprises the at least one detector 110 and/or the at least one detector system 200, and, further, an exemplary embodiment of an entertainment device 206 comprising the human-machine interface 204. FIG. 5 further shows an embodiment of a tracking system 208 adapted for tracking a position of at least one object 112, which comprises the detector 110 and/or the detector system 200.

With regard to the detector 110 and to the detector system 200, reference may be made to the full disclosure of this application. Basically, all potential embodiments of the detector 110 may also be embodied in the embodiment shown in FIG. 5. In this particular embodiment, the detector 110 has a setup in accordance with the exemplary arrangement as provided in FIG. 1. Accordingly, the detector 110 has the optical filter 114 having at the least a first surface 116 and the second surface 118, wherein the second surface 118 is located oppositely with respect to the first surface 116. Herein the optical filter 114 is designed for allowing the incident light beam 120 as received by the first surface 116 to pass through the optical filter 114 to the second surface 118, whereby a modified light beam 122 is generated by modifying a spectral composition of the incident light beam 120. Particularly, in order to inhibit additional light entering the optical filter 114 apart from the incident light beam 120, the incident light beam 120 may, preferably, be guided to the optical filter 114 through an opening 150 in the circuit carrier device 144, wherein the aperture stop 152 may, especially, be placed in the vicinity of the opening 150 for enhancing this desired effect. For the purposes of the present invention, the optical filter 114 may, preferably be or comprise the long pass filter 124, particularly, be selected from a stained glass filter or an optical interference filter as described above. However, other kinds of optical filters 114 may also be conceivable.

Further, the detector 110 has the sensor layer 128 comprising the photosensitive material 130, in particular the photoconductive material 132, which is deposited on the second surface 118 of the optical filter 114. For the purposes of the present invention, the sensor layer 128 is designed to generate at least one sensor signal in a manner dependent on an illumination of the sensor layer 128 by the modified light beam 122. As shown in FIG. 5, the detector may be chosen as a combination of a longitudinal optical sensor and a transversal optical sensor, thus, allowing the detector 110 concurrently determining both the depth and the width of object 112. Alternatively or in addition, the detector 110 may be employed to determine at least one optical property of the object 112, such as selected from the transmissivity, absorption, emission, and/or reflectance of the object 112. In addition, the sensor layer 128 is protected by the cover layer 134 as described above.

Further, the sensor signal as generated by the sensor layer 128 is provided to the evaluation device 140 in order to generate the at least one item of information as provided by the incident light beam 120, in particular to the generate the at least one item of information on the spatial position of the object 112 by evaluating the sensor signal. For this purpose, the sensor signal is guided via the electrodes 136, 136', the wiring bonds, 138, 138', the contact pads 148, 148' as located on the circuit carrier device 144 and signal leads 210, 210' to the evaluation device 140. Herein, the signal leads 210, 210' may be wireless interfaces and/or wire-bound interfaces. Further, the signal leads 210, 210' may comprise one or more drivers and/or one or more measurement devices for modifying sensor signals. The evaluation device 140 may fully or partially be integrated into one or more components of the detector 110. The evaluation device 140 may also be enclosed into a housing comprising the arrangement 142 and/or into a separate housing. The evaluation device 140 may comprise one or more electronic devices and/or one or more software components, in order to evaluate the sensor signals, which are symbolically denoted here by a longitudinal evaluation unit 212 (denoted by "z") and a transversal evaluation unit 212' (denoted by "xy"). By combining results derived by these evolution units 212, 212', a position information 214, preferably a three-dimensional position information, may be generated (denoted by "x, y, z").

In the exemplary embodiment as shown in FIG. 5, the object 112 to be detected, as an example, may be designed as an article of sports equipment and/or may form a control element 216, the position and/or orientation of which may be manipulated by a user 218. Thus, generally, in the embodiment shown in FIG. 5 or in any other embodiment of the detector system 200, the human-machine interface 204, the entertainment device 206 or the tracking system 208, the object 112 itself may be part of the named devices and, specifically, may comprise the at least one control element 216, specifically, wherein the at least one control element 216 has one or more beacon devices 220, wherein a position and/or orientation of the control element 216 preferably may be manipulated by user 218. As an example, the object 112 may be or may comprise one or more of a bat, a racket, a club or any other article of sports equipment and/or fake sports equipment. Other types of objects 112 are possible. Further, the user 218 may be considered as the object 112, the position of which shall be detected. As an example, the user 218 may carry one or more of the beacon devices 220 attached directly or indirectly to his or her body.

The detector 110 may be adapted to determine at least one item on a longitudinal position of one or more of the beacon devices 220 and, optionally, at least one item of information regarding a transversal position thereof, and/or at least one other item of information regarding the longitudinal position of the object 112 and, optionally, at least one item of information regarding a transversal position of the object 112. Particularly, the detector 110 may be adapted for identifying colors and/or for imaging the object 112, such as different colors of the object 112, more particularly, the color of the beacon devices 220 which might comprise different colors.

The detector 110 may, thus, be adapted for determining the position of the at least one object 112. Additionally, the detector 110, specifically an embodiment including the camera 202, may be adapted for acquiring at least one image of the object 112, preferably a 3D-image. As outlined above, the determination of a position of the object 112 and/or a part thereof by using the detector 110 and/or the detector system 200 may be used for providing a human-machine interface 204, in order to provide at least one item of information to a machine 222. In the embodiments schematically depicted in FIG. 5, the machine 222 may be or may comprise at least one computer and/or a computer system comprising the data processing device. Other embodiments are feasible. The evaluation device 140 may be a computer and/or may comprise a computer and/or may fully or partially be embodied as a separate device and/or may fully or partially be integrated into the machine 222, particularly the computer. The same holds true for a track controller 224 of the tracking system 208, which may fully or partially form a part of the evaluation device 140 and/or the machine 222.

Similarly, as outlined above, the human-machine interface 204 may form part of the entertainment device 206. Thus, by means of the user 218 functioning as the object 112 and/or by means of the user 218 handling the object 112 and/or the control element 216 functioning as the object 112, the user 218 may input at least one item of information, such as at least one control command, into the machine 222, particularly the computer, thereby varying the entertainment function, such as controlling the course of a computer game.

As outlined above, the detector 110 may have a straight beam path or a tilted beam path, an angulated beam path, a branched beam path, a deflected or split beam path or other types of beam paths. Further, the incident light beam 120 may propagate along each beam path or partial beam path once or repeatedly, unidirectionally or bidirectionally. Thereby, the components listed above or the optional further components listed in further detail below may fully or partially be located in front of the optical filter 114 and/or behind the optical filter 114.

LIST OF REFERENCE NUMBERS 110 detector
112 object
114 optical filter
116 first surface
118 second surface
120 incident light beam
122 modified light beam
124 long pass filter
126 electrically insulating substrate
128 sensor layer
130 photosensitive material
132 photoconductive material
134 cover layer
136, 136' electrical contract
138, 138' bonding wire
140 evaluation device
142 arrangement
144 circuit carrier device
146 printed circuit board (PCB)
148, 148' contact pad
150 opening
152 aperture
154 second optical filter
156, 156' first cover layer, second cover layer
158 via
160 tandem detector
162 semiconducting substrate
164, 164' further electrical contact
166, 166' further contact pad 168, 168' further bonding wire
170 interlayer
172 thick insulating layer
174 thin insulating layer
176 field-effect phototransistor
200 detector system
202 camera
204 human-machine interface
206 entertainment device
208 tracking system
210 signal leads
212, 212' longitudinal evaluation unit, transversal evaluation unit
214 position information
216 control element
218 user
220 beacon device
222 machine
224 track controller

The invention claimed is:

1. An optical detector, comprising
an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;
a sensor layer comprising a photosensitive material being deposited on the second surface of the optical filter, wherein the sensor layer is designed to generate at least one sensor signal in a manner dependent on an illumination of the sensor layer by the modified light beam;
a cover layer deposited on the sensor layer, wherein the cover layer fully covers an accessible surface of the sensor layer and wherein the cover layer comprises at least one metal-containing compound selected from the group consisting of an oxide, a hydroxide, a chalcogenide, a pnictide, and a carbide; and
an evaluation device designed to generate at least one item of information provided by the incident light beam by evaluating the sensor signal.

2. The detector according to claim 1, wherein the detector is designed for detecting at least one wavelength in at least a partition of the infrared spectral range, the infrared spectral range ranging from 760 nm to 1000 μm.

3. The detector according to claim 1, wherein the optical filter is selected from the group consisting of a band pass filter, a long pass filter, a short pass filter, a monochromatic filter, a photographic filter, a polarization filter, and a band rejection filter.

4. The detector according to claim 1, wherein the optical filter is one of a stained glass filter, a metal mesh filter, or an optical interference filter.

5. The detector according to claim 1, wherein the optical filter is for configured to further modifying at least one of a propagation direction or a type of polarization of the incident light beam.

6. The detector according to claim 1, wherein the optical filter is for configured to further modifying the incident light beam by applying at least one non-linear optical effect.

7. The detector according to claim I, wherein at least two individual electrical contacts contact the sensor layer, wherein the electrical contacts are designed to transmit the sensor signal to the evaluation device.

8. The detector according to claim I., wherein the photosensitive material is an inorganic photoconductive material comprising at least one selected from the group consisting of selenium, tellurium, a selenium-tellurium alloy, a metal oxide, a group IV element or compound, a III-V compound, a II-VI compound, a chalcogenide, a pnictogenide, a halide, and solid solutions and doped variants thereof.

9. The detector according to claim 8, wherein the chalcogenide is selected from the group consisting of lead sulfide (PbS), copper indium sulfide (CIS), copper indium gallium selenide (CICS), copper zinc tin sulfide (CZTS), lead selenide (PhSe), copper zinc tin selenide (CZTSe), cadmium telluride (CdTe), mercury cadmium telluride (HgCdTe), mercury zinc telluride (HgZnTe), lead sulfoselenide (PbSSe), copper-zinc-tin sulfur-selenium chalcogenide (CZTSSe), and a solid solution and/or a doped variant thereof.

10. The detector according to claim 1, wherein the optical filter is or comprises one of an electrically insulating substrate or a semiconducting substrate.

11. The detector according to claim 1, additionally comprising an interlayer between the optical filter and the sensor layer.

12. The detector according to claim 11, wherein the interlayer comprises one of
a thick insulating layer being designed in a manner that the optical filter and the sensor layer are separately operable as st optical sensor and a second optical sensor, wherein the thick insulating layer exhibits a thickness being selected in order to impede an interaction between the first optical sensor and the second optical sensor; or
a thin insulating layer being designed in a manner hat an interaction between the optical filter and the sensor layer occurs, wherein the thin insulating layer exhibits a thickness being selected in order to enable an occurrence of an electrical field effect between the optical filter and the sensor layer via the thin insulating layer.

13. The detector according to claim 11, wherein the interlayer comprises at least one selected from the group consisting of silicon dioxide ($SiO_2$), silicon nitride ($Si_3N_4$), alumina ($Al_2O_3$), zirconia ($ZrO_2$), hafnium oxide ($HfO_2$), and mixtures and/or laminates thereof.

14. The detector according to claim 1, wherein the interlayer is or comprises an adhesive layer and/or an optically anti-reflective layer.

15. The detector according to claim 1, wherein the sensor signal is a longitudinal sensor signal, wherein the longitudinal sensor signal, given the same total power of the illumination, is dependent on a beam cross-section of the modified light beam in the sensor layer, wherein the evaluation device is designed to generate at least one item of information on a longitudinal position of an object by evaluating the longitudinal sensor signal.

16. A detection method, comprising employing an optical detector according to claim 1 for at least one selected from the group consisting of: a distance measurement, a position measurement, an entertainment application, a security application, a human-machine interface application, a tracking application, a scanning application, stereoscopic vision, a photography application, an imaging application or camera application, a mapping application for generating maps of at least one space, a horning or tracking beacon detector for vehicles, a distance and/or position measurement of objects with a thermal signature, a machine vision application, a robotic application, a logistics application, a vehicle application, an airplane application, a ship application, a spacecraft application, a robotic application, a medical application, a sports' application, a building application, a construction application, a manufacturing application, a machine vision application; a use in combination with at least one sensing technology selected from time-of-flight detector, radar, Lidar, ultrasonic sensors, or interferometry; an infra-red detection application, a heat-detection application, a thermometer application, a heat-seeking application, a flame-detection application, a fire-detection application, a smoke-detection application, a temperature sensing application, a spectroscopy application, a photocopy application, a xerography applications, exhaust gas monitoring application, a combustion process monitoring application, a pollution monitoring application, an industrial process monitoring application, a chemical process monitoring application, a food processing process monitoring application, a water quality monitoring application, an air quality monitoring application, a quality control application, a temperature control application, a motion control application, an exhaust control application, a gas sensing application, a gas analytics application, a motion sensing application, and a chemical sensing application.

17. A method for manufacturing an optical detector, the method comprising:
   a) providing an optical filter having at least a first surface and a second surface, the second surface being located oppositely with respect to the first surface, wherein the optical filter is designed for allowing an incident light beam received by the first surface to pass through the optical filter to the second surface, thereby generating a modified light beam by modifying a spectral composition of the incident light beam;
   b) generating a sensor layer by depositing a photosensitive material on the second surface of the optical filter, wherein the sensor layer is designed to generate at least one sensor signal in a manner dependent on an illumination of the sensor layer by the modified light beam and depositing a cover layer on the sensor layer, wherein the cover layer fully covers an accessible surface of the sensor layer and wherein the cover layer comprises at least one metal-containing compound selected from the group consisting of an oxide, a hydroxide, a chalcogenide, a pnictide, and a carbide; and
   c) providing an evaluation device designed to generate at least one item of information provided by the incident light beam by evaluating the sensor signal.

18. The method according to claim 17, wherein the sensor layer is directly or indirectly applied to the second surface of the optical filter, wherein the sensor layer is applied by using a deposition method, wherein the deposition method is selected from the group consisting of chemical bath deposition, vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor Wading, and solution-gas interface techniques.

* * * * *